US009137066B2

(12) United States Patent
Linn

(10) Patent No.: US 9,137,066 B2
(45) Date of Patent: Sep. 15, 2015

(54) METHOD AND APPARATUS FOR GENERATING A METRIC FOR USE IN ONE OR MORE OF LOCK DETECTION, SNR ESTIMATION, AND MODULATION CLASSIFICATION

(76) Inventor: Yair Linn, Vancouver (CA)

( * ) Notice: Subject to any disclaimer, the term of this patent is extended or adjusted under 35 U.S.C. 154(b) by 0 days.

(21) Appl. No.: 13/882,780

(22) PCT Filed: Nov. 1, 2011

(86) PCT No.: PCT/CA2011/001220
§ 371 (c)(1),
(2), (4) Date: May 1, 2013

(87) PCT Pub. No.: WO2012/058759
PCT Pub. Date: May 10, 2012

(65) Prior Publication Data
US 2013/0230085 A1    Sep. 5, 2013

Related U.S. Application Data

(60) Provisional application No. 61/409,544, filed on Nov. 3, 2010.

(51) Int. Cl.
*H04L 27/00*   (2006.01)
*H04L 27/20*   (2006.01)
*H04L 27/38*   (2006.01)
*H03J 7/06*    (2006.01)
(Continued)

(52) U.S. Cl.
CPC ............. *H04L 27/20* (2013.01); *H03D 13/00* (2013.01); *H03J 7/065* (2013.01); *H04B 17/009* (2013.01); *H04B 17/391* (2013.01); *H04L 27/3818* (2013.01)

(58) Field of Classification Search
USPC ........................................ 375/260, 285, 316
See application file for complete search history.

(56) References Cited

U.S. PATENT DOCUMENTS 3,555,194 A * 1/1971 Goto ............................. 370/507
3,878,475 A * 4/1975 Okano et al. .................... 331/12
(Continued)

OTHER PUBLICATIONS

"A Self-Normalizing Symbol Synchronization Lock Detector for QPSK and BPSK", Yair Linn, IEEE Transactions on Wireless Communications, vol. 5, No. 2, Feb. 2006; pp. 347-353.
(Continued)

*Primary Examiner* — Dac Ha
*Assistant Examiner* — Janice Tieu
(74) *Attorney, Agent, or Firm* — McCormick, Paulding & Huber LLP

(57) ABSTRACT

The present disclosure is directed at a method and apparatus for generating a metric for use in any one or more of lock detection, SNR estimation, and modulation classification. To generate the metric, an input angle in the form of a symbol phase or a difference in symbol phases is used to evaluate a base function. The base function relates possible metrics to possible input angles using a triangle wave having its maxima or minima at ideal input angles, and the other of its maxima or minima at angles midway the ideal input angles. Described are embodiments that are one or more of non-data aided; that may be implemented relatively efficiently in hardware; that can function using one sample/symbol; that can achieve relatively good detection certainty using relatively few estimates; and that can be used to implement modulation classifiers, lock detectors, and SNR estimators that are resilient to imperfections in automatic gain control.

179 Claims, 28 Drawing Sheets

(51) Int. Cl.
*H03D 13/00* (2006.01)
*H04B 17/00* (2015.01)
*H04B 17/391* (2015.01)

(56) References Cited

U.S. PATENT DOCUMENTS

| | | | |
|---|---|---|---|
| 3,927,260 | A | 12/1975 | Amundson et al. |
| 6,804,309 | B1 | 10/2004 | Morelos-Zaragoza |
| 6,993,440 | B2 | 1/2006 | Anderson et al. |
| 7,035,593 | B2 | 4/2006 | Miller et al. |
| 7,116,943 | B2 | 10/2006 | Sugar et al. |
| 7,190,741 | B1 | 3/2007 | Manning |
| 7,366,137 | B2 | 4/2008 | Abrishamkar et al. |
| 7,376,178 | B2 | 5/2008 | Li et al. |
| 7,379,507 | B2 | 5/2008 | Chen et al. |
| 7,697,639 | B2 | 4/2010 | Kim et al. |
| 2002/0067778 | A1* | 6/2002 | Ahn ............................ 375/326 |
| 2003/0072392 | A1 | 4/2003 | Beadle et al. |
| 2003/0112899 | A1* | 6/2003 | Linsky et al. ................ 375/327 |
| 2005/0063487 | A1 | 3/2005 | Sayegh |
| 2006/0072656 | A1 | 4/2006 | Wiss et al. |
| 2006/0115013 | A1 | 6/2006 | Kim et al. |
| 2006/0239338 | A1 | 10/2006 | Kolanek et al. |
| 2007/0168407 | A1 | 7/2007 | Prasad et al. |
| 2010/0061487 | A1* | 3/2010 | Kumar et al. ................ 375/322 |

OTHER PUBLICATIONS

"A Real-Time SNR Estimator for D-MPSK over Frequency-Flat Slow Fading AWGN Channels", Yair Linn, 2006 IEEE Sarnoff Symposium, Princeton, NJ, Mar. 27-28, 2006, pp. 1-8.
"Synchronization and SNR Esimation in M-PSK Wireless Receivers" Yair Linn, in Proc. International Seminar: 15 Years of Electronic Engineering, Universidad Pontificia Bolivariana, Bucaramanga, Colunbia, Aug. 15-19, 2006, pp. 1-15.
"A new family of NDA carrier phase detectors for coherent M-PSK receivers", IEEE 2002 International Conference on Communications, Circuits and Systems and West Sino Expositions, Jun. 29-Ju. 1, 2002, vol. 1, pp. 134-141.
"Survery of automatic modulation classification techniques: classical approaches and new trends", O.A. Dobre, et al., IET Commun. 2007, 1 (2) pp. 137-156.
"SNR Mismatch and Online Estimation in Turbo Decoding", Todd A. Summers et al.; 0090-6778/98$10.00; 1998 IEEE; pp. 421-423.
"A Unified Approach to the Performance Analysis of Digital Communication over Generalized Fading Channels", Marvin K. Simon, et al.; Proceedings of the IEEE, vol. 86 No. 9 Sep. 1998; 0018-9219/98$10.00 1998 IEEE; pp. 1860-1877.
"Channel Quality Estimation and Rate Adaptiion for Cellular Mobile Radio" Krishna Balachandran, et al.; IEEE Journal on Selected Areas in Communications, vol. 17, No. 7, Jul. 1999; 0733-8716/99$10.00 1998 IEEE; pp. 1244-1256.
"Altera Inc. Application Note 110: Gate Counting Methodology for APEX 20K Devices, Sep. 1999," at www.altera.com, accessed Sep. 2011; pp. 1-8.
"Xilinx Inc. Application XAPP 059P: Gate Count Capacity Metrics for FPGAs. Feb 1997" at www.xilinx.com, accessed Sep. 2011; pp. 1-6.
"Efficient Hardware Realization of Truncated Multipliers using FPGA" M. H. Rais, International Journal of Engineering and Applied Sciences, vol. 4, No. 2, 2009; pp. 124-128.
"A Symbol Synchronization Lock Detector and SNR Estimator for QPSK, with Application to BPSK", Yair Linn, Proceedings of the 3rd IASTED International Conference; Jul. 14-16, 2003, Banff, Alberta Canada; 9 pages.
A Family of Self-Normalizing Carrier Lock Detectors and Es/No Estimators for M-PSK and Other Phase Modulation Schemes, Yair Linn, et al.; IEEE Transations on Wireless Communications, vol. 3, No. 5, Sep. 2004; pp. 1659-1668.
"Quantitative Analysis of a New Method for Real-Time Generation of SNR Estimates for Digital Phase Modulation Signals", Yair Linn, IEEE Transations on Wireless Communications, vol. 3, No. 6, Sep. 2004; pp. 1984-1988.
"A Hardware Method for Real-Time SNR Estimation for M-PSK Using a Symbol Synchronization Lock Metric", Yair Linn, Proceedings of the 9th Canadian Workshop on Information Theory, Montreal, Quebec, Jun. 5-8, 2005; pp. 247-251.
"A Methodical Approach to Hybrid PLL Design for High-Speed Wireless Communications", Yair Linn,; WAMICON 2006; 2-4244-0849-0/06$20.00 2006 IEEE; 9 pages.
"Efficient Loop Filter Design in FPGAs for Phase Lock Loops in High-Datarate Wireless Receivers—Theory and Case Study" Yair Linn, 1-4244-0697-08/07.00 2007 IEEE; 8 pages.
"Simple and Exact Closed-Form Expressions for the Expectation of the Linn-Peleg M-PSK Lock Detector", Yair Linn, 1-4244-1190-4/071$25.00 2007 IEEE; pp. 102-104.
"A Carrier-Independent Non-Data-Aided Real-Time SNR Estimator for M-PSK and D-MPSK Suitable for FPGAs and ASICs" Yair Linn, IEEE Transations on Circuits and Systems—I: Regular Papers, vol. 56, No. 7 Jul. 2009; pp. 1525-1538.
"A New Architecture for Coherent M-PSK Receivers", Yair Linn; in Proc. IEEE COMCAS'09, Tel-Aviv, Israel, Nov. 9-11, 2009; 14 pages.
"Efficient Structures for PLL's Loop Filter Designed in FPGAs in High-Datarate Wireless Receivers—Theory and Case Study"; Yair Linn; Wireless Technology, Lecture Notes in Electrical Engineering 44, DOI 10.1007/978-0-387-71787-6_6, Copyright Springer Science+Business Media, LLC 2009; pp. 115-132.
International Search Report for PCT Serial No. PCT/CA2011/001220 dated Jan. 30, 2012.

\* cited by examiner

```
module calculate_triangular_LD_metric
#(
parameter width = 8,
parameter num_modulations = 4
)
(
input [width-1:0] theta,
input clk,
input [num_modulations-1:0] log2M_minus_1, //for BPSK this is 0, for QPSK this is 1, etc.
output [width-1:0] LD_value,
output logic [width-1:0] All_LD_values[num_modulations-1:0]
);
logic [width-1:0] principal_theta[num_modulations-1:0];
logic [width-1:0] intermediate_LD_values[num_modulations-1:0];
logic [width-1:0] to_add_to_theta[num_modulations-1:0];
logic [width-2:0] temp_LD_value;

generate
            genvar current_modulation;
            for (current_modulation = 0; current_modulation < num_modulations; current_modulation++)
            begin : principal_theta_generate //format of principal theta is unsigned s1w1.f(width-1)
                assign principal_theta[current_modulation] = {2'b00,theta[width-1-(current_modulation+3) : 0],1'b0,{(current_modulation){1'b1}}};

always_comb
                begin
                    case (theta[width-1-(current_modulation+1) -: 2])
                        2'b00 : to_add_to_theta[current_modulation] = {2'b01,{(width-2){1'b0}}}; //=1
                        2'b01 : to_add_to_theta[current_modulation] = 0;
                        2'b10 : to_add_to_theta[current_modulation] = {2'b10,{(width-3){1'b1}},1'b1}; //-1
                        2'b11 : to_add_to_theta[current_modulation] = 0;
                    endcase
                end assign    intermediate_LD_values[current_modulation]    =    {{width{~theta[width-1-(current_modulation+1)]}}
principal_theta[current_modulation]} + to_add_to_theta[current_modulation];

end
endgenerate safely_discard_upper_sign_bits
(
.inwidth(width),
.number_of_bits_to_discard(1),
.outwidth(width-1)
)
safely_discard_upper_sign_bits_LD
(
   .indata(intermediate_LD_values[log2M_minus_1]),
   .outdata(temp_LD_value)
);

assign LD_value = {temp_LD_value,1'b1};

assign All_LD_values = intermediate_LD_values;

endmodule
```

```
module safely_discard_upper_sign_bits
#(
  parameter inwidth = 16,
  parameter number_of_bits_to_discard = 1,
  parameter outwidth = 8
)
(
 input [inwidth-1:0] indata,
 output [outwidth-1:0] outdata
);

wire [outwidth-1:0] outdata_raw = {indata[inwidth-1], indata[inwidth-2-number_of_bits_to_discard -: (outwidth-1)]};
wire [number_of_bits_to_discard-1:0] discarded_bits = indata[inwidth-2 -: number_of_bits_to_discard];
wire sign_bit = indata[inwidth-1];
wire overflow_situation_occurred = (|(discarded_bits ^{number_of_bits_to_discard{sign_bit}})) | (outdata_raw == {1'b1,{(outwidth-1){1'b0}}});
wire [outwidth-1:0] overflow_output_value = {sign_bit,{(outwidth-2){~sign_bit}},1'b1}; //avoid unsymmetric 2's complemente range assign outdata = overflow_situation_occurred ? overflow_output_value : outdata_raw;

endmodule
```

Fig. 7

```
module modulation_classifier
#(
  parameter width = 8,
  parameter numestimators = 4
)
(
 input clk,
 input signed [numestimators*width-1:0] yes_signal_threshold,
 input signed [numestimators*width-1:0] estimator_input,
 output logic [numestimators-1:0] estimator_above_yes_signal_threshold,
 output logic [numestimators-1:0] modulation_decision,
 output logic classification_valid,
 output logic [numestimators-1:0] possible_classification_candidate[numestimators-1:0]
);

`define current_estimator(x) estimator_input[((x+1)*width)-1 -: width]
  `define current_threshold(x) yes_signal_threshold[((x+1)*width)-1 -: width]

generate
                genvar estimator_count;
                for (estimator_count = 0; estimator_count < numestimators; estimator_count++)
                        begin : generate_threshold_comparisons
                           always @(posedge clk)
                                  begin
                                           estimator_above_yes_signal_threshold[estimator_count] <=
($signed(`current_estimator(estimator_count)) > $signed(`current_threshold(estimator_count)));
                                  end end
        endgenerate assign classification_valid = |estimator_above_yes_signal_threshold;
        assign possible_classification_candidate[0] = estimator_above_yes_signal_threshold[0];

integer possible_classification_sum = 0;
        integer inner_count;
        always @*
        begin
                integer estimator_count2;
                for (estimator_count2 = 1; estimator_count2 < numestimators; estimator_count2++)
                        begin
                                //now set up an interesting way to codify the decision result
                                possible_classification_sum = 0;
                                for (inner_count = 0; inner_count < estimator_count2; inner_count++)
                                begin
                                possible_classification_sum = possible_classification_sum +
possible_classification_candidate[inner_count][numestimators-1:0];
                                        end possible_classification_candidate[estimator_count2] =
(estimator_above_yes_signal_threshold[estimator_count2] && (possible_classification_sum == 0)) ? (estimator_count2+1) : 0;

end
        end integer modulation_decision_count;

always @ (posedge clk)
                begin
                        modulation_decision_count = 0;
                          for (integer estimator_count3 = 0; estimator_count3 < numestimators; estimator_count3++)
                                   modulation_decision_count = modulation_decision_count +
possible_classification_candidate[estimator_count3];

modulation_decision <= (modulation_decision_count == 0) ? modulation_decision_count :
(modulation_decision_count-1);
                        end
                `undef current_estimator
                `undef current_threshold
endmodule
```

Fig. 21

METHOD AND APPARATUS FOR GENERATING A METRIC FOR USE IN ONE OR MORE OF LOCK DETECTION, SNR ESTIMATION, AND MODULATION CLASSIFICATION

CROSS REFERENCE TO RELATED APPLICATIONS

This application is entitled to the benefit of and incorporates by reference essential subject matter disclosed in International Patent Application No. PCT/CA2011/001220 filed on Nov. 1, 2011 and U.S. Patent Application No. 61/409,544 filed Nov. 3, 2010.

TECHNICAL FIELD

The present disclosure is directed at a method and apparatus for use in one or more of lock detection, signal-to-noise ratio (SNR) estimation, and modulation classification.

BACKGROUND

Digital communications systems often include one or more of a lock detector, a modulation classifier, and an SNR estimator. A lock detector is used, for example, when a receiver is coherently demodulating a carrier that it has received to determine whether a local carrier used for demodulation is in phase with the received carrier. A modulation classifier is used, for example, to determine which modulation scheme has been used to modulate the received carrier. Exemplary modulation schemes include various types of phase shift keying such as binary phase shift keying, quaternary phase shift keying, and more generally M-ary phase shift keying where M is theoretically any positive integer. An SNR estimator is used, for example, to estimate the SNR of the symbols transmitted using the received carrier.

In digital communications, and particularly in mobile digital communications, it is beneficial to employ circuitry that is fast, inexpensive, relatively simple, and power efficient. Accordingly, research and development continue into improving the designs of lock detectors, SNR estimators, and modulation classifiers.

SUMMARY

According to one aspect, there is provided a method for generating a metric for one or both of lock detection and signal-to-noise ratio (SNR) estimation. The method includes obtaining a baseband symbol from a received carrier that is modulated using the symbol according to a modulation order (M) equaling the number of distinct ideal symbol phases used to modulate the received carrier; determining a received phase of the symbol; and generating the metric from the received phase, wherein possible metrics depend on possible received phases according to a base function that comprises a triangle wave having its maxima or minima located at ideal symbol phases and the other of its maxima or minima located at phases midway between adjacent ideal symbol phases.

The maxima and minima may have identical absolute values.

The received carrier may be modulated according to M-ary phase shift keying, and M may be a positive integer power of 2.

Determining the received phase may involve expressing the received phase as being between $[-\pi,\pi)$ radians prior to generating the metric, and the base function may be implemented such that it spans only $[-\pi,\pi)$ radians.

The received phase may be encoded using an encoding scheme that linearly encompasses substantially all of the possible received phases.

The ideal symbol phases may be uniformly distributed within any continuous angular interval spanning $2\pi$ radians.

The metric may be generated as a function of a principal angle that is directly proportional to the received phase modulo $(\pi/2M)$. The principal angle may be normalized such that its supremum equals the absolute value of the maxima of the triangle wave. Additionally or alternatively, the principal angle may include one or more of the least significant bits of the received phase.

Generating the metric may involve inverting the principal angle as a function of one or more bits of the received phase; and adding one of A, −A or 0 to the principal angle or its inverse as a function of two or more bits of the received phase, wherein A is the absolute value of the maxima of the triangle wave.

The encoding scheme may be one's complement, two's complement, or sign-magnitude encoding, the received phase may have b bits, and M may be a positive integer power of 2. The principal angle may include a plurality of the most significant bits of bits $[b-3-\log_2 M:0]$ of the received phase. Alternatively or additionally, the principal angle may be proportional to a binary number that comprises a plurality of the most significant bits of bits $[b-3-\log_2 M:0]$ of the received phase.

Generating the metric may involve inverting the principal angle as a function of bit $[b-1-\log_2 M]$ of the received phase; and adding either A, −A or 0 to the principal angle or its inverse as a function of bits $[b-\log_2 M-1:b-\log_2 M-2]$ of the received phase, wherein A is the absolute value of the maxima of the triangle wave.

The method may also include determining whether a local carrier used to demodulate the received carrier is locked to the received carrier by averaging a plurality of the metrics to determine an average metric; comparing the average metric to a lock indicator detection threshold; and when the average metric surpasses the lock indicator detection threshold, determining that the local carrier is locked to the received carrier.

The method may also include estimating the SNR of the received carrier by averaging a plurality of the metrics to determine an average metric; comparing the average metric to an SNR sufficiency threshold; and when the average metric surpasses the SNR sufficiency threshold, utilizing the average metric as a proxy for the SNR.

The method may also involve estimating the SNR of the received carrier by averaging a plurality of the metrics to determine an average metric; comparing the average metric to an SNR sufficiency threshold; and when the average metric surpasses the SNR sufficiency threshold, estimating the SNR to be the SNR at which the expected value of the base function equals the average metric.

According to another aspect, there is provided a method for generating a metric for one or both of signal-to-noise ratio (SNR) estimation and modulation classification. The method includes obtaining a pair of baseband symbols from a received carrier that is modulated using the symbols according to a modulation order (M) equaling the number of distinct ideal symbol phases used to modulate the received carrier; determining a received phase difference between the pair of symbols; and generating the metric from the received phase difference, wherein possible metrics depend on possible received phase differences according to a base function that comprises a triangle wave having its maxima or minima located at ideal phase differences and the other of its maxima or minima located at phase differences midway between adjacent ideal phase differences.

The maxima and minima may have identical absolute values.

The received carrier may be modulated according to M-ary phase shift keying. M may be a positive integer power of 2.

The ideal phase differences may be located at $(2\pi \cdot m_n)/M$ radians where $m_n \epsilon \{0, 1, \ldots, M-1\}$.

Determining the received phase difference may involve expressing the received phase difference as being between $[-\pi,\pi)$ radians prior to generating the metric, and the base function may be implemented such that it spans only $[-\pi,\pi)$ radians.

Determining the received phase difference may involve expressing the received phase difference as modulo $2\pi$ of: the received phase of one of the symbols of the pair subtracted from the received phase of the other of the symbols of the pair. One of the symbols of the pair may immediately follow the other of the symbols of the pair.

The received phase difference may be encoded using an encoding scheme that linearly encompasses substantially all of the possible received phase differences.

The ideal phase differences may be uniformly distributed within any continuous angular interval spanning $2\pi$ radians.

The metric may be generated as a function of a principal angle that is directly proportional to the received phase difference modulo $(\pi/2M)$. The principal angle may be normalized such that its supremum equals the absolute value of the maxima of the triangle wave. The principal angle may also include one or more of the least significant bits of the received phase difference.

Generating the metric may involve inverting the principal angle as a function of one or more bits of the received phase difference; and adding either A, −A or 0 to the principal angle or its inverse as a function of two or more bits of the received phase difference, wherein A is the absolute value of the maxima of the triangle wave.

The encoding scheme may be one's complement, two's complement, or sign-magnitude encoding, the received phase difference may have b bits, and M may be a positive integer power of 2.

The principal angle may include a plurality of the most significant bits of bits [b-3-$\log_2$ M:0] of the received phase difference. Alternatively or additionally, the principal angle may be directly proportional to a binary number that comprises a plurality of the most significant bits of bits [b-3-$\log_2$ M:0] of the received phase difference.

Generating the metric may involve inverting the principal angle as a function of bit [b-1-$\log_2$ M] of the received phase difference; and adding either A, −A or 0 to the principal angle or its inverse as a function of bits [b-$\log_2$ M-1:b-$\log_2$ M-2] of the received phase difference, wherein A is the absolute value of the maxima of the triangle wave.

The method may also include estimating the SNR of the received carrier by averaging a plurality of the metrics to determine an average metric; comparing the average metric to an SNR sufficiency threshold; and when the average metric surpasses the SNR sufficiency threshold, utilizing the average metric as a proxy for the SNR.

The method may also include estimating the SNR of the received carrier by averaging a plurality of the metrics to determine an average metric; comparing the average metric to an SNR sufficiency threshold; and when the average metric surpasses the SNR sufficiency threshold, estimating the SNR to be the SNR at which the expected value of the base function equals the average metric.

The method may also involve generating the metric multiple times in accordance with a different base function each time, wherein the ideal phase differences for each of the base functions are uniformly distributed within any continuous angular interval spanning $2\pi$ radians and wherein each of the different base functions has a different value of M each evenly divisible by the lowest value of M for the different base functions; averaging the metrics to determine an average metric for each of the different base functions; comparing the average metric for each of the potential base functions to an associated validity threshold for each of the potential base functions; and when at least one of the average metrics surpasses its associated validity threshold, determining that M of the received carrier is less than or equal to the lowest value of M for which the average metric surpasses its validity threshold.

When at least one of the average metrics surpasses its associated validity threshold, the method may involve determining that M of the received carrier is higher than the highest value of M for which the average metric does not surpass its validity threshold.

The ideal phase differences for each of the different base functions corresponding to a value of M less than the highest value of M may be a subset of the ideal phase differences for the base function corresponding to the highest value of M.

The ideal phase differences for each of the different base functions corresponding to a value of M less than the highest value of M may be a subset of the ideal phase differences for the base functions corresponding to each higher value of M.

M for all of the different base functions and M of the received carrier may be positive integer powers of 2.

The lowest M for which the average metric surpasses the associated validity threshold and the highest M for which the average metric does not surpass the associated validity threshold may be adjacent powers of two.

The method may also involve generating the metric multiple times in accordance with a different base function each time, wherein ideal phase differences are uniformly distributed within any continuous angular interval spanning $2\pi$ radians and wherein none of the different base functions have identical values of M; averaging the metrics to determine an average metric for each of the different base functions; determining which of the average metrics is largest if the ideal phase differences correspond to the maxima of the base functions, or which of the average metrics is the smallest if the ideal phase differences correspond to the minima of the base functions; and determining that M of the received carrier is equal to the value for M that corresponds to (i) the largest average metric if the ideal phase differences correspond to the maxima of the base functions; and (ii) the smallest average metric if ideal phase differences correspond to the minima of the base functions.

According to another aspect, there is provided an apparatus for generating a metric for one or both of lock detection and signal-to-noise ratio (SNR) estimation. The apparatus includes a front end configured to obtain a baseband symbol from a received carrier that is modulated using the symbol according to a modulation order (M) equaling the number of distinct ideal symbol phases used to modulate the received carrier; a phase determiner communicatively coupled to the front end and configured to determine a received phase of the baseband symbol; and a metric generator communicatively coupled to the phase determiner and configured to generate the metric from the received phase, wherein possible metrics depend on possible received phases according to a base function that comprises a triangle wave having its maxima or minima located at ideal symbol phases and the other of its maxima or minima located at phases midway between adjacent ideal symbol phases.

The maxima and minima may have identical absolute values.

The received carrier may be modulated according to M-ary phase shift keying. M may be a positive integer power of 2.

The phase determiner may be configured to express the received phase as being between $[-\pi,\pi)$ radians, and the base function may be implemented such that it spans only $[-\pi,\pi)$ radians.

The phase determiner may be configured to encode the received phase using an encoding scheme that linearly encompasses substantially all of the possible received phases.

The ideal symbol phases may be uniformly distributed within any continuous angular interval spanning $2\pi$ radians, and the metric generator may be configured to determine for the received phase a principal angle that is directly proportional to the received phase modulo $(\pi/2M)$ and to generate the metric as a function of the principal angle.

The metric generator may be configured to normalize the principal angle such that its supremum equals the absolute value of the maxima of the triangle wave.

The phase determiner may encode the received phase such that the principal angle comprises one or more of the least significant bits of the received phase.

The phase determiner may encode the received phase such that one or more bits (inversion control bits) of the received phase indicate whether to invert the principal angle and such that two or more bits (selection bits) of the received phase indicate whether to add A, −A or 0 to the principal angle or its inverse, wherein A is the absolute value of the maxima of the triangle wave, and the metric generator may also include (a) inverting hardware having (i) a data input to which the principal angle is input; (ii) an inversion control input to which the inversion control bits are input; and (iii) a data output that outputs the inverse of the principal angle when the inversion control bits indicate the principal angle is to be inverted and otherwise outputs the principal angle; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; and (c) adding hardware having (i) data inputs communicatively coupled to the data outputs of the inverting hardware and the data selection hardware; and (ii) a data output that outputs the sum of signals at the data inputs of the adding hardware.

A may be 1.

The phase determiner may encode the received phase such that a principal angle precursor includes one or more of the least significant bits of the received phase, and the principal angle may be directly proportional to the principal angle precursor.

The phase determiner may encode the received phase such that one or more bits (inversion control bits) of the received phase indicate whether to invert the principal angle precursor and such that two or more bits (selection bits) of the received phase indicate whether to add A, −A or 0 to the principal angle or its inverse, wherein A is the absolute value of the maxima of the triangle wave, and the metric generator may also include: (a) inverting hardware having: (i) a data input to which the principal angle precursor is input; (ii) an inversion control input to which the inversion control bits are input; and (iii) a data output that outputs the inverse of the principal angle precursor when the inversion control bits indicate the principal angle precursor is to be inverted and otherwise outputs the principal angle precursor; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; (c) amplification hardware having (i) a data input communicatively coupled to the data output of the inverting hardware; and (ii) a data output that outputs the amplification of the data input; and (d) adding hardware having (i) data inputs communicatively coupled to the data outputs of the amplification hardware and the data selection hardware; and (ii) a data output that outputs the sum of signals at the data inputs of the adding hardware.

The phase determiner may encode the received phase in one's complement, two's complement, or sign-magnitude encoding, the received phase may have b bits, M may be a positive integer power of 2, and the principal angle may include a plurality of the most significant bits of bits [b-3-$\log_2$ M:0] of the received phase.

The phase determiner may encode the received phase such that bit [b-1-$\log_2$ M] (inversion control bit) of the received phase indicates whether to invert the principal angle and such that bits [b-$\log_2$ M-1:b-$\log_2$ M-2] (selection bits) of the received phase indicate whether to add A, −A or 0 to the principal angle or its inverse, wherein A is the absolute value of the maxima of the triangle wave, and the metric generator may include (a) inverting hardware having (i) a data input to which the principal angle is input; (ii) an inversion control input to which the inversion control bit is input; (iii) a data output that outputs the inverse of the principal angle when the inversion control bit indicate the principal angle is to be inverted and otherwise outputs the principal angle; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; and (c) adding hardware having (i) data inputs communicatively coupled to the data outputs of the inverting hardware and the data selection hardware; and (ii) a data output that outputs the sum of signals at the data inputs of the adding hardware.

A may be 1.

The phase determiner may encode the received phase in one's complement, two's complement, or sign-magnitude encoding, the received phase may have b bits, M may be a positive integer power of 2, and the principal angle may be directly proportional to a principal angle precursor that comprises a plurality of the most significant bits of bits [b-3-$\log_2$ M:0] of the received phase.

The phase determiner may encode the received phase such that bit [b-1-$\log_2$ M] (inversion control bit) of the received phase indicates whether to invert the principal angle precursor and such that bits [b-$\log_2$ M-1:b-$\log_2$ M-2] (selection bits) of the received phase indicate whether to add A, −A or 0 to the principal angle or its inverse, wherein A is the absolute value of the maxima of the triangle wave, and the metric generator may include (a) inverting hardware having (i) a data input to which the principal angle precursor is input; (ii) an inversion control input to which the inversion control bits are input; and (iii) a data output that outputs the inverse of the principal angle precursor when the inversion control bits indicate the principal angle precursor is to be inverted and otherwise outputs the principal angle precursor; (b) data selection hardware having (i) a data input to which A, −A and 0 are input; (ii) a data selection input to which the selection bits are input; and (iii) a data output that output either A, −A or 0 in accordance with which one of the data inputs of the data selection hardware is selected by the selection bits; (c) amplification hardware having (i) a data input communicatively coupled to the data output of the inverting hardware; and (ii) a data output that outputs the amplification of the data input; and (d) adding hardware having (i) data inputs communicatively coupled to the data outputs of the amplification hardware and the data selection hardware; and (ii) a data output that outputs the sum of signals at the data inputs of the adding hardware.

An averager may be communicatively coupled to the metric generator and be configured to average a plurality of the metrics to determine an average metric.

A comparator may be communicatively coupled to the averager and be configured to compare the average metric to a lock indicator detection threshold and to indicate when the average metric surpasses the lock indicator detection threshold, thereby indicating when the local carrier is locked to the received carrier.

A comparator may be communicatively coupled to the averager and be configured to compare the average metric to an SNR sufficiency threshold and to indicate when the average metric surpasses the SNR sufficiency threshold, thereby indicating when the average metric may be used as a proxy for the SNR.

The apparatus may include a lookup table, relating values for the expected value of the base function to values for the SNR, communicatively coupled to the averager and configured to output an estimate for the SNR that is the SNR at which the expected value of the base function equals the average metric when the average metric surpasses the SNR sufficiency threshold.

According to another aspect, there is provided an apparatus for generating a metric for one or both of signal-to-noise ratio (SNR) estimation and modulation classification. The apparatus includes a front end configured to obtain a pair of baseband symbols from a received carrier that is modulated using the symbols according to a modulation order (M) equaling the number of distinct ideal symbol phases used to modulate the received carrier; a phase determiner communicatively coupled to the front end and configured to determine a received phase for each of the symbols; a phase difference determiner communicatively coupled to the phase determiner and configured to determine a received phase difference between the pair of symbols; and a metric generator communicatively coupled to the phase difference determiner and configured to generate the metric from the received phase difference, wherein possible metrics depend on possible received phase differences according to a base function that comprises a triangle wave having its maxima or minima located at ideal phase differences and the other of its maxima or minima located at phase differences midway between adjacent ideal phase differences.

The maxima and minima may have identical absolute values.

The received carrier may be modulated according to M-ary phase shift keying. M may be a positive integer power of 2.

The ideal phase differences may be located at $(2\pi m_n)/M$ radians where $m_n \in \{0, 1, \ldots, M-1\}$.

The phase difference determiner may express the received phase difference as being between $[-\pi,\pi)$ radians, and the base function may be implemented such that it spans only $[-\pi,\pi)$ radians.

The phase difference determiner may express the received phase difference as modulo $2\pi$ of: the received phase of one of the symbols of the pair subtracted from the received phase of the other of the symbols of the pair. One of symbols may immediately follow the other of the symbols of the pair.

The phase difference determiner may be configured to encode the received phase difference using an encoding scheme that linearly encompasses substantially all of the possible received phase differences.

The ideal phase differences may be uniformly distributed within any continuous angular interval spanning $2\pi$ radians, and the metric generator may be configured to determine for the received phase difference a principal angle that is directly proportional to the received phase difference modulo $(\pi/2M)$ and to generate the metric as a function of the principal angle.

The metric generator may be configured to normalize the principal angle such that its supremum equals the absolute value of the maxima of the triangle wave.

The phase difference determiner may encode the received phase difference such that the principal angle comprises one or more of the least significant bits of the received phase difference.

The phase difference determiner may encode the received phase difference such that one or more bits (inversion control bits) of the received phase difference indicate whether to invert the principal angle and such that two or more bits (selection bits) of the received phase difference indicate whether to add A, −A or 0 to the principal angle or its inverse, wherein A is the absolute value of the maxima of the triangle wave, and the metric generator may include (a) inverting hardware having (i) a data input to which the principal angle is input; (ii) an inversion control input to which the inversion control bits are input; and (iii) a data output that outputs the inverse of the principal angle when the inversion control bits indicate the principal angle is to be inverted and otherwise outputs the principal angle; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware are selected by the selection bits; and (c) adding hardware having (i) data inputs communicatively coupled to the data outputs of the inverting hardware and the data selection hardware; and (ii) a data output that outputs the sum of signals at the data inputs of the adding hardware.

A may be 1.

The phase difference determiner may encode the received phase difference such that a principal angle precursor comprises one or more of the least significant bits of the received phase difference, and the principal angle may be directly proportional to the principal angle precursor.

The phase difference determiner may encode the received phase difference such that one or more bits (inversion control bits) of the received phase difference indicate whether to invert the principal angle precursor and such that two or more bits (selection bits) of the received phase difference indicate whether to add A, −A or 0 to the principal angle or its inverse, wherein A is the absolute value of the maxima of the triangle wave, and the metric generator may include (a) inverting hardware having (i) a data input to which the principal angle precursor is input; (ii) an inversion control input to which the inversion control bits are input; and (iii) a data output that outputs the inverse of the principal angle precursor when the inversion control bits indicate the principal angle precursor is to be inverted and otherwise outputs the principal angle precursor; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; (c) amplification hardware having (i) a data input communicatively coupled to the data output of the inverting hardware; and (ii) a data output that outputs the amplification of the data input; and (d) adding hardware having (i) data inputs communicatively coupled to the data outputs of the amplification hardware and the data selection hardware; and (ii) a data output that outputs the sum of signals at the data inputs of the adding hardware.

The phase difference determiner may encode the received phase difference in one's complement, two's complement, or sign-magnitude encoding, the received phase difference may have b bits, M may be a positive integer power of 2, and the principal angle may include a plurality of the most significant bits of bits [b-3-$\log_2$ M:0] of the received phase difference.

The phase difference determiner may encode the received phase difference such that bit [b-1-$\log_2$ M] (inversion control bit) of the received phase difference indicates whether to invert the principal angle and such that bits [b-$\log_2$ M-1:b-$\log_2$ M-2] (selection bits) of the received phase difference indicate whether to add A, −A or 0 to the principal angle or its inverse, wherein A is the absolute value of the maxima of the triangle wave, and the metric generator may include (a) inverting hardware having (i) a data input to which the principal angle is input; (ii) an inversion control input to which the inversion control bit is input; and (iii) a data output that outputs the inverse of the principal angle when the inversion control bit indicate the principal angle is to be inverted and otherwise outputs the principal angle; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; and (c) adding hardware having (i) data inputs communicatively coupled to the data outputs of the inverting hardware and the data selection hardware; and (ii) a data output that outputs the sum of signals at the data inputs of the adding hardware.

A may be 1.

The phase difference determiner may encode the received phase difference in one's complement, two's complement, or sign-magnitude encoding, the received phase difference may have b bits, M may be a positive integer power of 2, and the principal angle may be directly proportional to a principal angle precursor that includes a plurality of the most significant bits of bits [b-3-$\log_2$ M:0] of the received phase difference.

The phase difference determiner may encode the received phase difference such that bit [b-1-$\log_2$ M] (inversion control bit) of the received phase difference indicates whether to invert the principal angle precursor and such that bits [b-$\log_2$ M-1:b-$\log_2$ M-2] (selection bits) of the received phase difference indicate whether to add A, −A or 0 to the principal angle or its inverse, wherein A is the absolute value of the maxima of the triangle wave, and the metric generator may include (a) inverting hardware having (i) a data input to which the principal angle precursor is input; (ii) an inversion control input to which the inversion control bit is input; and (iii) a data output that outputs the inverse of the principal angle precursor when the inversion control bit indicates the principal angle precursor is to be inverted and otherwise outputs the principal angle precursor; (b) data selection hardware having (i) a data input to which A, −A and 0 are input; (ii) a data selection input to which the selection bits are input; and (iii) a data output that outputs either A, −A or 0 in accordance with which one of the data inputs of the data selection hardware is selected by the selection bits; (c) amplification hardware having (i) a data input communicatively coupled to the data output of the inverting hardware; and (ii) a data output that outputs the amplification of the data input; and (d) adding hardware having (i) data inputs communicatively coupled to the data outputs of the amplification hardware and the data selection hardware; and (ii) a data output that outputs the sum of signals at the data inputs of the adding hardware.

The apparatus may include an averager communicatively coupled to the metric generator and configured to average a plurality of the metrics to determine an average metric. The apparatus may also include a comparator communicatively coupled to the averager and configured to compare the average metric to an SNR sufficiency threshold and to indicate when the average metric surpasses the SNR sufficiency threshold, thereby indicating when the average metric may be used as a proxy for the SNR. The apparatus may also include a lookup table, relating values for the expected value of the base function to values for the SNR, communicatively coupled to the averager and configured to output an estimate for the SNR that is the SNR at which the expected value of the base function equals the average metric when the average metric surpasses the SNR sufficiency threshold.

The apparatus may also include a plurality of the metric generators each configured to generate the metric in accordance with a different base function, wherein ideal phase differences for each of the base functions are uniformly distributed within any continuous angular interval spanning 2π radians and wherein none of the different base functions have identical values of M; a plurality of averagers, each communicatively coupled to a different one of the metric generators and configured to determine an average metric for each of the metric generators; a plurality of comparators, each of which is communicatively coupled to a different one of the averagers and is configured to compare the average metric to a validity threshold for that base function, and to output a signal indicating that the average metric surpasses the validity threshold only when the average metric surpasses the validity threshold; and a plurality of data selectors each comprising data inputs, a selection input, and a data output, wherein the output of each of the comparators except the comparator communicatively coupled to the metric generator for the base function having the highest M is coupled to the selection input on a different one of the data selectors, and wherein the data inputs and outputs of the data selectors are communicatively coupled together in a series such that the data output of the last of the data selectors in the series outputs a particular one of the data inputs of one of the data selectors selected by the metric generators.

The apparatus may also include ORing logic having inputs communicatively coupled to the outputs of the comparators.

The apparatus may also include a plurality of the metric generators each configured to generate the metric in accordance with a different base function, wherein ideal phase differences for each of the base functions are uniformly distributed within any continuous angular interval spanning 2π radians and wherein none of the different base functions have identical values of M; a plurality of averagers, each of which is communicatively coupled to a different one of the metric generators and configured to determine an average metric; and a peak detector communicatively coupled to each of the averagers, and configured to indicate: (i) if the ideal phase differences correspond to the maxima of the base functions, which of the average metrics is largest; and (ii) if the ideal phase differences correspond to the minima of the base functions, which of the average metrics is the smallest.

The apparatus may also include a plurality of comparators, each of which is communicatively coupled to a different one of the averagers and configured to compare the average metric to a validity threshold for that value of M, and to output a signal indicating that the average metric surpasses the validity threshold only when the average metric surpasses the validity threshold. M for each of the base functions may be a positive integer power of 2.

According to another aspect, there is provided a lock detector. The lock detector includes a front end configured to sample a received carrier that is modulated using a symbol according to a modulation order (M) equaling the number of distinct ideal symbol phases used to modulate the received carrier, wherein the front end comprises a symbol synchronizer configured to attempt to synchronize sampling instances to the symbols used to modulate the received carrier; a phase determiner communicatively coupled to the front end and configured to determine a received phase of the baseband symbol from one or more samples taken at the sampling instances; a metric generator communicatively coupled to the phase determiner and configured to generate a metric from the received phase, wherein possible metrics depend on possible received phases according to a base function that comprises a triangle wave having its maxima or minima located at ideal symbol phases and the other of its maxima or minima located at phases midway between adjacent ideal symbol phases; an averager communicatively coupled to the metric generator and configured to average a plurality of the metrics to determine an average metric; and a comparator communicatively coupled to the averager and configured to compare the average metric to a lock indicator detection threshold and to indicate when the average metric surpasses the lock indicator detection threshold, thereby indicating when the local carrier is locked to the received carrier. The symbol synchronizer does not have to synchronize the sampling instances to the symbols.

According to another aspect, there is provided a modulation classifier, having a front end configured to obtain a pair of baseband symbols from a received carrier that is modulated using the symbols according to a modulation order (M) equaling the number of distinct ideal symbol phases used to modulate the received carrier; a phase determiner communicatively coupled to the front end and configured to determine a received phase of each of the symbols; a phase difference determiner communicatively coupled to the phase determiner and configured to determine a received phase difference between the pair of symbols; a plurality of metric generators, each communicatively coupled to the phase difference determiner and configured to generate a metric from the received phase difference, wherein possible metrics depend on possible received phase differences according to a base function that comprises a triangle wave having its maxima located at ideal phase differences and its minima located at phase differences midway between adjacent ideal phase differences, and wherein each of the metric generators is configured to determine the metric in accordance with a different base function corresponding to a different digital modulation scheme; a plurality of averagers, each of which is communicatively coupled to a different one of the metric generators and configured to determine an average metric; and a peak detector communicatively coupled to each of the averagers, and configured to indicate which of the average metrics is largest.

The apparatus may also include a plurality of comparators, each of which is communicatively coupled to a different one of the averagers and configured to compare the average metric to a validity threshold for that metric, and to output a signal indicating that the average metric surpasses the validity threshold only when the average metric surpasses the validity threshold.

According to another aspect, there is provided an apparatus for generating a metric for one or both of lock detection and signal-to-noise ratio (SNR) estimation. The apparatus includes a data input configured to receive the phase of a baseband symbol obtained from a received carrier that is modulated using the symbol according to a modulation order (M) equaling the number of distinct ideal symbol phases used to modulate the received carrier; a data output configured to output the metric; and circuitry communicatively coupled between the data input and output and configured to generate the metric from the phase, wherein possible metrics depend on possible phases according to a base function that comprises a triangle wave having its maxima or minima located at ideal symbol phases and the other of its maxima or minima located at phases midway between adjacent ideal symbol phases.

According to another aspect, there is provided an apparatus for generating a metric for one or both of signal-to-noise ratio (SNR) estimation and modulation classification. The apparatus includes a data input configured to receive a phase difference between a pair of baseband symbols from a received carrier that is modulated using the symbols according to a modulation order (M) equaling the number of distinct ideal symbol phases used to modulate the received carrier; a data output configured to output the metric; and circuitry communicatively coupled between the data input and output and configured to generate the metric from the phase difference, wherein possible metrics depend on possible phase differences according to a base function that comprises a triangle wave having its maxima or minima located at ideal phase differences and the other of its maxima or minima located at phase differences midway between adjacent ideal phase differences.

According to another aspect, there is provided an apparatus for generating a metric for one or both of lock detection, signal-to-noise ratio (SNR) estimation, and modulation classification. The apparatus includes selecting means for selecting one of A, −A or 0 in response to selection bits; inverting means for inverting a principal angle in response to inversion control bits; and adding means, communicatively coupled to outputs of the selecting means and the inverting means, for adding one of A, −A or 0 to the principal angle or its inverse to generate the metric, wherein the received carrier is modulated using a symbol according to a modulation order (M) equaling the number of distinct ideal symbol phases used to modulate the received carrier, wherein the distinct ideal symbol phases are uniformly distributed within any continuous angular interval spanning $2\pi$ radians and wherein the principal angle is modulo ($\pi/2M$) of the phase of the symbol, normalized to have a supremum of A.

BRIEF DESCRIPTION OF THE DRAWINGS

In the accompanying drawings, which illustrate one or more exemplary embodiments:

FIG. 7 is exemplary SystemVerilog code that can be used to synthesize a module (calculate_triangular_LD_metric) for computing one or more embodiments of the base function, $h_M(\theta)$, and an auxiliary module used therein (safely_discard_upper_sign_bits).

FIG. 21 is exemplary SystemVerilog code that can be used to implement one embodiment of the modulation classifier.

DETAILED DESCRIPTION

Many modern communications systems in recent years support several modulations, which are switched in one or more of an adaptive, user, and algorithm controlled manner. In some cases, the modulations are toggled in response to changing channel conditions, communications protocol requirements, or user choice. Switching between the various modulations often has as its core objective the efficient utilization of the available spectrum, in order to achieve high data throughput, while also efficiently utilizing the available transmission and signal processing power at the transmitter and receiver.

In recent years, significant developments and a large body of research has been done on Software Defined Radio (SDR) and Cognitive Radio (CR). In the former, the receiver's innards can be reconfigured in real-time in order to support different modulations; this is usually achieved through the use of one or both of reconfigurable hardware (such as field programmable gate arrays, hereinafter referred to as FPGAs) and a real-time software component. In CR, the receiver in theory autonomously decides what modulation it sees at its input and applies the appropriate receiver algorithms appropriately. Usually, CR and SDR go hand in hand; that is a CR will usually have a software defined architecture.

Modulation classifiers are typically used in CR. The CR makes intelligent choices as to the modulation that it sees at its receiver entrance. This is done using the modulation classifier. The following embodiments include a new structure for a modulation classifier.

Moreover, after the modulation has been classified, if the receiver demodulates the incoming signal coherently, a lock detector is often subsequently used. The following embodiments also include a new structure for a lock detector.

Frequently, an SNR estimator is used by the receiver to increase performance of the receiver, as well as to provide a signal quality indication to the receiver operator or for other receivers or entities. The following embodiments also include new structures for SNR estimators.

System Model

Figure 1:
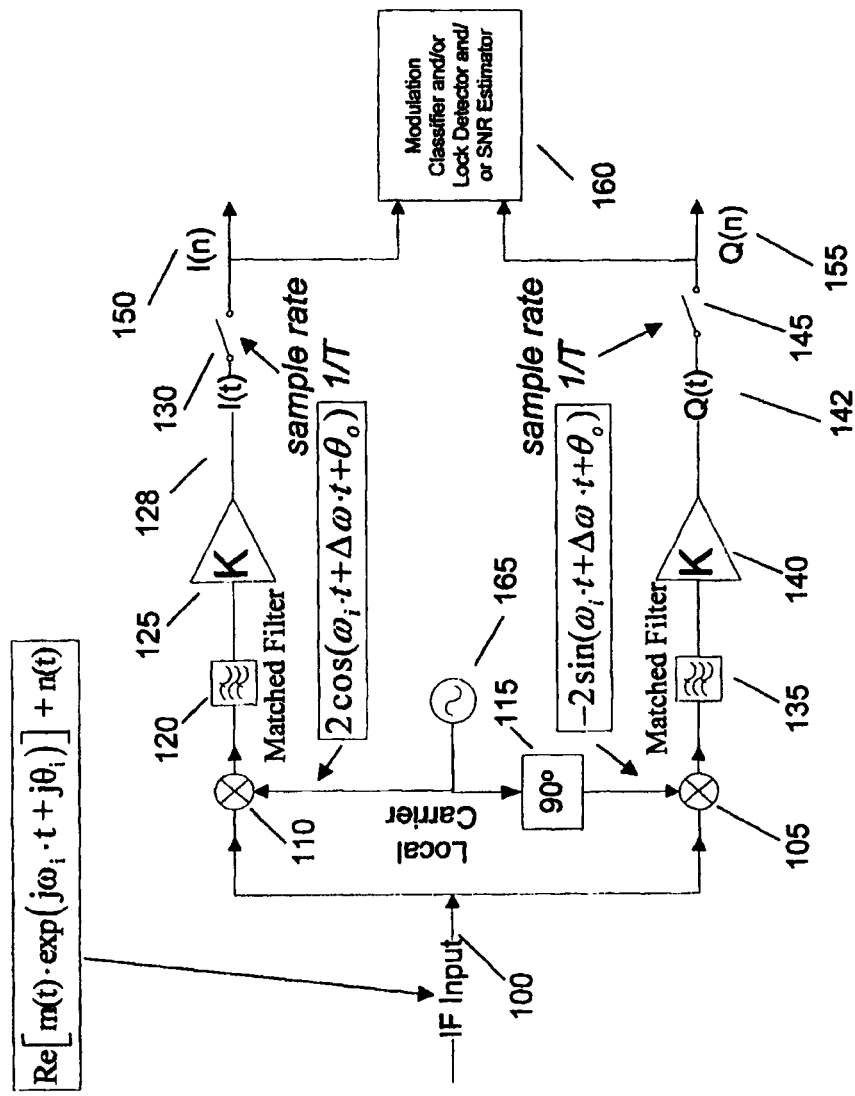
FIG. 1 is a schematic view of a simplified D-MPSK or MPSK receiver, according to one embodiment.

A simplified diagram of the front-end of the receiver under discussion is shown in FIG. 1. 1/T is the symbol rate and, as well in the exemplary embodiment, the sample rate. For the exemplary embodiment, a PSK (Phase Shift Keying) modulation scheme is assumed for simplicity. The transmitted baseband PSK signal is $m(t) \equiv \sum_{n=-\infty}^{\infty} a_n p(t-nT)$, with $p(t)$ being the pulse shape and the symbols being $a_n = \exp(j\phi_n)$, with $\phi_n = 2\pi \cdot m_n/M$ being the ideal symbol phases of the transmitted baseband symbols, with $m_n \in \{0, 1, \ldots, M-1\}$ (i.e., the phases are uniformly distributed in the interval $[0, 2\pi)$), where M is called the modulation order or modulation index (e.g. M=2 for BPSK (Binary Phase Shift Keying), M=4 for QPSK (Quaternary Phase Shift Keying), M=8 for 8-PSK, etc.). By "uniformly distributed", it is meant that the phase difference between any two symbols of the modulation's constellation diagram is $2\pi k/M$, where k is an integer. M in general (not just for M-PSK) is the number of distinct ideal symbol phases of the symbols in the modulation's constellation. In alternative embodiments other phases are possible for different Ms which are different from those used here in the exemplary embodiment.

M is in general a positive integer. In many systems, M is a positive integer power of 2, i.e. $M=2^k$ where "k" is some positive integer. For example, M=2, M=4, M=8, M=16, M=32, and M=64 are examples of Ms which are positive integer powers of 2.

The modulated signal 100 that is present at the output of the receiver's intermediate frequency (IF) downconversion stage is $Re[m(t)exp(j\omega_i t+j\theta_i)]+n(t)$, where n(t) is the noise process, with $\omega_i$ being the received IF carrier frequency in radians/sec, and $\theta_i$ (in radians) being the phase of the received IF carrier. In other embodiments, the receiver may not have an intermediate frequency, or may have several intermediate frequencies, in which case appropriate modifications are accordingly made to the exemplary embodiments. Hence, the description of the exemplary embodiments should not be construed as limiting. For the purposes of this disclosure, it is simpler to treat the receiver as a D-MPSK receiver, whether the actual receiver is M-PSK or D-MPSK. This is because a D-MPSK signal is identical to an M-PSK signal in terms of the transmitted signal waveform, with the exception that the D-MPSK waveform may be differentially coded whereas sometimes M-PSK signals are not so coded. In terms of demodulation, the only difference between M-PSK and D-MPSK is in how these are demodulated (the former, coherently, and the latter, differentially). However, for the embodiments of the modulation classifier presented herein carrier synchronization is not assumed and the proposed classifiers are non-data aided (NDA); hence, the issues of carrier synchronization and differential coding/decoding are irrelevant for the purpose of describing the exemplary embodiments. Therefore, the receiver may be treated as a D-MPSK receiver regardless of whether the actual system is M-PSK or D-MPSK.

Additionally, although several of the following embodiments use M-PSK as a modulation scheme, in alternative embodiments alternative modulations that are related to M-PSK, such as O-MPSK (Offset MPSK), D-O-MPSK (Differential Offset MPSK), MSK (Minimum Shift Keying), GMSK (Gaussian Minimum Shift Keying), π/M-MPSK, D-π/M-MPSK (Differential π/M-MPSK), FQPSK (Feher's QPSK) and its derivatives, SOQPSK (Shaped-Offset Quadrature Phase-Shift Keying) and its derivatives, 3π/M-8PSK, D-3π/M-8PSK (Differential 3π/M-8PSK), QAM (Quadrature Amplitude Modulation), OQAM (Offset QAM), PAM-PSK (Pulse Amplitude Modulation Phase Shift Keying), OFDM (Orthogonal Frequency Division Multiplexing), Offset-PAM-PSK, CPM (Continuous Phase Modulation) and its variants, and Trellis Coded Modulation (TCM) and its variants may be used.

The modulated signal 100 passes through matched filters 120, 135, whose response is p*(−t) (where "*" denotes complex conjugation), $\omega_o=\omega_i+\Delta\omega$ (radians/sec) is the local carrier frequency ($\Delta\omega$ is the frequency error between the received carrier and the local carrier 165) and $\theta_0$ (radians) is the phase of the local carrier 165. A quadrature receiver front end is assumed for the demodulator of the exemplary embodiment, i.e. multiplication using multipliers 105, 110 by the local carrier 165 and its quadrature which is generated by passing the local carrier 165 through a 90 degree phase shifter 115. Alternative embodiments may use other types of receiver front ends and the exemplary embodiment accordingly should not be construed as limiting. The local oscillator 165 may be controlled or may be free running, depending on the receiver architecture, and, moreover, the receiver structure may be implemented in analog, digital, or mixed signal circuits, or in another suitable manner. For the purposes of describing this embodiment, symbol timing synchronization is assumed, and the Nyquist criterion for zero ISI is assumed obeyed at the outputs of the matched filters 120, 135. Optionally, the amplifiers 125, 140 can be included after the matched filters 120, 135. The quantity K for the amplifiers 125, 140 may be a true amplification or it may be a mathematical equivalent (preferably AGC-controlled) I-Q arm gain. In many receivers, K is a slow function of time, and is controlled by the AGC in order to attain the desired signal level at the inputs of the I and Q samplers so as to utilize their full dynamic range without saturating. Following amplification, the I(t) and Q(t) signals are sampled by samplers 130, 145, which operate at a rate of at least 1/T Hertz, from which the relevant samples spaced 1/T seconds apart (corresponding to optimal sampling instances for each symbol) are extracted for the embodiments of the lock detector, SNR estimator, and modulation classifier that are discussed below. In alternative embodiments the sampling rate could be higher than 1/T Hertz. In such cases, the samples that correspond to the baseband symbols are extracted, via one or both of sample selection and interpolation; ideally those samples that correspond to the ideal sampling instances for the received symbols are obtained. These ideal sampling instances are usually determined via a symbol sampling synchronization and/or determination circuit that is contained within the receiver. In yet other embodiments, the sampling rate may be less than 1/T. In such a case, the structures presented herein would operate upon a subset of the received symbols, which is also possible.

The notations $n_I(t)$ and $n_Q(t)$ are used to refer to the noise present before the amplifiers 125, 140 in the I and Q arms, respectively. In many systems, this noise signal's source is an Additive White Gaussian Noise (AWGN) that is present in the channel, an assumption that is made for the purposes of describing the embodiments described in this disclosure.

Thus, I(n) 150 and Q(n) 155 are respectively $I(n)=K(2E_S \cdot \cos(-\Delta\omega \cdot nT+\theta_e+\phi_n)+n_I(nT))$ and $Q(n)=K(2E_S \cdot \sin(-\Delta\omega \cdot nT+\theta_e+\phi_n)+n_Q(nT))$, with $\theta_e \equiv \theta_i-\theta_o$ and $n_I(nT), n_Q(nT) \sim N(0, 2N_0 E_S)$, where $$E_S \equiv \frac{1}{2}\int_{-\infty}^{\infty} |p(t)|^2 dt$$

is the symbol energy and $N_0/2$ is the AWGN noise power spectral density. The phase of the received (complex) baseband symbol $r_n \equiv I(n)+j \cdot Q(n)$ is $\phi_{r_n} \equiv \tan^{-1}(Q(n)/I(n))$, which as discussed in more detail below is the instantaneous phase of the received baseband symbol 415 ("received phase"). In polar coordinates, $r_n=|r_n|\exp(j\phi_{r_n})$.

Here it is assumed that $|\Delta\omega| \ll 2\pi/(M \cdot T)$, which is a standard assumption that is made in D-MPSK receivers. In essence, it is assumed that a rough estimate of the carrier frequency has been made and that it has been corrected in such a manner so that $|\Delta\omega| \ll 2\pi/(M \cdot T)$ is met, i.e. that the local carrier frequency is relatively close to the carrier frequency of the input signal. This can be achieved using, for example, open loop frequency estimation and correction circuits. For example, in many cases $|\Delta\omega| \ll 2\pi/(M \cdot T)$ is already a given for a CR system since the frequency band of the input signal is known, though the modulation index is not.

The notation χ is used to refer to the Symbol SNR (Signal to Noise Ratio), that is, $E_S/N_0=\chi$.

Without loss of generality, it can be assumed for mathematical convenience that $\forall n, \phi_n=0$, whereupon:

$$\varphi_n \equiv \tan^{-1}\left(\frac{Q(n)}{I(n)}\right) = \tan^{-1}\left(\frac{\sin(-\Delta\omega \cdot nT + \theta_e) + n_Q(nT)/(2E_S)}{\cos(-\Delta\omega \cdot nT + \theta_e) + n_I(nT)/(2E_S)}\right) \quad (1)$$

The received phase $\phi_n$ 415 is independent of the value of K of the amplifiers 125, 140, as can be seen by the fact that K does not appear in (1). Since, as discussed below, the exemplary embodiment relies on operations upon $\phi_n$, this means that the embodiment does not depend upon K nor upon the AGC's control of K. This is advantageous, since the AGC is usually non-ideal and the value of K usually does experience fluctuations. The only dependence of the embodiment on the AGC is indirect and weak, and will manifest itself if the AGC is so bad that one or both of I(t) 128 and Q(t) 142 are either overdriven or underdriven, which may cause substantial degradations due to one or more of saturation, compression, and quantization noise which are due to the finite dynamic range and quantization accuracy of the samplers 130, 145. However, usually the AGC can easily be made to be sufficiently robust in order to prevent frequent occurrences one or both of overdriving and underdriving, so that the independence of the embodiment from K is a real and substantial advantage in practice.

It can be defined that:

$$\Delta\phi_n \equiv \phi_n - (-\Delta\omega nT + \theta_e) \quad (2)$$

Since it is assumed that $\forall n, \phi_n = 0$, the physical meaning of $\Delta\phi_n$ is clear: it is the phase error in the received phase of any one of the received baseband symbols, $\phi_n$ 415, relative to the symbol's ideal phase $\phi_n$, that can be attributed to noise, i.e. to $n_I(nT)$ and $n_Q(nT)$ (to see this, substitute $n_I(nT) = n_Q(nT) = 0$ in the expressions for I(n) and Q(n), and then $\phi_n = \tan^{-1}(Q(n)/I(n)) = -\Delta\omega nT + \theta_e \Rightarrow \Delta\phi_n = \phi_n - (-\Delta\omega nT + \theta_e) = 0$). From this, it can be shown that:

$$p_C(\Delta\phi | \chi) \equiv p(\Delta\phi_n = \Delta\phi | E_S/N_0 = \chi) = \quad (3)$$

$$\frac{e^{-\chi}}{2\pi}\left[1 + \sqrt{2\chi}\cos(\Delta\phi)\exp(\chi \cdot \cos^2(\Delta\phi)) \cdot \int_{-\infty}^{\cos(\Delta\phi)\sqrt{2\chi}} e^{-y^2/2}dy\right]$$

where $-\pi \leq \Delta\phi \leq \pi$.

Lock Detector and SNR Estimator

Figure 4:
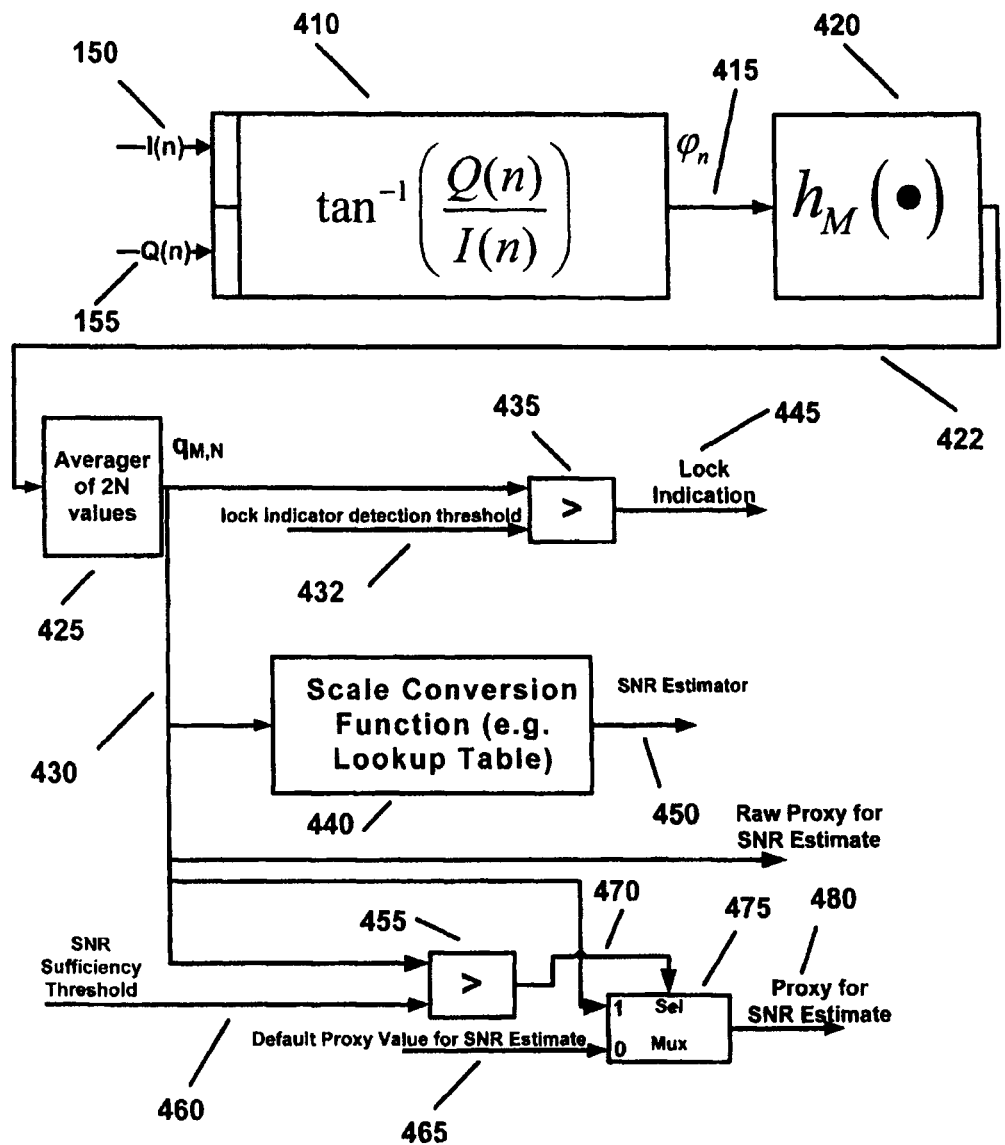
FIG. 4 is a schematic view of a lock detector and SNR estimator that can be used in the receiver of FIG. 1.

As shown in FIGS. 1 and 4, I(n) and Q(n) are used to determine the received phase of any one the received baseband symbols, $\phi_n$ 415. $\phi_n$ 415 is then input to a base function that outputs a metric from which lock detection and SNR estimation can be performed.

Figure 2:
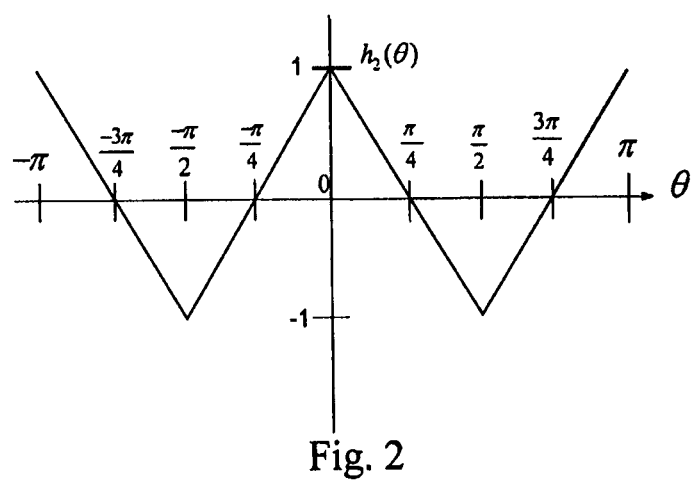
FIG. 2 is a graph showing one embodiment of the base function, $h_2(\theta)$.
Figure 3:
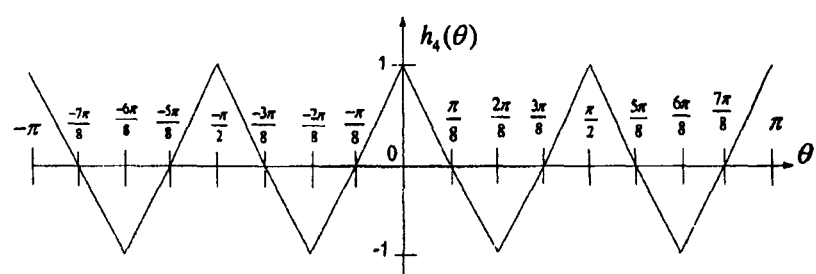
FIG. 3 is a graph showing another embodiment of the base function, $h_4(\theta)$.

FIGS. 2 and 3 show two exemplary embodiments of the base function. In these Figures, the base function is defined as $h_M(\theta)$ (where M is the modulation order), where $\theta$ is an input variable representing an angle in radians. The base function includes a curve that is a triangle wave, with periodicity of $2\pi/M$ radians, with the maxima of the triangles corresponding to the ideal symbol phases or those phases plus any integer multiple of $2\pi$. $h_M(\theta)$ is defined for all $\theta \in (-\infty, \infty)$, but, since any angle (in radians) is angularly equivalent to itself plus any integer multiple of $2\pi$ (radians), it suffices to implement $h_M(\theta)$ for any interval of length of at least $2\pi$. In the exemplary embodiment, the angles upon which $h_M(\theta)$ are implemented span the interval $[-\pi, \pi)$ radians. For example, for BPSK (M=2) the base function from $[-\pi, \pi)$ is shown in FIG. 2; for QPSK, this is shown in FIG. 3; and similarly for other modulations. However, any angle can be expressed as itself plus any integer multiple of $2\pi$. Thus, in alternative embodiments, $h_M(\theta)$ can be implemented for angles residing in any interval of at least length $2\pi$ (which usually would be a continuous interval (for simplicity) but not necessarily so), with the implementation of $h_M(\theta)$ being accordingly modified. In the present embodiment, $h_M(\theta)$ has a maximum of 1 and a minimum of $-1$. In other embodiments, $h_M(\theta)$ may have a maximum and minimum with different values, such as A for the maximum and $-A$ for the minimum, where "A" is some non-zero value. In general, the maxima and minima of $h_M(\theta)$ will have identical absolute values (in the exemplary embodiment, for example, the value of this absolute value is "1"). In some embodiments $h_M(\theta)$ may have a DC offset, either inevitable (e.g. due to quantization) or intentional, that is for example the maximum will be A+DC and the minimum will be $-A$+DC, where "DC" represents the DC offset.

Yet other embodiments may be defined where the minima of $h_M(\theta)$ (e.g. with value $-A$) correspond to the ideal symbol phases, and maxima (e.g. with value $+A$) correspond to the phases midway between the ideal symbol phases. In such embodiments, the thresholds and expected values are the negative of those discussed in the exemplary embodiments discussed herein, and other modifications to the embodiments are made as appropriate.

In FIG. 2, the ideal symbol phases are located at $-\pi$, 0, and $\pi$, one pair of adjacent ideal symbol phases is $-\pi$ and 0, and another pair of adjacent ideal symbol phases is 0 and $\pi$. In FIG. 3, the ideal symbol phases are located at $-\pi$, $-\pi/2$, 0, $\pi/2$, and $\pi$, one pair of adjacent ideal symbol phases is $-\pi$ and $-\pi/2$, another pair is $-\pi/2$ and 0, another pair is 0 and $\pi/2$, and a fourth pair is $\pi/2$ and $\pi$. This exemplary distribution of symbol phases is uniform in that the differences between all of the adjacent ideal symbol phases are identical ($\pi/2$). In alternative embodiments, as discussed below in respect of for example Rectangular QAM-16, a non-uniform distribution of phases is possible, in which case the periodicity of the base function ceases to be $2\pi/M$.

The hardware implementation of the lock detector and SNR estimator is shown in FIG. 4. I(n) 150 and Q(n) 155 are passed through a phase determiner 410, which in the depicted embodiment is an inverse tangent function, whose output is the received phase $\phi_n$ 415. The inverse tangent in all the figures in this disclosure may be implemented for example in one or both of hardware and software, as any one or more of lookup tables, using the CORDIC algorithm, or using another suitable method. The received phase $\phi_n$ 415 is passed through a metric generator 420, which implements $h_M(\cdot)$, such as a logic circuit or a lookup table. The output 422 of the metric generator 420 is the metric for that symbol. That metric is averaged, i.e. 2N metrics are averaged to determine an average metric $q_{M,N}$ 430, that is:

$$q_{M,N} = \frac{1}{2N}\sum_{n=-N+1}^{N} h_M(\varphi_n) \quad (4)$$

This averaging can be done such as via an Integrate and Dump (IAD) component 425 as is done in the exemplary embodiment, and the output is denoted $q_{M,N}$ 430 in this exemplary embodiment, and is the average metric.

$q_{M,N}$ 430 is an estimate of the expected value $E[h_M(\phi_n)]$, where $E[\cdot]$ is the expectation operator. Another way to phrase this is that $$q_{M,N} \xrightarrow{N \to \infty} E[h_M(\varphi_n)]$$

and when the carrier loop is in lock, $\bar{h}_M(\chi) \equiv E[h_M(\phi_n)|\chi$, carrier loop is locked] is the expected value of the base function, and for a given SNR $$q_{M,N} \xrightarrow{N \to \infty} \bar{h}_M(\chi),$$

and in an ergodic system (as is commonly assumed for physical systems)

$$E[q_{M,N}] = \lim_{N \to \infty} q_{M,N} = E[h_M(\varphi_n)] \stackrel{locked}{=} \bar{h}_M(\chi).$$

It should be noted that in other embodiments other averaging definitions can be used than that of (4), for example the number of samples averaged does not need to be even, nor do the samples need to be defined as between $-N+1$ and $N$, nor do the set of symbol intervals upon which the average is calculated need to be adjacently successive in time.

In the exemplary embodiment shown in FIG. 4, SNR estimation is done via a Scale Conversion Function 440, for example given $\bar{h}_M(\chi) = E[h_M(\phi_n)|\chi$, carrier loop is locked], then a suitable Scale Conversion Function for calculation of the SNR in dB (decibels) 450 can be implemented via applying the transformation $10 \log_{10}(\bar{h}_M^{-1}(\cdot))$ 440 upon $q_{M,N}$ 430, where $\bar{h}_M^{-1}(\cdot)$ is the inverse function of $\bar{h}_M(\chi)$. This calculation can be implemented in a structure such as a lookup table, as is done in the exemplary embodiment, which does not require any real-time mathematical operations, and hence can be implemented in a relatively compact fashion. However, there are many ways to implement such a function that can be used in alternative embodiments, and the methods given above are not meant to exclude such alternatives.

It should be noted that when $q_{M,N}$ is equal to or less than 0, then this implies any one or more of that the estimate is inaccurate, there is too much noise accompanying the signal (i.e. the SNR is very low), no signal is present, and the carrier is unlocked. In such cases, $10 \log_{10}(\bar{h}_M^{-1}(q_{M,N}))$ is not defined (since $q_{M,N}$ is negative) and thus the SNR estimate is not defined by this equation; this is indeed the correct behavior for this type of scenario, since $q_{M,N}$ in this case does not supply sufficient information from which to derive an accurate SNR estimate. The designer may substitute a suitable default SNR value for this estimate if desired, for example the lowest SNR expected, or alternatively the lowest possible SNR that is expressible using the quantization of the system's datapath. This often makes sense from a design perspective, since such a scenario implies a lack of information about the input signal, and as such, worst-case assumptions are warranted. In other embodiments, other behaviors for the SNR estimate generation when $q_{M,N} \leq 0$ can be defined. In the foregoing example, the SNR Sufficiency Threshold is 0, since at or below that value the estimate $q_{M,N}$ is considered not sufficient for SNR estimation. Other SNR Sufficiency Thresholds are possible for other embodiments. Alternatively or in conjunction with assigning a default or otherwise obtained SNR value for the case of $q_{M,N} \leq 0$, the number of samples averaged (2N) may be increased in order to reduce the variance of $q_{M,N}$ 430 in order to arrive at a more accurate value for this quantity.

Whilst an SNR estimate in dB is very useful and is perhaps the standard manner in which SNR is expressed, many other possible SNR indications are possible, for example a logarithmic value in a different base (e.g. $\ln(\bar{h}_M^{-1}(\cdot))$ where "ln" is the natural logarithm function). Indeed, in alternative embodiments the average metric $q_{M,N}$ 430 can itself serve as a proxy for the SNR estimate without further processing, if that value can be used as-is by the receiver as a raw proxy for the SNR estimate and, for example, appropriate arrangements are made in the receiver to handle values of $q_{M,N}$ that do not surpass the SNR sufficiency threshold (for example, simply ignoring them). Another way that $q_{M,N}$ 430 can itself serve as a proxy is done as follows: $q_{M,N}$ 430 is compared by a comparison device such as a comparator 455 to an SNR sufficiency threshold 460 (e.g. an SNR sufficiently threshold of 0). If $q_{M,N}$ 430 does not surpass the threshold, then $q_{M,N}$ 430 is considered to be insufficient for SNR estimation and the output 470 of the comparator 455 selects via a data selection device such as a multiplexer 475 a default proxy value for the SNR estimate 465 that is passed through to the output 480 of the multiplexer 475 and serves as a proxy for the SNR estimate that can be used by the receiver. The default proxy value for the SNR estimate can be a constant, as in the present embodiment, or in other embodiments it can arrive from another part of the system and may not be constant. If $q_{M,N}$ 430 does surpass the SNR sufficiency threshold 460, then its value can be used as a proxy for the SNR estimate and it is passed to the output 480 through the multiplexer 475 by virtue of appropriate selection from the output 470 of the comparator 455.

A lock detection indicator 445 that signifies that a determination has been made that the local carrier 165 is locked to the received carrier, is obtained by comparing $q_{M,N}$ 430 to a lock indicator detection threshold 432 by use of a comparison device 435 such as a comparator. The value that should be chosen as the threshold 432 is dependent upon the value of $\bar{h}_M(\chi)$, as discussed in more detail below. From $\bar{h}_M(\chi)$ it may be possible to deduce the optimal thresholds. However, in practice, it is not necessary to calculate the optimal threshold, but rather it can be found via trial and error. In the exemplary embodiment, the thresholds are between 0 and 1 and are set in order to achieve desirable lock and false alarm probabilities, and can be determined experimentally, via theory, via simulations, or via other suitable means. Moreover, in other embodiments more advanced lock indication decisions can be obtained via other methods such as double or triple threshold algorithms.

Calculation of the Scale Conversion Function 440

Determining values of $10 \log_{10}(\bar{h}_M^{-1}(\cdot))$ may be done, for example, to generate the lookup table values for a lookup table implementation of the Scale Conversion Function 440. One possible way to calculate the function $\bar{h}_M^{-1}(\cdot)$ is to (a) evaluate $\bar{h}_M(x)$ over a fine enough grid $x_i$, $i \in \{1, 2, \ldots, W\}$ in the domain $[x_A, x_B]$ which encompasses the domain of SNRs of interest (e.g. those for which the receiver is expected to operate), in order to yield the values $\bar{h}_M(x_i) = y_i \in [y_A, y_B]$, $i \in \{1, 2, \ldots, W\}$, and then (b) determine the inverse function $x = \bar{h}_M^{-1}(y)$ for any $y \in [y_A, y_B]$ by computing the function $\bar{h}_M^{-1}(\cdot)$ at $y$ through interpolation from the known coordinate pairs $(x_i, y_i)$, for example using nearest-neighbor interpolation, the Lagrange polynomial method or spline curves. Note that the inverse function or its value in dB or any function thereof (quantized over a fine enough grid) can be stored in a lookup table, so that this process can be done beforehand and not in real-time. Such a method may be used in order to compute the values of a lookup table for the scale conversion function 440 in order to compute $10 \log_{10}(\bar{h}_M^{-1}(\cdot))$ for the case of a positive input to this function; other procedures for obtaining the inverse of a function are also possible in alternative embodiments.

Figure 17:
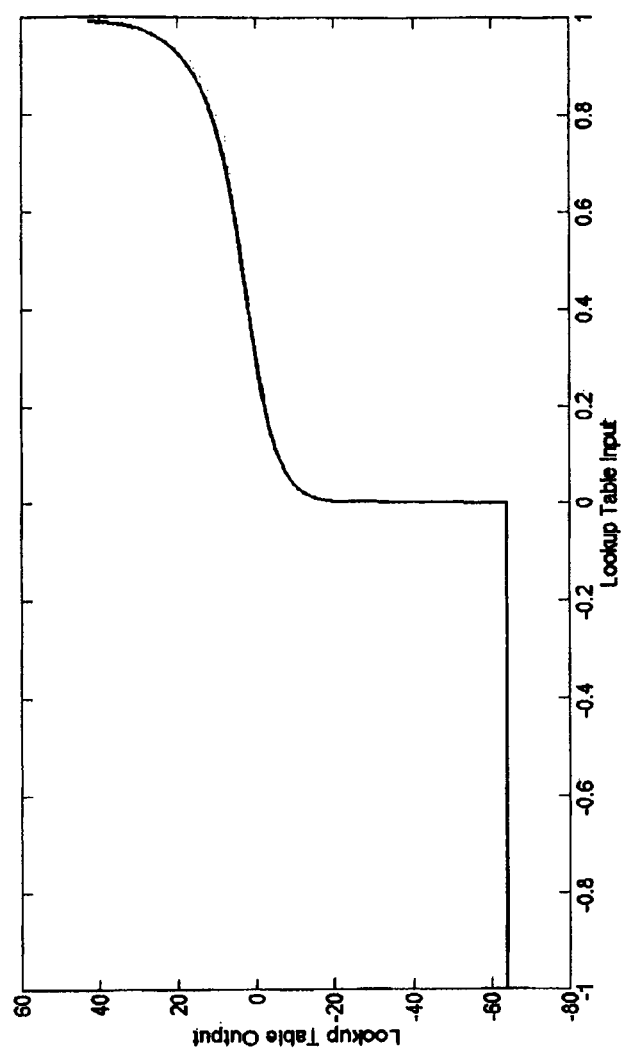
FIG. 17 is a graph of a lookup table implementation for the calculation of an SNR estimate in dB from the value of $q_{2,N}$ for a BPSK signal, according to one embodiment.
Figure 18:
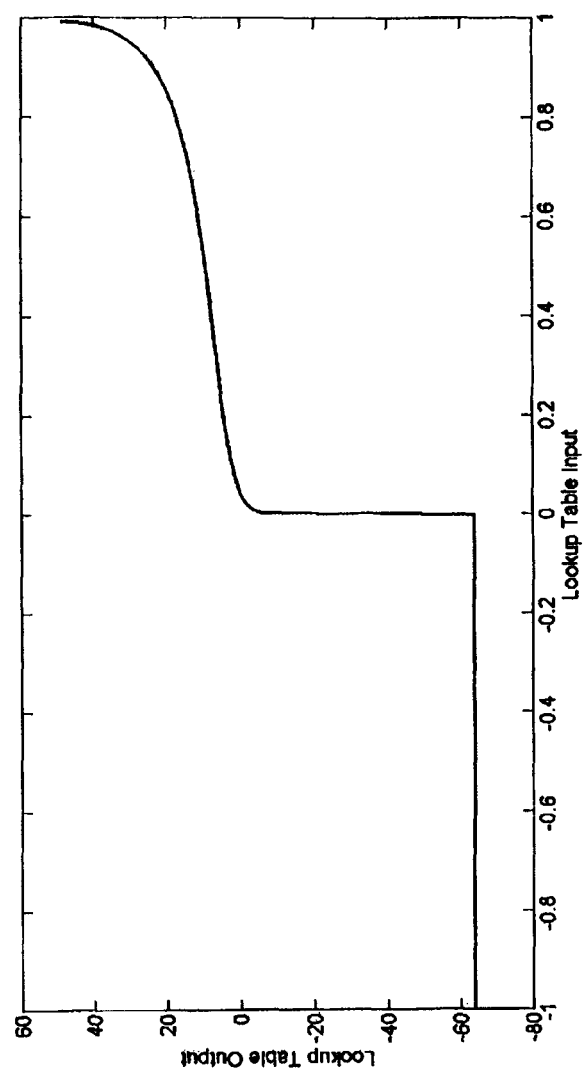
FIG. 18 is a graph of a lookup table implementation for the calculation of an SNR estimate in dB from the value of $q_{4,N}$ for a QPSK signal, according to one embodiment.

An example of the values of a lookup table for implementing the scale conversion function 440 in decibels can be found in FIGS. 17 and 18, for BPSK and QPSK, respectively. This lookup table shows the values obtained for an input quantization of 9 bits (1 sign, 8 fraction bits) that represent $q_{M,N}$ 430, and the output is 12 bits (1 sign bit, 6 whole bits, 5 fractional bits). The numerical representation can be chosen by the designer, such as two's complement in the exemplary embodiment. As can be seen in FIGS. 17 and 18, when $q_{M,N}>0$, the value of the lookup table would be $10 \log_{10}(\bar{h}_M^{-1}(q_{M,N}))$, while, for $q_{M,N} \leq 0$, as discussed earlier, some default value could be used, for example in the case shown in FIGS. 17 and 18 this is the most negative value that can be represented (i.e., the lowest SNR in dB) by the chosen 12 bit quantization.

Implementation of the Phase Determiner 410

As for the phase determiner 410, it can be the same one used for determining the symbol phase for subsequently making decisions upon the received symbols (a common task in demodulators). Moreover, the output of this function, the received phase of the baseband symbol $\phi_n$ 415, is the same one required regardless of the value of M. Therefore, if structures are implemented for various Ms in the same receiver, such as in a receiver that has support for several modulations, then only one implementation of the phase determiner 410 may be used. This reduces the resources needed and is another advantage of the exemplary embodiment. The inverse tangent in the exemplary embodiment is one whose range is $[-\pi,\pi)$, that is, it takes into account the quadrant in which $r_n$ is present. For example, it behaves similarly to the function a tan 2 in the program Matlab™. Although in the depicted embodiments the inverse tangent function is used to implement the phase determiner 410, in alternative embodiments (not depicted) the phase determiner 410 may be implemented in a different manner, and not necessarily using the inverse tangent function.

Relatively Efficient Implementation of the Metric Generator 420

A useful attribute of the lock detector and SNR estimator described above is that in some embodiments an implementation that takes advantage of the linear characteristic of the curves of $k_M(\cdot)$ can be used. As discussed below, this implementation can be made to consume relatively few resources. Therefore some embodiments of the lock detectors, SNR estimators, and modulation classifiers in which the ideal symbol phases are uniformly distributed can be implemented using relatively efficient hardware, especially when multiple modulations are needed, since the phase determiner 410, which in many embodiments is a part that consumes substantial resources, can be reused from the symbol decision circuitry or other circuitry in the receiver that requires such functionality.

As a preliminary step, for the exemplary embodiment, the phase θ is encoded using a suitable encoding such as two's complement encoding which is b bits wide, in the exemplary embodiment from bits b−1 (the MSB (Most Significant Bit)) to 0 the LSB (Least Significant Bit). In the exemplary embodiment the MSB is the sign bit. The notation θ[x] refers to significant bit number "x" in the binary representation of θ. "x" is not necessarily the bit with index "x" counting from the right (as is the case in two's complement, starting with bit 0 as the LSB); in general, θ[0] would refer to the LSB, θ[1] would refer to the bit which is with the least significance except for the LSB, θ[2] would refer to the bit that is of the least significance except for θ[1] and θ[0], etc. For example, for the exemplary embodiment, θ[b−1] is the sign bit and MSB, and θ[0] is the LSB. The notation θ[x:y] is used to denote the binary number formed by the sequence of bits θ[x], θ[x−1], θ[x−2], . . . , θ[y]. For example, θ[3:0] signifies the binary number composed of the bits θ[3], θ[2], θ[1], θ[0] (e.g., if the code representing θ is 11110011 then θ[3:0]=0011 in this case). Additionally, the codes are assigned to linearly encompass the entire angular range, i.e. $[-\pi,\pi)$ radians. That is, the lowest possible code (=the most negative code) represents the angle $-\pi$ radians, and the highest possible encoding (=the most positive code) represents $\pi-\epsilon$ radians, where $\epsilon=\pi/(2^{b-1})$. To give a few examples, if there are b=8 bits in the code, the code "10000000" represents the angle $-\pi$, the code "10000001" represents the number $-\pi+\pi/128$, "10000010" represents the angle $-\pi+2\pi/128$ and so on; the code "00000000" represents the angle 0, the code "00000001" represents the angle $\pi/128$, the code "00000010" represents the angle $2\pi/128$, and so on, and the highest code 01111111 represents the angle $127\pi/128=\pi-\pi/128=\pi-\pi/(2^{b-1})$. The purpose of this encoding is twofold. First, it maximizes the dynamic range utilization of the binary representation; since the angle's range is $[-\pi,\pi)$ radians, the binary encoding encompasses this range and no codes are wasted. Hence quantization noise is reduced and the dynamic range of the binary representation is fully utilized. Secondly, as shall now be seen this allows for relatively efficient implementation of $h_M(\cdot)$. Other encodings, such as one's-complement and sign-magnitude encoding can also similarly be used in other embodiments to attain similar efficiencies; such alternative encodings may or may not linearly encompass substantially all of the possible phases. It is also noted that the position of the LSB (which is the least significant) and MSB (which is the most significant) within the code word, as well as the position of the intermediate bits may depend on the encoding scheme used. Additionally, for convenience the concatenation operation is defined as <x,y> which signifies the concatenation of the binary numbers x and y. For example, <0101,1111> is the binary number 01011111.

To see how it is possible to relatively efficiently implement $h_M(\cdot)$ using the encodings of the exemplary embodiment, note the linear characteristic of $h_M(\cdot)$ at each interval of length $\pi/(2M)$, e.g. for BPSK the intervals which $h_2(\cdot)$ has the same sign and the same slope are $[-\pi, -3\pi/4)$, $[-3\pi/4,-\pi/2)$, $[-\pi/2,-\pi/4)$, $[-\pi/4,0)$, $[0,\pi/4)$, $[\pi/4,\pi/2)$, $[\pi/2,3\pi/4)$, $[3\pi/4,\pi)$, as can be seen in FIG. 2. In each of these intervals the characteristic of $h_M(\cdot)$ is completely linear and has the same sign. This can be exploited by cleverly encoding of the phase angle, for example in two's complement notation, in order to implement $h_M(\cdot)$.

First, the "principal angle" is defined, which is directly proportional to the phase modulo $(\pi/2M)$:

$$\theta_P \equiv \frac{\theta \bmod (\pi/(2M))}{\pi/(2M)} \quad (5)$$

Figure 5:
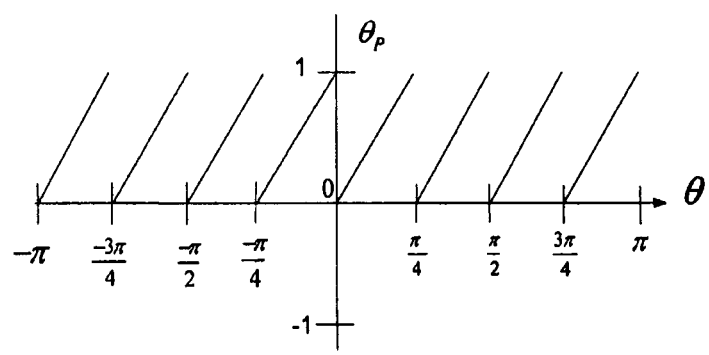
FIG. 5 is a graph showing values of $\theta_P$ vs. $\theta$ for BPSK, according to one embodiment.

For the exemplary embodiment, the proportionality constant is $\pi/(2M)$ in the denominator of (5) and the range of the "mod" (modulo) function is $[0,\pi/(2M))$, and these are chosen such that the value of $\theta_P$ is non-negative and is between 0 and 1, i.e. $\theta_P \in [0,1)$. That is, the infimum of $\theta_P$ is 0 and the supremum of $\theta_P$ is 1. For example, for BPSK, the graph of $\theta_P$ is shown in FIG. 5.

To illustrate this method, it is discussed below how $h_2(\theta)$ and $h_4(\theta)$ can be efficiently implemented for BPSK and QPSK, respectively. Tables 1 and 2 are respectively of $h_2(\theta)$ as a function of $\theta_P$ and $h_4(\theta)$ as a function of $\theta_P$, according to the present exemplary embodiment.

TABLE 1

Value of $h_2(\theta)$ as a function of $\theta_P$

| Angular Interval for input variable θ | Value of $h_2(\theta)$ as a function of $\theta_P$ | $\theta_P$ Multiplier | Addition to $\theta_P$ or $-\theta_P$ | θ[b − 1] | θ[b − 2] | θ[b − 3] |
|---|---|---|---|---|---|---|
| [−π, −3π/4) | $1 - \theta_P$ | −1 | 1 | 1 | 0 | 0 |
| [−3π/4, −π/2) | $-\theta_P$ | −1 | 0 | 1 | 0 | 1 |
| [−π/2, −π/4) | $-1 + \theta_P$ | 1 | −1 | 1 | 1 | 0 |
| [−π/4, 0) | $\theta_P$ | 1 | 0 | 1 | 1 | 1 |
| [0, π/4) | $1 - \theta_P$ | −1 | 1 | 0 | 0 | 0 |
| [π/4, π/2) | $-\theta_P$ | −1 | 0 | 0 | 0 | 1 |
| [π/2, 3π/4) | $-1 + \theta_P$ | 1 | −1 | 0 | 1 | 0 |
| [3π/4, π) | $\theta_P$ | 1 | 0 | 0 | 1 | 1 |

TABLE 2

Value of $h_4(\theta)$ as a function of $\theta_P$

| Angular Interval | Value of $h_4(\theta)$ as a function of $\theta_P$ | $\theta_P$ Multiplier | Addition to $\theta_P$ or $-\theta_P$ | θ[b − 1] | θ[b − 2] | θ[b − 3] | θ[b − 4] |
|---|---|---|---|---|---|---|---|
| [−π, −7π/8) | $1 - \theta_P$ | −1 | 1 | 1 | 0 | 0 | 0 |
| [−7π/8, −3π/4) | $-\theta_P$ | −1 | 0 | 1 | 0 | 0 | 1 |
| [−3π/4, −5π/8) | $-1 + \theta_P$ | 1 | −1 | 1 | 0 | 1 | 0 |
| [−5π/8, −π/2) | $\theta_P$ | 1 | 0 | 1 | 0 | 1 | 1 |
| [−π/2, −3π/8) | $1 - \theta_P$ | −1 | 1 | 1 | 1 | 0 | 0 |
| [−3π/8, −π/4) | $-\theta_P$ | −1 | 0 | 1 | 1 | 0 | 1 |
| [−π/4, π/8) | $-1 + \theta_P$ | 1 | −1 | 1 | 1 | 1 | 0 |
| [π/8, 0) | $\theta_P$ | 1 | 0 | 1 | 1 | 1 | 1 |
| [0, π/8) | $1 - \theta_P$ | −1 | 1 | 0 | 0 | 0 | 0 |
| [π/8, π/4) | $-\theta_P$ | −1 | 0 | 0 | 0 | 0 | 1 |
| [π/4, 3π/8) | $-1 + \theta_P$ | 1 | −1 | 0 | 0 | 1 | 0 |
| [3π/8, π/2) | $\theta_P$ | 1 | 0 | 0 | 0 | 1 | 1 |
| [π/2, 5π/8) | $1 - \theta_P$ | −1 | 1 | 0 | 1 | 0 | 0 |
| [5π/8, 3π/4) | $-\theta_P$ | −1 | 0 | 0 | 1 | 0 | 1 |
| [3π/4, 7π/8) | $-1 + \theta_P$ | 1 | −1 | 0 | 1 | 1 | 0 |
| [7π/8, π) | $\theta_P$ | 1 | 0 | 0 | 1 | 1 | 1 |

Similar tables can be constructed for other values of M and other modulations.

Reviewing Tables 1 and 2, it can be determined how to relatively efficiently implement the base functions in hardware. For a relatively compact implementation for the exemplary embodiment, note that in two's complement notation of b bits, up to an inaccuracy of the LSB (Least Significant Bit), in order to compute $h_M(\theta)$ (again, assuming the MSB (Most Significant Bit) is the bit with of index b-1 and the LSB is the bit of index 0):

1. $\theta_P$ is the signed binary two's complement number <0,θ[b-3-log$_2$ M:0]> (concatenation of "0" and θ[b-3-log$_2$ M:0]), where it is understood that in the numerical encoding convention chosen by the designer the range of $\theta_P$ is [0,1) (or as close to that range as can be expressed by the resolution of the quantization of $\theta_P$).
2. $\theta_P$ is either inverted or not, according to the bit θ[b-1-log$_2$ M], for example as seen in Table 1 and Table 2.
3. Either 1 or −1 or 0 (or as close to those values as can be expressed by the resolution of the quantization) is added to $\theta_P$ or its inverse, as determined in step 2, according to bits θ[b-log$_2$ M−1:b-log$_2$ M−2], for example as seen in Table 1 and Table 2.

In this way, multiplications and any other complicated operations can be avoided, and lookup tables do not need to be used. The only operations are performed using elementary gates, multiplexers, and additions. Moreover, the overhead for generating $h_M(\theta)$ for multiple modulations is quite minimal, since no new computation of $\phi_n$ 415 is necessary for each additional modulation.

Figure 6:
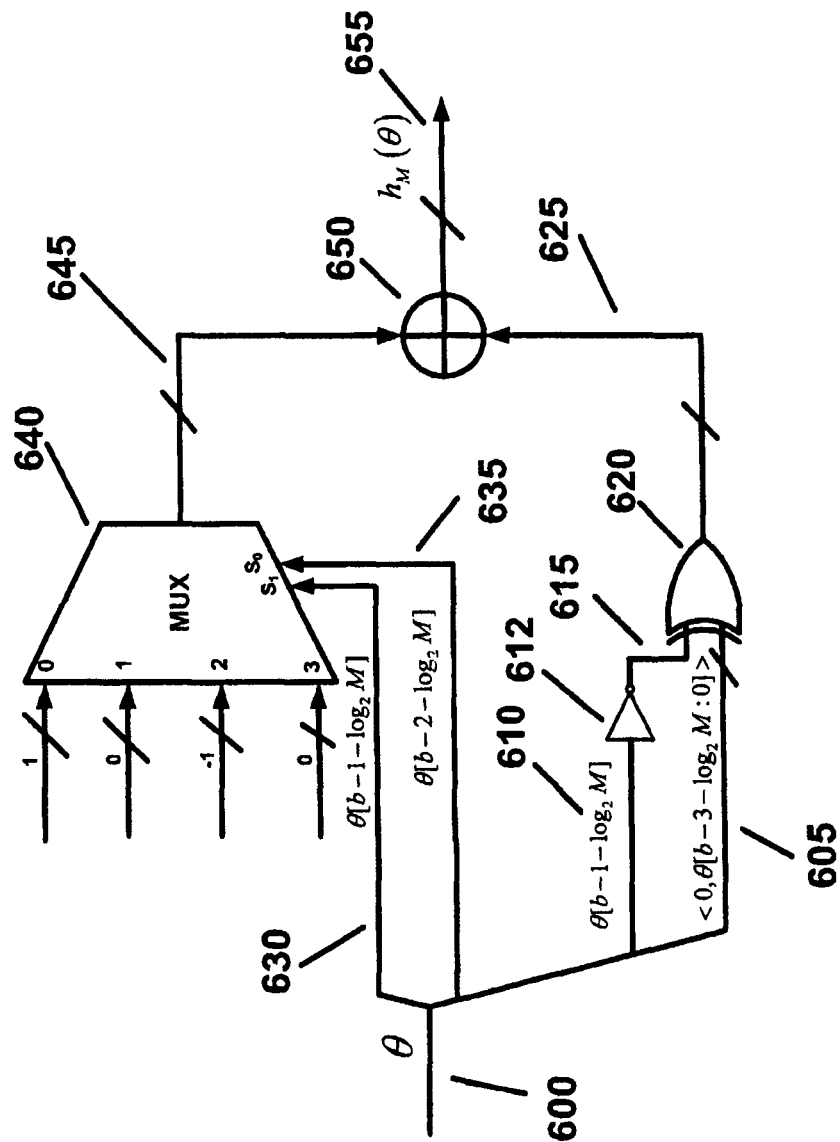
FIG. 6 is a schematic of one embodiment of a metric generator used to implement one embodiment of the base function, $h_M(\theta)$.

A relatively efficient implementation for computation of $h_M(\theta)$ for an exemplary embodiment is shown in FIG. 6. From the input variable θ 600, which is in the exemplary embodiment expressed as a two's binary fixed point notation and which may be, for example, the received phase $\phi_n$ 415, the bits θ[b-log$_2$ M−1:b-log$_2$ M−2] 630, 635, are used to control the selection input of data selection hardware such as a multiplexer 640. The output 645 of that multiplexer 640 contains the constant 1, −1, or 0 that is added to $\theta_P$ or $-\theta_P$ in order to form $h_M(\theta)$, as shown in Table 1 and Table 2 above. The value of $\theta_P$ or $-\theta_P$, as used to form $h_M(\theta)$, is generated by doing a controlled inversion using inverting hardware, which in the exemplary embodiment involves XOR-ing (i.e. doing a bitwise exclusive OR) between the bits of $\theta_P$, which is composed of bits <0,θ[b-3-log$_2$ M:0]> (concatenation of "0" and θ[b-3-log$_2$ M:0]) 605 and the NOT 615 (obtained via negating hardware such as a NOT gate 612) of the bit e[b-1-log$_2$ M] 610. This is done via XOR gates between each of the bits of <0,θ[b-3-log$_2$ M:0]> and the NOT 615 of the bit θ[b-1-log$_2$ M] 610, which is represented by a single XOR symbol 620 (but which reflects the aforementioned bitwise XOR). The output 655 of the hardware of FIG. 6, which is the value of $h_M(\theta)$, is generated by summing the output 645 of the multiplexer 640 and the output 625 of the XOR gates using adding hardware such as an adder 650. This summation complies with the rules for summation of signals, as appropriate for the chosen representation (two's complement in the exemplary embodiment).

Strictly speaking, obtaining the negative of a number in two's complement notation, i.e. obtaining −x for a number x, is performed via (~x)+1, where "~" represents bitwise inversion. The procedure described above may be modified to take this into account in alternative embodiments. Due to the asymmetric nature of two's complement encoding (i.e. that there is one more negative value than there are positive values) in many systems (especially signal-processing structures that are based on averaging, as is done here) −x is calculated simply as (~x) in order to avoid potential overflow problems and in order to simplify logic. This is the procedure adopted for the various exemplary embodiments for two's complement representation.

As mentioned above, this implementation of $h_M(\cdot)$ is the one that is used in order to compute $h_M(\phi_n)$), where $\phi_n$ 415 is the input to that function block as used in the exemplary embodiment, as shown in FIG. 4. The angle ω, is encoded in the same manner as was previously discussed for θ.

A SystemVerilog implementation of $h_M(\cdot)$ for BPSK, QPSK, 8-PSK and 16-PSK which requires no multiplications or other complicated operations, nor any significantly sized lookup table, is shown in FIG. 7. The input to the function calculate_triangular_LD_metric is the input "theta", in two's complement notation. The values of $h_M(\cdot)$ are in the output array All_LD_values[num_modulations-1:0], also in two's complement notation (encoding format is (width bits, from MSB to LSB): 1 sign bit, 1 whole bit, fraction bits). If only one value of $h_M(\cdot)$ is needed, it can be chosen to appear at the output LD_value (format is (width bits, from MSB to LSB): 1 sign bit, fraction bits), and the selection is controlled by the value of the input log 2M_minus_1 (which is 0 for M=2, 1 for M=4, 2 for M=8, 3 for M=16).

Although in the exemplary embodiment a two's complement notation is used, other numerical representations can be used, including but not limited to one or more of floating point and other fixed point or variable point notations, and non-binary encodings.

Implementation of $h_M(\cdot)$ for Alternative Embodiments

In general, for alternative embodiments, the proportionality constant and modulo function range are chosen so that $\theta_P$ is between 0 and A (i.e. $\theta_P \in [0,A)$), where A is the absolute value of the maximum of the base function $h_M(\cdot)$ and the base function has no DC offset. That is, the infimum of $\theta_P$ is 0 and the supremum of $\theta_P$ is A. The normalization in such cases is $$\theta_P \equiv A \cdot \frac{\theta \bmod (\pi/(2M))}{\pi/(2M)}.$$

For example, for BPSK:

TABLE 3

Value of $h_2(\theta)$ as a function of $\theta_P$ for alternative embodiment where the maximum value of $h_2(\theta)$ is A

| Angular Interval for input variable θ | Value of $h_2(\theta)$ as a function of $\theta_P$ | $\theta_P$ Multiplier | Addition to $\theta_P$ or $-\theta_P$ | θ[b − 1] | θ[b − 2] | θ[b − 3] |
|---|---|---|---|---|---|---|
| [−π, −3π/4) | A − $\theta_P$ | −1 | A | 1 | 0 | 0 |
| [−3π/4, −π/2) | −$\theta_P$ | −1 | 0 | 1 | 0 | 1 |
| [−π/2, −π/4) | −A + $\theta_P$ | 1 | −A | 1 | 1 | 0 |
| [−π/4, 0) | $\theta_P$ | 1 | 0 | 1 | 1 | 1 |
| [0, π/4) | A − $\theta_P$ | −1 | A | 0 | 0 | 0 |
| [π/4, π/2) | −$\theta_P$ | −1 | 0 | 0 | 0 | 1 |
| [π/2, 3π/4) | −A + $\theta_P$ | 1 | −A | 0 | 1 | 0 |
| [3π/4, π) | $\theta_P$ | 1 | 0 | 0 | 1 | 1 |

Similar tables can be constructed for other values of M and other modulations. These tables allow us to reach a relatively very compact implementation, as follows.

For a relatively compact implementation for the exemplary embodiment, note that, in two's complement notation of b bits, up to an inaccuracy of the LSB (Least Significant Bit), in order to compute the lock detector (again, assuming the MSB (Most Significant Bit) is the bit with of index b-1 and the LSB is the bit of index 0):

1. $\theta_P$ is B multiplied by a signed binary two's complement number <0,θ[b-3-$\log_2$ M:0]> (concatenation of "0" and θ[b-3-$\log_2$ M:0]), where B is a proportionality constant such that the range of $\theta_P$ is [0, A) according to the numerical encoding convention chosen by the designer (or as close to that range as can be expressed by the resolution of the quantization of $\theta_P$)).
2. $\theta_P$ is either inverted or not, according to the bit θ[b-1-$\log_2$ M], for example as seen in Table 3.
3. Either A or −A or 0 (or as close to those values as can be expressed by the resolution of the quantization) is added to $\theta_P$ or its inverse, as determined in step 2, according to bits θ[b-$\log_2$ M-1:b-$\log_2$ M-2], for example as seen in Table 3.

Also, for convenience, the "principal angle precursor" is defined as <0,θ[b-3-$\log_2$ M:0]> for two's complement notation. In this case, it is clear from the above definitions that $\theta_P$ is B multiplied by the Principal Angle Precursor. In embodiments in which B equals one and the principal angle precursor is accordingly not amplified, the principal angle precursor and the principle angle are equal, as is the case for the embodiment described in relation to Tables 1 and 2, above. "Amplification" in the context of this disclosure does not necessarily mean that the amplitude increases; "amplification" by B in the context of this disclosure could also mean a reduction in amplitude (if B is less than 1) or no change in amplitude (if B equals 1).

Figure 28:
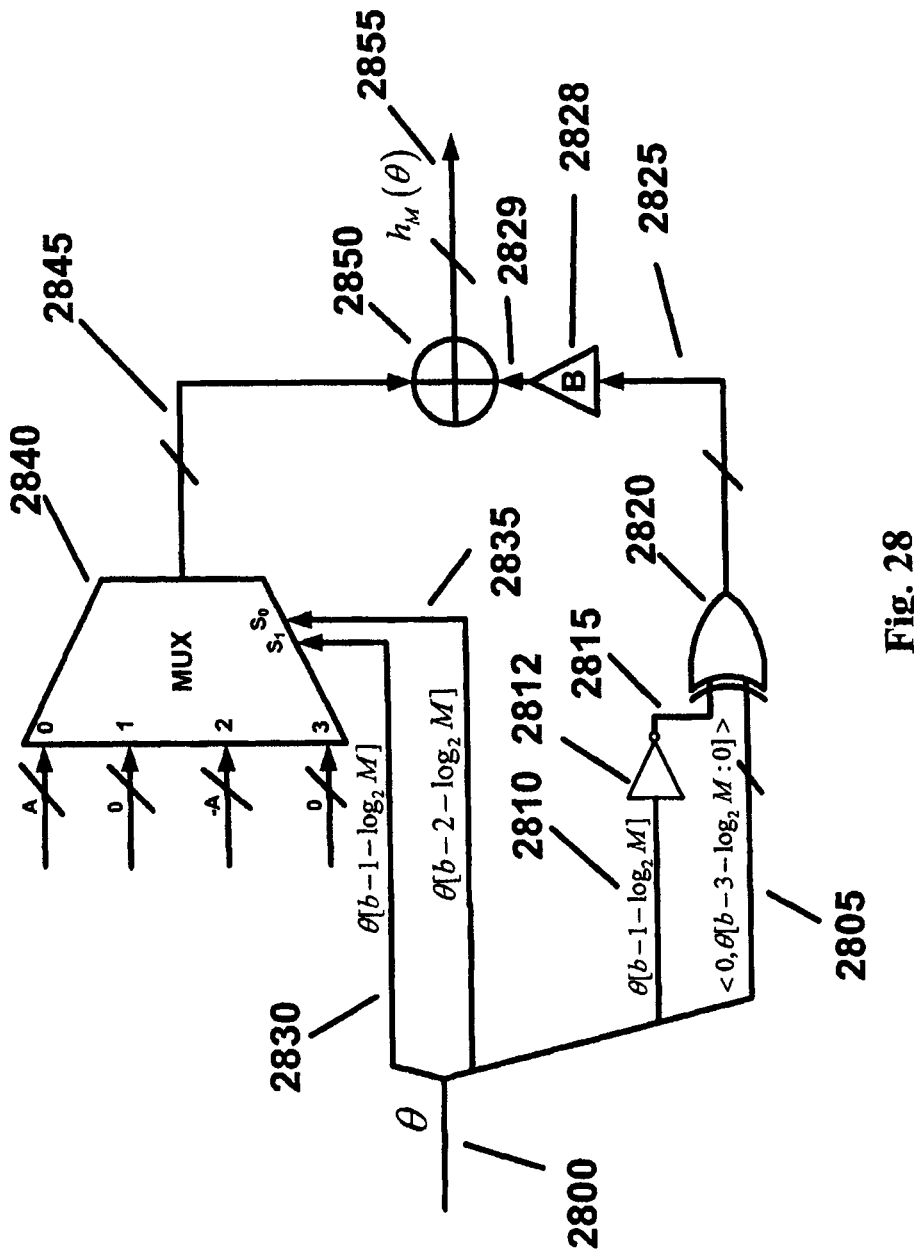
FIG. 28 is a schematic of one embodiment of the metric generator used to implement one embodiment of the base function, $h_M(\theta)$.

A relatively efficient implementation for computation of $h_M(\theta)$ for such embodiments is shown in FIG. 28. From the input variable θ 2800, which is in the exemplary embodiment expressed as a two's binary fixed point notation, the bits θ[b-$\log_2$ M-1:b-$\log_2$ M-2] 2830, 2835, are used to control the selection input of data selection hardware such as a multiplexer 2840. The output of that multiplexer 2845 contains the constant A, −A, or 0 that is added to $\theta_P$ or −$\theta_P$ in order to form $h_M(\theta)$, as shown in Table 3 and as discussed above. The value of $\theta_P$ or −$\theta_P$, as appropriate in order to evaluate $h_M(\theta)$ is generated by first performing a controlled inversion using inverting hardware; in the depicted embodiment, this is done by XOR-ing (i.e. doing a bitwise exclusive OR) between bits <0,θ[b-3-$\log_2$ M:0]> (concatenation of "0" and θ[b-3-$\log_2$ M:0]) 2805 and the NOT 2815 (obtained via negating hardware such as a NOT gate 2812) of the bit θ[b-1-$\log_2$ M] 2810 (this is done via XOR gates between each of the bits of <0,θ[b-3-$\log_2$ M:0]> and the NOT 2815 of the bit θ[b-1-$\log_2$ M] 2810, which is represented by a single XOR symbol 2820 (but which, it is made clear, reflects the aforementioned bitwise XOR)) and then amplifying the result 2825 of this controlled inversion via an amplification device 2828 having amplification constant B, such as a multiplier or a bit shifter, configured to normalize the principal angle and its inverse, as output by the inverting hardware, to have a supremum of A according to the numerical encoding convention chosen by the designer. The value of $h_M(\theta)$ 2855 is generated by the summation 2850 of the output of the multiplexer 2845 and the output of the output 2829 of the amplification device 2828 using adding hardware such as an adder 2850. This summation complies with all the rules for summation of signals, as appropriate for the chosen representation (for example two's complement in the exemplary embodiment). In the case that the signal at the output of the controlled inversion 2825 already has a supremum of A according to the numerical encoding convention chosen by the designer, then the amplification device 2828 may be omitted, that is, the output of the controlled inversion 2825 can be connected directly to the adding hardware 2850.

In alternative embodiments, everywhere that in the various exemplary embodiments the bits θ[b-3-log₂ M:0] are used, it is possible to use a plurality of the most significant bits of those bits, for example θ[b-3-log₂ M:0] (all the most significant bits of θ[b-3-log₂ M:0], as is done in the exemplary embodiments), or θ[b-3-log₂ M:1] (all the most significant bits of θ[b-3-log₂ M:0] except the LSB), or θ[b-3-log₂ M:2] (all the most significant bits of θ[b-3-log₂ M:0] except the two least significant bits), etc. In an embodiment that differs from the exemplary embodiment wherein not all the most significant bits of θ[b-3-log₂ M:0] are used, appropriate modifications are made to other parts of the receiver to accommodate the number of bits used. Such embodiments may be useful when a further reduction in resources is desired; however, such embodiments may be more susceptible to quantization noise.

Implementation of the Averager

Figure 24:
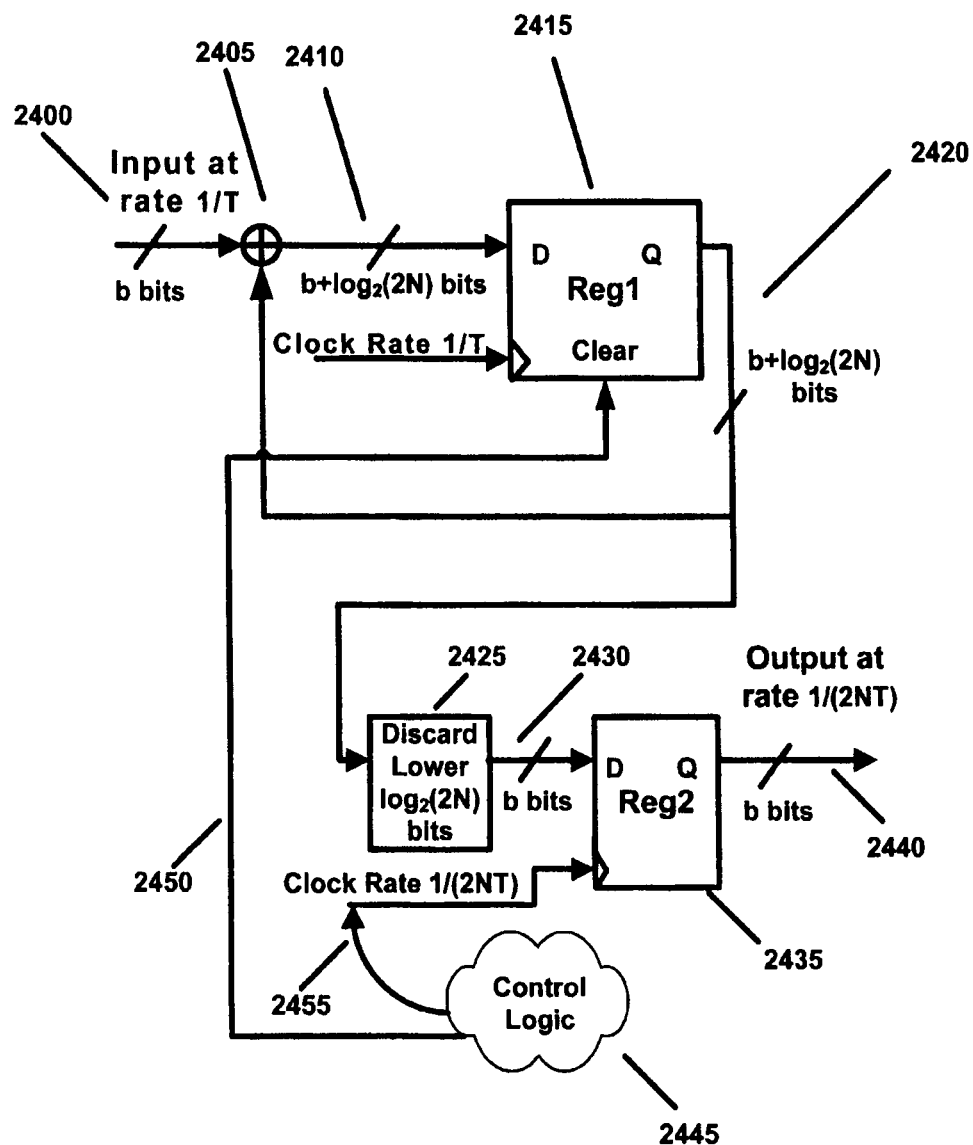
FIG. 24 is a schematic showing a hardware implementation of an averager in the form of an integrate and dump (IAD) module, according to one embodiment.

The output 422 of the metric generator 420 is averaged by an averager 425 in order to compute $q_{M,N}$ 430 to obtain an estimate of the expectation $E[h_M(\phi_n)]$, as noted earlier. In the exemplary embodiment, this is done using the IAD (Integrate and Dump) method. A possible implementation for the averager 425 is shown in FIG. 24, which is now discussed.

The IAD implementation for fixed-point logic, such as two's complement binary notation in the exemplary embodiment, is relatively efficient. In a hardware implementation as shown in FIG. 24, this is evidenced by the fact that only two registers 2415, 2435 and one adder 2405 are used, as well as some simple control logic. It is also advantageous in the sense that the bit width of the output 2440 is not larger than the bit width of the input 2400, that is both are b bits wide. The IAD works as follows. The data at the input 2400 is summed via the adder 2405. This accumulation, over 2N input data values (this is the "Integrate" operation), is updated for each new input data in the accumulation register 2415. Every 2N data samples, the value of the accumulation, after having discarded the log₂(2N) LSBs at block 2425 (which approximates the division by 2N in (4)), is stored in the output register 2435 (this is the "Dump" operation). The output 2440 is simply the value of the output register 2435. After the value of the output register 2435 has been updated, the value of the accumulator register 2415 is cleared via the "Clear" control signal 2450 that is emitted by the Control Logic 2445. This control logic 2445 also controls the clock 2455 of the output register 2435 so that the "Dump" operation occurs at the correct time, i.e. after each batch of 2N samples has been accumulated. For the IAD module of FIG. 24 to be accurate, it is assumed that N is a nonnegative integer power of two, so that log₂(2N) is a positive integer, so that the number of bits that is discarded is an accurate approximation of the division by 2N. If the N that is desired is not a nonnegative integer power of 2, then it is possible to use the closest nonnegative integer power of 2 that is larger than N, in order to comply with this condition (that 2N be a positive integer power of 2) and also achieve at least the accuracy that would have been achieved with the desired N (if a higher value for N than the desired N is used, this will provide greater accuracy, i.e. will not hurt system performance except via increased latency). For example, if the desired N is 1000, then the value of N=1024 (where 1024=2¹⁰) would be used instead. If N is not a nonnegative integer power of two, and the value of the closest nonnegative integer power of 2 that is larger than N is too large for the desired application, then a different averager structure may be used, or an division by 2N may be inserted in place of block 2425.

Many variations of this structure are possible, implemented in hardware, software, a combination of these, or via other means, and may be used in other embodiments. For example, averagers that are not IAD in nature can also be used in alternative embodiments. The structure presented here is an example used in a exemplary embodiment and should not be construed as limiting.

Calculation of $\bar{h}_M(\phi_n)$ for M-PSK in the Exemplary Embodiment $\bar{h}_M(\phi_n)$ can be determined from the S-curve function $L_M(\chi, \theta_e) = E[h_M(\phi_n)|\chi, \theta_e, \Delta\omega=0]$. To do this, the function $h_M(\theta)$ is first written as its equivalent Fourier series representation:

$$h_M(\theta) = \frac{8}{\pi^2} \sum_{k=0}^{\infty} \frac{\cos(M \cdot (2k+1)\theta)}{(2k+1)^2} \quad (6)$$

Substituting this into the expression for the S-curve results in (7) (note the implicit dependence upon $\chi$ via the dependence of $\phi_n$ upon $\chi$):

$$L_M(\chi, \theta_e) = E\left[\frac{8}{\pi^2} \sum_{k=0}^{\infty} \frac{\cos(M \cdot (2k+1)\varphi_n)}{(2k+1)} \bigg| \theta_e\right] \quad (7)$$

which is:

$$L_M(\chi, \theta_e) = E\left[\frac{8}{\pi^2} \sum_{k=0}^{\infty} \frac{\cos(M \cdot (2k+1)(\Delta\phi_n + \theta_e))}{(2k+1)^2} \bigg| \theta_e\right] \quad (8)$$

$$= E\left[\frac{8}{\pi^2} \sum_{k=0}^{\infty} \left(\frac{\cos(M \cdot (2k+1)\Delta\phi_0)\cos(M \cdot (2k+1)\theta_e) - \sin(M \cdot (2k+1)\Delta\phi_n)\sin(M \cdot (2k+1)\theta_e)}{(2k+1)^2}\right) \bigg| \theta_e\right]$$

$$= \frac{8}{\pi^2} \sum_{k=0}^{\infty} \left(\frac{E[\cos(M \cdot (2k+1)\Delta\phi_n)]\cos(M \cdot (2k+1)\theta_e) - E[\sin(M \cdot (2k+1)\Delta\phi_n)]\sin(M \cdot (2k+1)\theta_e)}{(2k+1)^2}\right)$$

$$= \frac{8}{\pi^2} \sum_{k=0}^{\infty} \left(\frac{E[\cos(M \cdot (2k+1)\Delta\phi_n)]\cos(M \cdot (2k+1)\theta_e)}{(2k+1)^2}\right)$$

$$= \frac{8}{\pi^2} \sum_{k=0}^{\infty} \left(\left(\frac{\sqrt{\pi \cdot \chi}}{2} \cdot \exp\left(\frac{-\chi}{2}\right)\left[\begin{array}{c} I_{((2k+1)M-1)/2}\left(\frac{\chi}{2}\right) + \\ I_{((2k+1)M+1)/2}\left(\frac{\chi}{2}\right) \end{array}\right]\right) \bigg/ (2k+1)^2\right)$$

$$\cos(M \cdot (2k+1)\theta_e)$$

where $I_n(\cdot)$ is the n-th order modified Bessel function of the first kind. The expected value of the base function when perfectly locked is:

$$\bar{h}_M(\chi) = L_M(\chi, 0) = \quad (9)$$

$$\frac{8}{\pi^2} \sum_{k=0}^{\infty} \left(\left(\frac{\sqrt{\pi \cdot \chi}}{2} \cdot \exp\left(\frac{-\chi}{2}\right)\left[\begin{array}{c} I_{((2k+1)M-1)/2}\left(\frac{\chi}{2}\right) + \\ I_{((2k+1)M+1)/2}\left(\frac{\chi}{2}\right) \end{array}\right]\right) \bigg/ (2k+1)^2\right)$$

As an approximation, also note that:

$$\frac{\sqrt{\pi \cdot \chi}}{2} \cdot \exp\left(\frac{-\chi}{2}\right) \begin{bmatrix} I_{((2k+1)M-1)/2}\left(\frac{\chi}{2}\right) + \\ I_{((2k+1)M+1)/2}\left(\frac{\chi}{2}\right) \end{bmatrix} \xrightarrow{\text{high SNR}} \exp\left(\frac{-(2k+1)^2 M^2}{4\chi}\right) \quad (10)$$

and $$\bar{h}_M(\chi) \xrightarrow{\text{high SNR}} \frac{8}{\pi^2} \sum_{k=0}^{\infty} \left( \exp\left(\frac{-(2k+1)^2 M^2}{4\chi}\right) \Big/ (2k+1)^2 \right) \quad (11)$$

(11) is useful for calculations at high SNR, since in some numerical program such as Matlab™ the calculation of Bessel functions is sometimes not sufficiently accurate at high SNRs.

Figure 8:
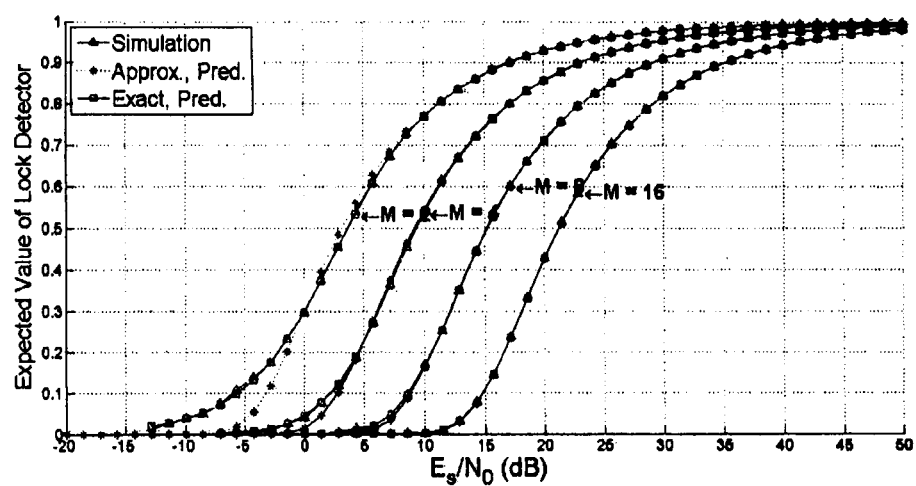
FIG. 8 is a graph of the expected values of several base functions vs. SNR when the carrier is locked, i.e. $\bar{h}_M(\chi) \equiv E[h_M(\phi_n)|\chi,$ carrier loop is locked] vs. $\chi$, for several M-PSK modulations, according to one or more embodiments. Curves showing simulated (with N=8192), exact (predicted, calculated), and approximate (predicted, calculated) values are shown.

A graph of the expected value of the base function $\bar{h}_M(\chi) \equiv E[h_M(\phi_n)|\chi$, carrier loop is locked] is shown in FIG. 8 for M-PSK for M=2, M=4, M=8, and M=16. The "Exact" value is the one in (9), while the "Approximate" value is that of (11). When unlocked, $E[h_M(\phi_n)|\chi$, carrier loop is unlocked]=0. Thus, comparing the output 430 of the averager 425 to a lock indicator detection threshold 432, a lock indication 445 is achieved, which indicates that the local carrier is locked to the received carrier. Thus, for the exemplary embodiment, if $q_{M,N}$ 430 is compared using a comparator 435 to a threshold between 0 and 1, the lock indication 445 results. The lock detection threshold 432 should be chosen, for example, in order to have the lock detection probability be relatively high compared to the false alarm probability. For example, a threshold value of 0.07 and N=2048 have been shown to work well in practice in the exemplary embodiment. Other combinations of thresholds and N are possible (including different thresholds and values of N for different modulations) and may result in different detection and false alarm probabilities and different latencies. These may be determined for alternative embodiments via any one or more of trial and error, simulation, and calculation and other suitable means.

Determination of Threshold and of N for Lock Detection

The following describes one exemplary method for determining the lock indicator detection threshold 432 and N. Alternative embodiments are possible.

For notational convenience, the lock indicator detection threshold 432 is denoted as $\Gamma$, and the standard deviation of $q_{M,N}$ is denoted as $\sigma = \sqrt{1/(2N)}$ (which is actually an upper bound on the standard deviation of the estimator $q_{M,N}$). In general, using the fact that $$q_{M,N} \xrightarrow{N \to \infty} E[h_M(\phi_n)],$$

and the fact that that due to the Central Limit Theorem $q_{M,N}$ is Gaussian for large N, the detection probability, that is the probability that the estimator $q_{M,N}$ passes the lock indicator detection threshold $\Gamma$ when indeed the receiver is perfectly locked, is:

$$P_D \equiv P(q_{M,N} > \Gamma \mid \text{The receiver is perfectly locked}) \geq \quad (12)$$

$$\int_{\Gamma}^{\infty} \frac{1}{\sigma \sqrt{2\pi}} \exp\left(\frac{-(y - \bar{h}_M(\chi))^2}{2\sigma^2}\right) dy =$$

-continued $$Q\left(\frac{\Gamma - \bar{h}_M(\chi)}{\sigma}\right) = \frac{1}{2} \text{erfc}\left(\frac{\Gamma - \bar{h}_M(\chi)}{\sigma \sqrt{2}}\right)$$

where $\text{erfc}(x) = \frac{2}{\sqrt{\pi}} \int_x^{\infty} e^{-y^2} dy$ and $Q(x) = \frac{1}{\sqrt{2\pi}} \int_x^{\infty} e^{-y^2/2} dy$, and the "≥" sign is due to the fact that an upper bound is being used on the standard deviation $\sigma$.

Conversely, when the receiver is not locked and only noise is present at the inputs, the probability of false alarm, that is, the probability that the lock detector will indicate lock when none is present, is calculated as:

$$P_{FA} \equiv P(q_{M,N} > \Gamma \mid \text{receiver is unlocked with noise at input}) \leq \quad (13)$$

$$\int_{\Gamma}^{\infty} \frac{1}{\sigma \sqrt{2\pi}} \exp\left(\frac{-y^2}{2\sigma^2}\right) dy = Q\left(\frac{\Gamma}{\sigma}\right) = \frac{1}{2} \text{erfc}\left(\frac{\Gamma}{\sigma \sqrt{2}}\right)$$

Equations (12) and (13) are nonlinear inequalities. In order to find suitable values for $\Gamma$ and N, (12) and (13) are treated as equalities. This will result in conservative (i.e. somewhat larger than necessary) values of N, which will consequently result in the system's performance in terms of the probability of a false alarm ($P_{FA}$) and the probability of detection ($P_D$) as being more than acceptable. Assuming for the exemplary embodiment that N is a constant, and that $\chi = \chi_{M,min}$ is the minimum SNR which interests us for the particular modulation (for example, $\chi_{M,min}$ could be the minimum SNR in which the receiver is expected to achieve lock for a given M), then the values of N for acceptable $P_{FA}$ and $P_D$ for $\chi < \chi_{M,min}$ are in general lower than the value computed for $\chi = \chi_{M,min}$ (since the SNR is larger, and hence there is less variance of the estimator $q_{M,N}$), and hence the value of N computed for $\chi = \chi_{M,min}$ would be a conservative (and, hence, appropriate) value for N for $\chi > \chi_{M,min}$. Hence, treating (12) and (13) as equalities, and substituting $\sigma = \sqrt{1/(2N)}$ and $\chi = \chi_{M,min}$, there is from (12):

$$\sqrt{N}(\Gamma - \bar{h}_M(\chi_{M,min})) = \text{erfc}^{-1}(2P_D) \quad (14)$$

and from (13):

$$\Gamma = \frac{\text{erfc}^{-1}(2P_{FA})}{\sqrt{N}} \quad (15)$$

Substitution of (15) into (14) results in:

$$\sqrt{N} \left( \frac{\text{erfc}^{-1}(2P_{FA})}{\sqrt{N}} - \bar{h}_M(\chi_{M,min}) \right) = \text{erfc}^{-1}(2P_D) \quad (16)$$

from which it follows that:

$$N = \left( \frac{\text{erfc}^{-1}(2P_{FA}) - \text{erfc}^{-1}(2P_D)}{\bar{h}_M(\chi_{M,min})} \right)^2 \quad (17)$$

and substitution of (17) into (15) results in:

$$\Gamma = \frac{\text{erfc}^{-1}(2P_{FA}) \cdot \bar{h}_M(\chi_{M,min})}{\text{erfc}^{-1}(2P_{FA}) - \text{erfc}^{-1}(2P_D)} \quad (18)$$

That is, calculation of Γ and N can be achieved via (17) and (18), given the false alarm and detection probabilities that the system is desired to attain.

In practical systems, $P_D > 0.5$ and $P_{FA} < 0.5$. Hence, $\text{erfc}^{-1}(2P_D) < 0$ and $\text{erfc}^{-1}(2P_{FA}) > 0$. From inspection of (18), this implies $\Gamma \in (0, \bar{h}_M(\chi_{M,min}))$.

Figure 22:
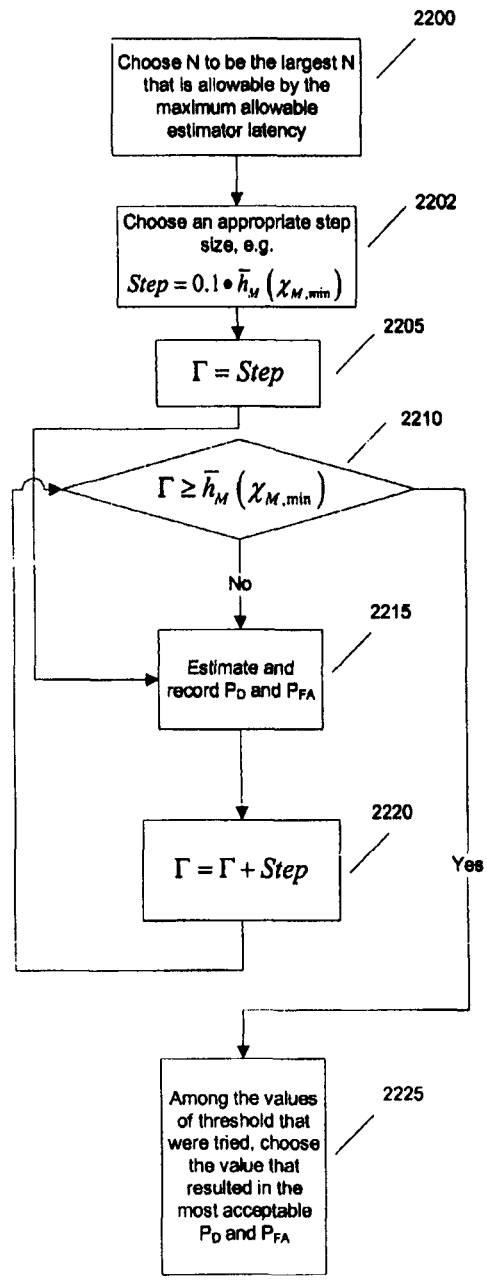
FIG. 22 is a flowchart showing a method, according to one embodiment, for determining: a lock indicator detection threshold, and a number (N) which determines the number (2N) of symbols to analyze for the generation of each metric.

Yet another exemplary method to determine Γ and N, which does not use a priori values of $P_{FA}$ and $P_D$, is shown in FIG. 22. The method is as follows. First, the maximum N as allowed by the maximum allowed estimator latency is chosen at block 2200. In the exemplary embodiment, the estimator latency is dominated by the summing of 2N values as shown in (4), which takes at least 2·N·T seconds. However, in the case that other delays are present, these too are taken into account when calculating the total estimator latency and hence the largest value of N that is allowable in the specific system. That is, N is chosen so that the total estimator latency, including the minimal averager delay related to N which is 2·N·T, is such that it does not exceed the maximum latency that is allowable in the particular system. Since the thresholds are preferably in the range $(0, \bar{h}_M(\chi_{M,min}))$, and since the algorithm is to complete in a finite number of stages, a certain step size is chosen at block 2202. An appropriate step size is such that a sufficient number of values of Γ are tested so that the value ultimately chosen is sufficiently (as determined by the designer) close to the optimum in the interval $(0, \bar{h}_M(\chi_{M,min}))$. For example, in the embodiment shown in FIG. 23 for illustration purposes, the step size is $0.1 \cdot \bar{h}_M(\chi_{M,min})$. Subsequently, a trial value of Γ is assigned to be Γ=Step at block 2205. The detection and false alarm probabilities are then estimated at block 2215, for example in a laboratory or via computer simulation (e.g. by running a statistically sufficient number of trials and noting when a detection and when a false alarm occur, and thus estimating the false alarm and detection probabilities). These values of the false alarm and detection probabilities are noted. Then, Γ is increased by the value of Step at block 2220, and provided that the comparison $\Gamma \geq \bar{h}_M(\chi_{M,min})$ performed at block 2210 is false, this process continues so that all the trial values of Γ in the interval $(0, \bar{h}_M(\chi_{M,min}))$ are tested. Then, the value of Γ which gives the most acceptable detection and false alarm probabilities is chosen at block 2225.

Extension to Handle Constellations with Phases Other than $\phi_n = 2\pi \cdot m_n / M$ with $m_n \in \{0, 1, \ldots, M-1\}$ As noted earlier, alternative embodiments can be made to handle a wide variety of modulations which are not limited to M-PSK or M-PSK-derived modulations. In such cases, M is defined as the total number of distinct phases in the constellation for the modulation. The guiding principle in such an adaptation is that the base function $h_M(\theta)$ has a curve that is triangular in nature, with the maxima of the triangles corresponding to the ideal symbol phases and minima of equal amplitude (assuming no DC offset) but opposite polarity midway between the ideal symbol phases. Retained for convenience is the convention that phases upon which $h_M(\theta)$ operates are defined such that they span the interval $[-\pi, \pi)$. In alternative embodiments, the phases can be defined as residing in any interval of at least length $2\pi$, in which case this entails a corresponding adaptation of the definition of $h_M(\theta)$. In the present embodiment, $h_M(\theta)$ has a maximum of 1 and a minimum of -1. In other embodiments, $h_M(\theta)$ may have a maximum and minimum with different values, such as A for the maximum and -A for the minimum, where "A" is some non-zero value. Additionally, in some embodiments $h_M(\theta)$ may have a DC offset, either inevitable (e.g. due to quantization) or intentional, that is for example the maximum will be A+DC and the minimum will be -A+DC, where "DC" represents the DC offset. However, that excessive DC offsets may cause performance degradations. Alternatively, the output of $h_M(\theta)$ may span any suitable interval, such as any suitable subset of $(-\infty, \infty)$, when implemented for example using software.

Figure 25:
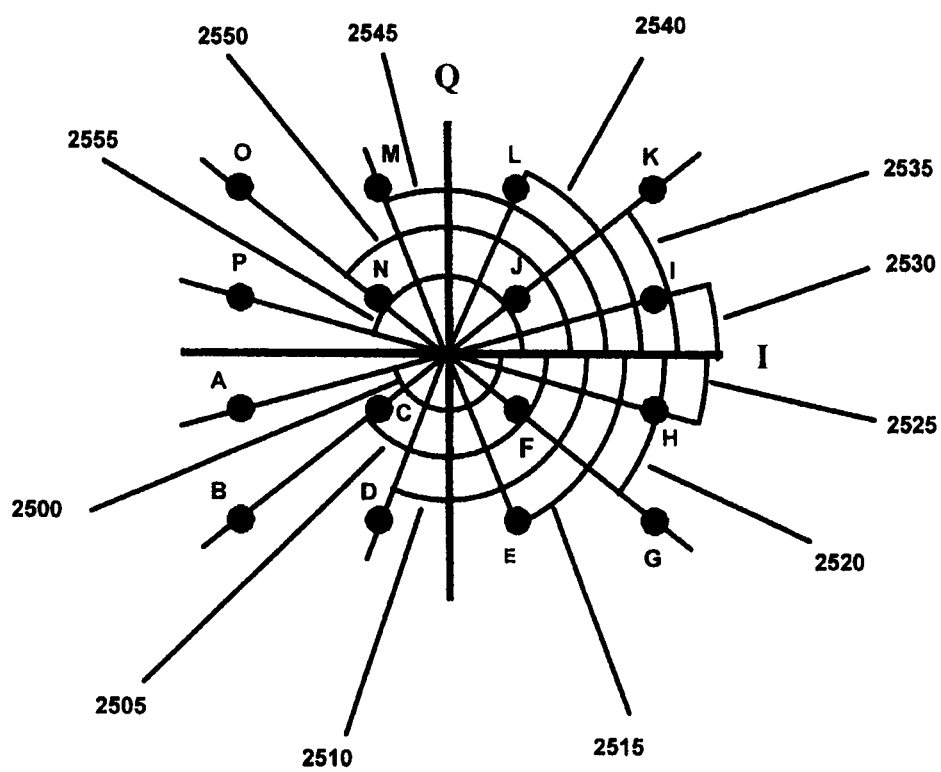
FIG. 25 is an exemplary rectangular QAM-16 constellation diagram.

To exemplify the general process of determining $h_M(\theta)$, in FIG. 25 a Rectangular QAM-16 constellation is shown. Values for the ideal symbol phases are denoted by the depicted arcs. This constellation has 12 phases (in radians): $\phi_0 = -0.8976\pi$ (Symbol A at arc 2500), $\phi_1 = -0.75\pi$ (Symbols B, C at arc 2505), $\phi_2 = -0.6024\pi$ (Symbol D at arc 2510), $\phi_3 = -0.3976\pi$ (Symbol E at arc 2515), $\phi_4 = -0.25\pi$ (Symbols F, G at arc 2520), $\phi_5 = -0.1024\pi$ (Symbol H at arc 2525), $\phi_6 = 0.1024\pi$ (Symbol I at arc 2530), $\phi_7 = 0.25\pi$ (Symbols J, K at arc 2535), $\phi_8 = 0.3976\pi$ (Symbol L at arc 2540), $\phi_9 = 0.6024\pi$ (Symbol M at arc 2545), $\phi_{10} = 0.75\pi$ (Symbols N, O at arc 2550), and $\phi_{11} = 0.8976\pi$ (Symbol P at arc 2555).

Figure 26:
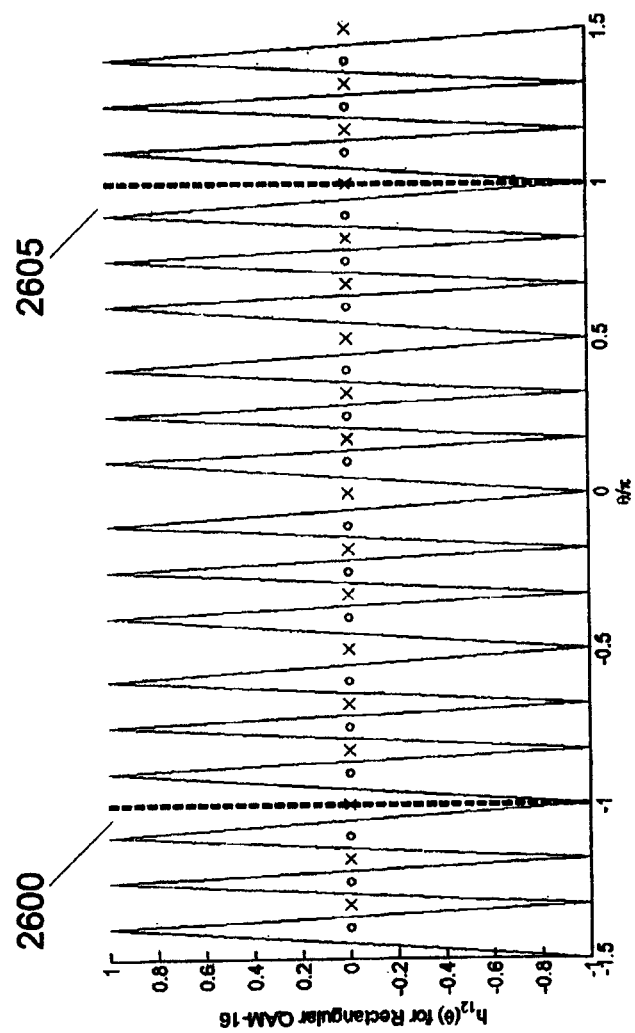
FIG. 26 is a graph showing one embodiment of the base function, $h_{12}(\theta)$, for rectangular QAM-16.

Thus, since there are 12 distinct phases, the M for this case is 12. The graph of the function $h_{12}(\theta)$ for Rectangular QAM-16 is shown in FIG. 26. As can be seen in that graph, the domain of $h_{12}(\theta)$ is $[-\pi, \pi)$, between the two dashed lines 2600, 2605. On the x=0 axis, the "o" markers represent ideal symbol phases and the "x" markers are the points midway between the ideal symbol phases. For the intervals adjacent to the boundaries $-\pi$ and $\pi$, as can be seen in FIG. 26, $h_{12}(\theta)$ is defined by the linking of $h_{12}(\theta)$ in the interval $[-\pi, \pi)$ to its periodic extensions, i.e. for example in the interval from $-\pi$ to $\phi_0 = -0.8976\pi$, $h_{12}(\theta)$ is defined by the line that links the maximum of 1 at $\phi_0 = -0.8976\pi$ and the minimum of -1 at angle $-\pi$ which is midway between $\phi_0 = -0.8976\pi$ and the ideal symbol phase of periodic extension of $h_{12}(\theta)$ at phase $-1.1024\pi$ radians.

The rest of the structures described for lock detection and SNR estimation that involve $h_M(\theta)$ will also work for such a case. However, when evaluating $h_M(\theta)$, the expectations that govern the various calculations, e.g. the definition $h_M(\chi) = E[h_M(\phi_n) | \chi$, carrier loop is locked], are made by taking into account the corresponding modulation type (in order that the symbol statistics and received phase statistics are correct) and by using the correct M for the given modulation (for example, for the case of Rectangular QAM-16 in FIG. 26, this would be M=12).

In the foregoing embodiments, references to the average metric $q_{M,N}$ 430 "surpassing" a "threshold" refers to $q_{M,N}$ 430 being greater than the threshold in embodiments in which the base function used to generate $q_{M,N}$ 430 is such that the ideal symbol phases correspond to the maxima of the base function (as in the exemplary embodiments), and refers to $q_{M,N}$ 430 being less than the threshold in embodiments in which the base function used to generate $q_{M,N}$ 430 is such that the ideal symbol phases correspond to the minima of the base function. As already noted, in alternative embodiments wherein the ideal symbol phases correspond to the minima of the base function, the thresholds will in general be the negative of the thresholds of the corresponding exemplary embodiments, and the expectation of the base function will be in general the negative of the expectation of the base function of the corresponding exemplary embodiments. Appropriate changes are then accordingly made to various components of such embodiments. For example, in an embodiment in which the ideal symbol phases of a modulation correspond to the minima of the base function, $q_{M,N}$ 430 "surpassing" the lock indicator detection threshold 432 may refer to $q_{M,N}$ 430 being −0.5 when the lock indicator detection threshold 432 is −0.1.

Extension to SNR Estimation for D-MPSK and MPSK without Carrier Lock and to Modulation Classifier SNR Estimation For a different type of SNR estimator, it is possible to use the base function $h_M(\cdot)$ or a similarly defined base function, as described below, upon the normalized pseudo-coherently demodulated DMPSK constellation, allowing thus for SNR estimation and modulation classification without prior carrier synchronization.

Defined in this section is another embodiment of the triangle wave base function $h_M^D(\theta) \equiv h_M(\theta)$ for the definitions used in exemplary embodiments above for uniformly distributed phases, and hence the base function $h_M^D(\theta)$ can utilize the same relatively efficient implementations that are possible for $h_M(\theta)$ for uniformly distributed phases, as described above. While the input to $h_M(\theta)$ is the phase of the received baseband symbol itself, the input to $h_M^D(\theta)$ is the phase difference between two of the received baseband symbols. This is true for example for the exemplary embodiment where $\phi_n = 2\pi \cdot m_n/M$ are the ideal symbol phases, with $m_n \in \{0, 1, \ldots, M-1\}$. When the symbol phases are not uniformly distributed, such as in other embodiments, as noted earlier $h_M(\theta)$ will be such that with the maxima of the triangles correspond to the ideal symbol phases, whatever they may be. Analogously, when the ideal symbol phases are not uniformly distributed, $h_M^D(\theta)$ will be the triangle wave function with maxima corresponding to the ideal phase differences, which are defined as the set of all possible phase differences between ideal constellation symbols. As was the case for $h_M(\theta)$, $h_M^D(\theta)$ is defined for all $\theta \in (-\infty, \infty)$, but, since any angle (in radians) is angularly equivalent to itself plus any integer multiple of $2\pi$ (radians), it suffices to implement $h_M^D(\theta)$ for any interval of length of at least $2\pi$. In the exemplary embodiment, the domain of angles upon which $h_M^D(\theta)$ is implemented span the interval $[-\pi, \pi)$ radians. For example, for QPSK in which the ideal phases are selected to be $\phi_0 = \pi/4$, $\phi_1 = 3\pi/4$, $\phi_2 = 5\pi/4$, and $\phi_3 = 7\pi/4$, $h_M(\theta)$ as implemented in the exemplary embodiment for this case will have maxima at the phases $\phi_0 = \pi/4$, $\phi_1 = 3\pi/4$, $\phi_2 = 5\pi/4$, and $\phi_3 = 7\pi/4$ (or, rather, their equivalent phases in the range $[-\pi, \pi)$, which are $\{-3\pi/4, -\pi/4, \pi/4, 3\pi/4\}$) which are the ideal symbol phases, but $h_M^D(\theta)$ will have its maxima located at the ideal phase differences or their equivalent angles as expressed in the range $[-\pi, \pi)$, which are for this example at angles $\{-\pi, -\pi/2, 0, \pi/2\}$. In the foregoing example, the adjacent ideal phase differences are $-\pi$ and $-\pi/2$, $-\pi/2$ and 0, and 0 and $\pi/2$.

In the exemplary embodiment, the phase differences upon which $h_M^D(\theta)$ operates are defined such that they span the interval $[-\pi, \pi)$. In alternative embodiments the phase differences can be defined as residing in any appropriate interval of length of at least $2\pi$, in which case this entails a corresponding adaptation of the implementation of $h_M^D(\theta)$. In the present embodiment, $h_M^D(\theta)$ has a maximum of 1 and a minimum of −1. In other embodiments, $h_M^D(\theta)$ may have a maximum and minimum with different values, such as A for the maximum and −A for the minimum, where "A" is some non-zero value. Additionally, in some embodiments $h_M^D(\theta)$ may have a DC offset, either inevitable (e.g. due to quantization) or intentional, that is for example the maximum will be A+DC and the minimum will be −A+DC, where "DC" represents the DC offset. However, excessive DC offsets may cause performance degradations.

Yet other embodiments may be defined where the minima of $h_M^D(\theta)$ (e.g. with value −A) correspond to the ideal phase differences, and maxima (e.g. with value +A) correspond to the phases midway between the ideal phase differences. In such embodiments, the thresholds and expected values are the negative of those discussed in the exemplary embodiments discussed herein, and other modifications to the embodiments are made as appropriate.

Figure 9:
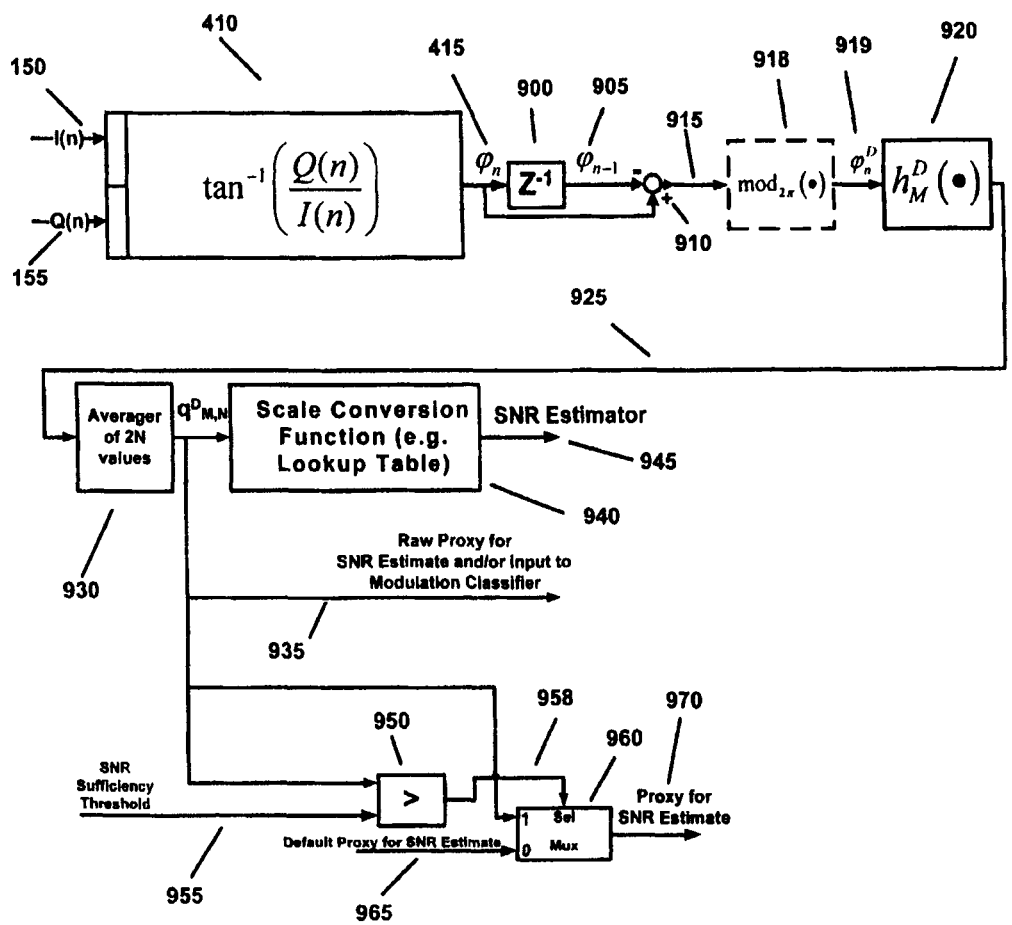
FIG. 9 is a schematic view of the SNR estimator for D-MPSK or M-PSK that can be used without prior carrier synchronization, according to one embodiment.

A possible implementation of the appropriate hardware structure is shown in FIG. 9, which shall now be discussed.

$$v_n \equiv \frac{r_n r_{n-1}^*}{|r_n||r_{n-1}|}$$

is defined as the normalized pseudo-coherently demodulated M-PSK signal. Defined now is $\phi_n^D \equiv (\phi_n - \phi_{n-1}) \mod_{2\pi}$, where the range of the modulo operation is $[-\pi, \pi)$ such that $\phi_n^D \in [-\pi, \pi)$.

Substitutions show that $$v_n = \frac{|r_n|\exp(j\varphi_n)|r_{n-1}|\exp(-j\varphi_{n-1})}{|r_n||r_{n-1}|} = \quad (19)$$

$$\exp(j(\varphi_n - \varphi_{n-1})) = \exp(j((\varphi_n - \varphi_{n-1})\mod_{2\pi})) = \exp(j\varphi_n^D)$$

And accordingly:

$$\varphi_n^D = (\varphi_n - \varphi_{n-1})\mod_{2\pi} = \quad (20)$$

$$(\Delta\phi_n + (-\Delta\omega \cdot nT + \theta_e) - (\Delta\phi_{n-1} + (-\Delta\omega \cdot (n-1)T + \theta_e)))$$

$$\mod_{2\pi} = (\Delta\phi_n - \Delta\phi_{n-1} - \Delta\omega T)\mod_{2\pi}$$

Let $\Delta\phi_n^D \equiv \Delta\phi_n - \Delta\phi_{n-1}$; note that since $\Delta\phi_n, \Delta\phi_{n-1} \in [-\pi, \pi)$ then $\Delta\phi_n^D \in [-2\pi, 2\pi)$. Also let $\bar{h}M^D(\chi) \equiv E[h_M^D(\phi_n^D)|E_S/N_0 = \chi]$ be the expected value of the base function; $\bar{h}_M^D(\chi)$ is determined below. From the definition of $\bar{h}_M^D(\chi)$, SNR estimation in dB can be done via $\chi_{dB} = 10 \log_{10}((\bar{h}_M^D)^{-1}(\bar{h}_M^D(\chi))) = 10 \log_{10}((\bar{h}_M^D)^{-1}(E[h_M^D(\phi_n^D)|E_S/N_0 = \chi]))$. In practice, the expectation operator $E[\cdot]$ is approximated by a time average, as shall be shortly discussed. The function $10 \log_{10}((\bar{h}_M^D)^{-1}(\cdot))$ can be implemented in a structure such as lookup table, as is done in the exemplary embodiment, following for example a similar procedure for finding the inverse of a function as was detailed for finding $10 \log_{10}((\bar{h}_M)^{-1}(\cdot))$, as discussed above.

Referring now to FIG. 9, the received phase $\phi_n$ 415 is obtained via a phase determiner such as a 4-quadrant inverse tangent function 410 from the I(n) 150 and Q(n) 155 samples. The received phase difference 915 between this symbol's received phase $\phi_n$ 415 and the previous symbol's received phase $\phi_{n-1}$ 905 (obtained via the 1/T second delay element 900 which is the exemplary embodiment is simply a register clocked by the same sampling clock with frequency 1/T), is obtained by means of a subtracting device, such as a subtractor 910, in the exemplary embodiment. If the received phase difference 915 is not automatically within the desired range of $[-\pi, \pi)$ then a modulo $2\pi$ operator 918 (for example implemented as a lookup table) is inserted between the subtractor 910 and the metric generator 920 that evaluates $h_M^D(\cdot)$ in order that the input to the metric generator 920 be the phase difference $\phi_n^D$ 919 in the range $[-\pi, \pi)$. The combination of the subtractor 910, the delay element 900 and the modulo $2\pi$ operator 918 is collectively a "phase difference determiner". The phase difference determiner may determine the phase difference between any pair of symbols used to modulate the received carrier. In one embodiment, one of the symbols of the pair immediately follows the other of the symbols of the pair; i.e., one of the symbols is transmitted immediately after the other. In alternative embodiments, the metric generator 920 may be used to evaluate the base function at phase differences determined from pairs of symbols in which one symbol is not the symbol immediately preceding the other but rather any other symbol. That is, it is possible to define in alternative embodiments $\phi_n^D \equiv (\phi_n - \phi_{n-k}) \mod_{2\pi}$ where k is some nonzero integer which may or may not be constant. The implementation is substantially the same except that the delay element 900 corresponds to the delay between those symbols, namely it would be a delay $z^{-k}$, which could be implemented for example as a concatenation of k registers clocked by a clock of frequency 1/T. For causal systems such a k would be positive although non-causal systems do not have such a restriction.

As noted, for SNR estimation and modulation detection purposes the expectation $E[h_M^D(\phi_n^D)]$ is approximated by a time averaging operation over a finite number of samples, as follows:

$$q_{M,N}^D = \frac{1}{2N} \sum_{n=-N+1}^{N} h_M^D(\varphi_n^D) \quad (21)$$

This averaging is done by an averager 930 that can be implemented for example using an Integrate and Dump (IAD) module, as shown in FIG. 24 for the exemplary embodiment and which was discussed above. The output of the averager 930, which for a given SNR $\chi$ is an approximation of the expected value of the base function $\bar{h}_M^D(\chi) \equiv E[h_M^D(\phi_n^D)|E_s/N_0=\chi]$, is denoted $q_{M,N}^D$ 935. It should be noted that in other embodiments other averaging definitions can be used instead of (21); for example the number of samples averaged does not need to be even, nor do the samples need to be defined as between $-N+1$ and N, nor do the set of symbol intervals upon which the average is calculated need to be adjacently successive in time.

As seen in FIG. 9, there is no need to implement the $\mod_{2\pi}$ operation explicitly if the encoding scheme for the phase difference is chosen appropriately. For example, in the exemplary embodiment, when the encoding scheme is two's complement, the modulo operation is done automatically by virtue of the subtraction performed by the subtractor 910. However, if the chosen encoding scheme, as might be the case in other embodiments, is such that a modulo operation is not encompassed by the subtraction operation, then an explicit modulo operation which restricts the range of $\phi_n^D$ to $[-\pi,\pi)$ is inserted between the subtractor 910 and the metric generator 920. This is the modulo $2\pi$ operator 918. Such a modulo operation may be implemented by structures such as a lookup table or by other suitable means. If the numerical notation is such that the modulo operation is done automatically by virtue of the subtractor 910, as is the case in the exemplary embodiment, then the modulo $2\pi$ operator 918 can be bypassed or omitted and the output of the subtractor 910 can be connected directly to the input of the metric generator 920. In some encodings, such as one's complement encoding, the subtraction operation approximates, but does not exactly implement, the modulo $2\pi$ operation. In such an embodiment, the designer may choose to omit the modulo $2\pi$ operation because the inaccuracy incurred by such an omission may be deemed to be acceptable.

Figure 19:
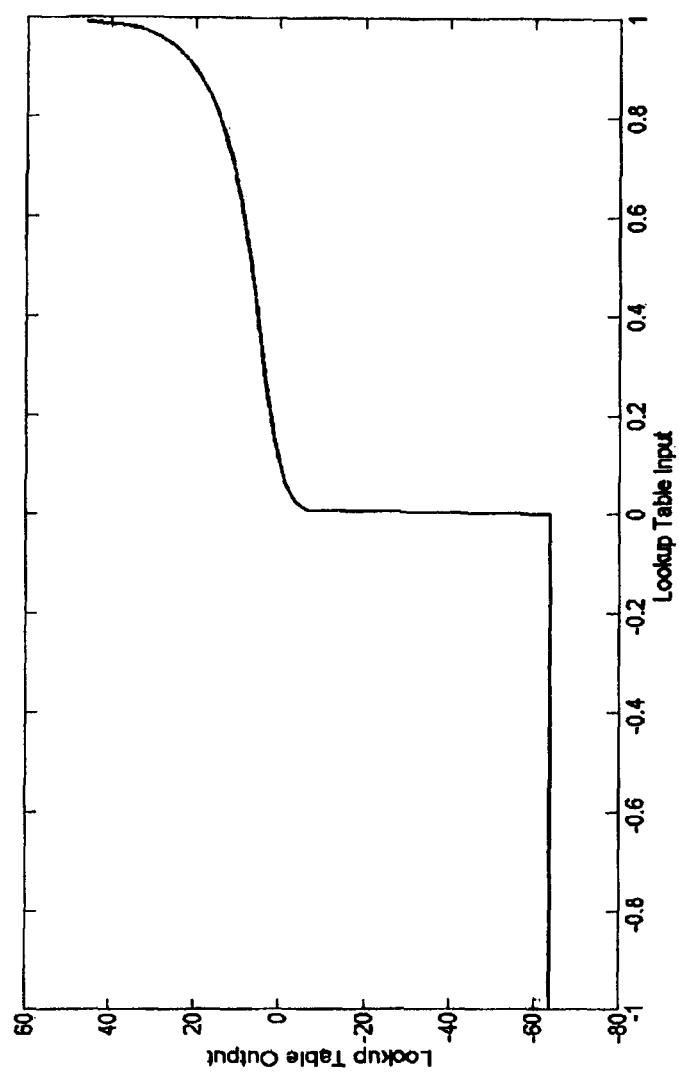
FIG. 19 is a graph of a lookup table implementation for the calculation of an SNR estimate in dB from the value of $q_{2,N}^D$ for a BPSK signal, according to one embodiment.
Figure 20:
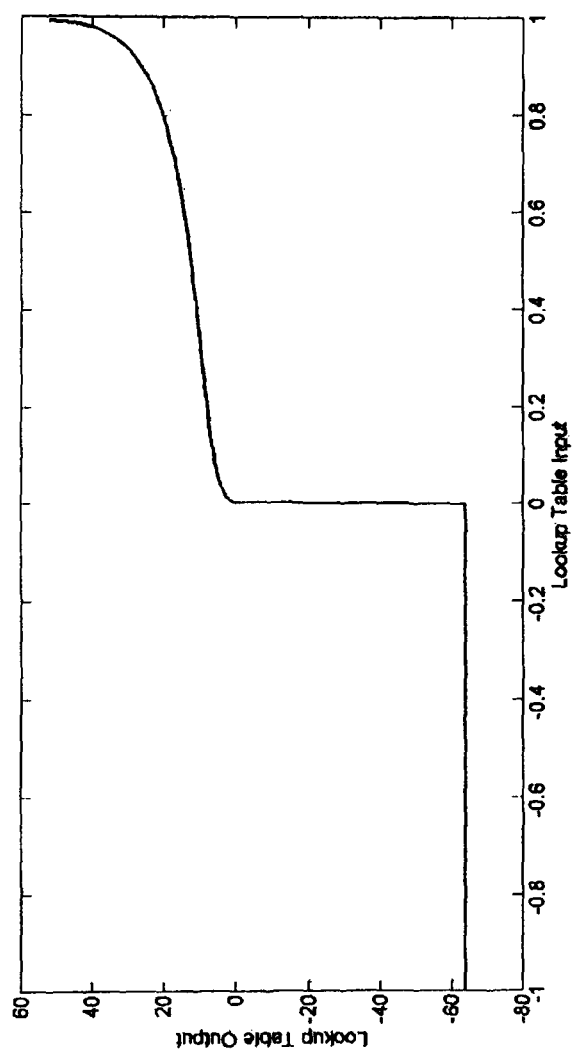
FIG. 20 is a graph of a lookup table implementation for the calculation of an SNR estimate in dB from the value of $q_{4,N}^D$ for a QPSK signal, according to one embodiment.

An example of the values of a lookup table for determining the SNR estimate 945 in decibels can be found in FIG. 19 and FIG. 20, for BPSK and QPSK, respectively. These Figures show the values obtained for an input quantization of 9 bits (1 sign, 8 fraction bits) that represent $q_{M,N}^D$ 935, and from an output of 12 bits (1 sign bit, 6 whole bits, 5 fractional bits). The numerical representation can be chosen by the designer, such as two's complement in the exemplary embodiment. As can be seen in FIGS. 19 and 20, when $q_{M,N}^D > 0$, the value of the lookup table is $10 \log_{10}((\bar{h}_M^D)^{-1}(q_{M,N}^D))$, while, for $q_{M,N}^D \leq 0$, similar to the case discussed earlier for $q_{M,N} \geq 0$, some default value could be used. For example, in FIGS. 19 and 20 this is the most negative value that can be represented (i.e., the lowest SNR in dB) by the chosen 12 bit quantization. Of course other behaviors for the case of $q_{M,N} \leq 0$ can be implemented for alternative embodiments, and the choice of a constant value for this range is given as a non-limiting example. In the foregoing example, the SNR Sufficiency Threshold is 0, since at or below that value the estimate $q_{M,N}^D$ 935 is considered not sufficient for SNR estimation. Other SNR Sufficiency Thresholds are possible for other embodiments.

While an SNR estimate in dB is very useful and is perhaps the standard manner in which SNR is expressed, many other possible SNR indications are possible, for example decibels in a different base (e.g. $\ln(\bar{h}_M^D)^{-1}(q_{M,N}^D))$ where "ln" is the natural logarithm function). Indeed, in alternative embodiments the average metric $q_{M,N}^D$ 935 can itself serve as a proxy for the SNR estimate with no further processing necessary, if that value can be used as-is by the receiver as a raw proxy for the SNR estimate and, for example, appropriate arrangements are made in the receiver to handle values of $q_{M,N}^D$ that do not surpass the SNR sufficiency threshold (for example, simply ignoring them). Another way that $q_{M,N}^D$ 935 can itself serve as a proxy is done as follows: $q_{M,N}^D$ 935 is compared via a comparison device such as a comparator 950 to an SNR sufficiency threshold 955 (e.g. an SNR sufficiently threshold of 0). If $q_{M,N}^D$ 935 does not surpass the threshold, then $q_{M,N}^D$ 935 is considered to be insufficient for SNR estimation and the output 958 of the comparator 950 selects via a data selection device such as a multiplexer 960 a default proxy value for the SNR estimate 965. This selected value is passed through to the output 970 of the multiplexer 960 and serves as a proxy for the SNR estimate that can be used by the receiver. The default proxy value for the SNR estimate can be a constant, or in other embodiments it can arrive from another part of the system and may not be constant. If $q_{M,N}^D$ 935 does surpass the SNR sufficiency threshold, then it can be used as a proxy for the SNR estimate and it is passed to the to the output 970 through the multiplexer 960 by virtue of appropriate selection from the output 958 of the comparator 950.

For a large enough N, $q_{M,N}^D$ 935 will be a very good approximation of $\bar{h}_M^D(\chi)$, so that calculation of the theoretical value $\bar{h}_M^D(\chi)$ will give the expected value of $q_{M,N}$, or equivalently (assuming ergodicity) the value of $$\lim_{N \to \infty} q_{M,N}^D$$

(i.e. the value or $q_{M,N}^D$ when N is very large). Another way to phrase this is that $$q_{M,N}^D \xrightarrow{N \to \infty} E[h_M^D(\varphi_n^D)],$$

and so for a given $\chi$, $$E[q_{M,N}^D] = \lim_{N \to \infty} q_{M,N}^D = E[h_M^D(\varphi_n^D) \mid \chi] = \bar{h}_M^D(\chi).$$

Then, as noted previously, using $q_{M,N}^D$ as an estimate of $\bar{h}_M^D(\chi) = E[h_M^D(\phi_n^D) \mid \chi]$, the SNR estimation in dB is obtained via $\chi_{dB} = 10 \log_{10}((\bar{h}_M^D)^{-1}(q_{M,N}^D))$ which is the SNR estimate that is based upon a finite number of symbols from which $q_{M,N}^D$ is calculated.

$\bar{h}_M^D(\chi)$ can be calculated, and such a calculation is now presented for the exemplary embodiment. In the exemplary embodiment for M-PSK and D-MPSK, in order to calculate $(\bar{h}_M^D)^{-1}(\cdot)$, let $L_M^D(\chi, \Delta\omega, \theta_e) \equiv E[h_M^D(\phi_n) \mid \chi, \Delta\omega, \theta_e]$. By examining $h_M^D(\cdot)$, which operates on $\phi_n^D$, it can be determined that:

$$L_M^D(\chi, \Delta\omega, \theta_e) = E\left[ \frac{8}{\pi^2} \sum_{k=0}^{\infty} \frac{\cos(M \cdot (2k+1)\varphi_n^D)}{(2k+1)^2} \bigg| \theta_e \right]$$

$$= E\left[ \frac{8}{\pi^2} \sum_{k=0}^{\infty} \frac{\begin{pmatrix} \cos(M \cdot (2k+1)\Delta\phi_n^D)\cos(M \cdot (2k+1)\Delta\omega T) + \\ \sin(M \cdot (2k+1)\Delta\phi_n^D)\sin(M \cdot (2k+1)\Delta\omega T) \end{pmatrix}}{(2k+1)} \bigg| \theta_e \right]$$

$$= \frac{8}{\pi^2} \sum_{k=0}^{\infty} \left( \frac{\begin{pmatrix} E[\cos(M \cdot (2k+1)\Delta\phi_n^D)]\cos(M \cdot (2k+1)\Delta\omega T) + \\ \underbrace{E[\sin(M \cdot (2k+1)\Delta\phi_n^D)]}_{=0}\sin(M \cdot (2k+1)\Delta\omega T) \end{pmatrix}}{(2k+1)^2} \right)$$

$$= \frac{8}{\pi^2} \sum_{k=0}^{\infty} \left( \frac{E[\cos(M \cdot (2k+1)\Delta\phi_n^D)]\cos(M \cdot (2k+1)\Delta\omega T)}{(2k+1)^2} \right)$$

Note the lack of dependence on $\theta_e$, which results from carrier synchronization not being needed. Also note the implicit dependency on $\chi$ through the variables $\phi_n^D$ and $\Delta\phi_n^D$. Furthermore, it can be determined that:

$$E[\cos(M \cdot (2k+1)\Delta\phi_n^D)] = \tag{23}$$

$$\frac{\pi\chi}{4} \cdot e^{-\chi} \left[ I_{\frac{M \cdot (2k+1)-1}{2}}\left(\frac{\chi}{2}\right) + I_{\frac{M \cdot (2k+1)+1}{2}}\left(\frac{\chi}{2}\right) \right]^2$$

Therefore:

$$L_M^D(\chi, \Delta\omega, \theta_e) = \tag{24}$$

$$\frac{8}{\pi^2} \sum_{k=0}^{\infty} \left( \frac{\pi\chi}{4} \cdot e^{-\chi} \left[ \begin{matrix} I_{\frac{M \cdot (2k+1)-1}{2}}\left(\frac{\chi}{2}\right) + \\ I_{\frac{M \cdot (2k+1)+1}{2}}\left(\frac{\chi}{2}\right) \end{matrix} \right]^2 \frac{\cos(M \cdot (2k+1)\Delta\omega T)}{(2k+1)^2} \right)$$

And:

$$\bar{h}_M^D(\chi) = L_M^D(\chi, 0, \theta_e) = \tag{25}$$

$$\frac{8}{\pi^2} \sum_{k=0}^{\infty} \left( \frac{\pi\chi}{4} \cdot \frac{e^{-\chi}}{(2k+1)^2} \left[ I_{\frac{M \cdot (2k+1)-1}{2}}\left(\frac{\chi}{2}\right) + I_{\frac{M \cdot (2k+1)+1}{2}}\left(\frac{\chi}{2}\right) \right]^2 \right) =$$

$$e^{-\chi} \frac{2\chi}{\pi} \sum_{k=0}^{\infty} \left( \frac{1}{(2k+1)^2} \left[ I_{\frac{M \cdot (2k+1)-1}{2}}\left(\frac{\chi}{2}\right) + I_{\frac{M \cdot (2k+1)+1}{2}}\left(\frac{\chi}{2}\right) \right]^2 \right)$$

And, using the fact that:

$$\frac{\pi\chi}{4} \cdot \frac{e^{-\chi}}{(2k+1)^2} \left[ I_{\frac{M \cdot (2k+1)-1}{2}}\left(\frac{\chi}{2}\right) + I_{\frac{M \cdot (2k+1)+1}{2}}\left(\frac{\chi}{2}\right) \right]^2 \xrightarrow{\text{high SNR}} \frac{1}{(2k+1)^2} \tag{26}$$

$$\exp\left(\frac{-M^2(2k+1)^2}{2\chi}\right)$$

(22)

Then, approximately:

$$\bar{h}_M^D(\chi) \xrightarrow{\text{high SNR}} \frac{8}{\pi^2} \sum_{k=0}^{\infty} \left( \frac{1}{(2k+1)^2} \exp\left(\frac{-M^2(2k+1)^2}{2\chi}\right) \right) \tag{27}$$

The expression of (27) is useful for calculations at high SNR, since in some numerical programs such as Matlab™ the calculation of Bessel functions is sometimes not sufficiently accurate at high SNRs.

Figure 11:
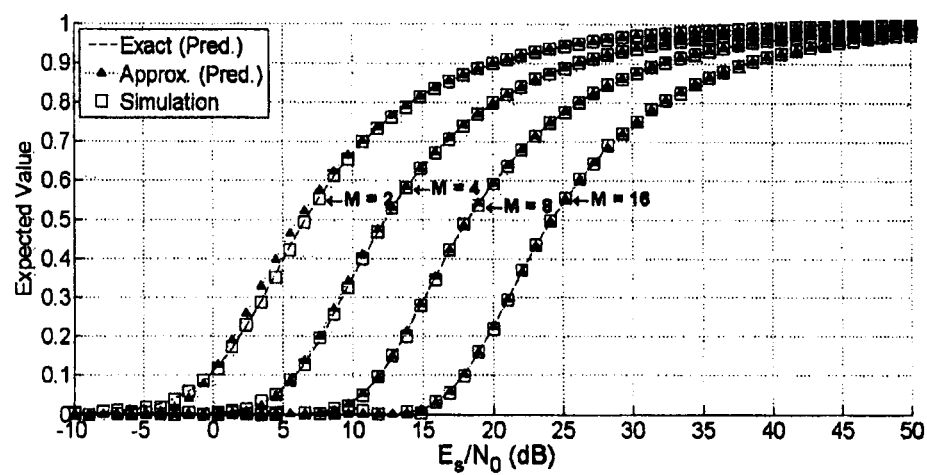
FIG. 11 is a graph of the expected values of several base functions vs. SNR, i.e. $\bar{h}_M^D(\chi) \equiv E[h_M^D(\phi_n^D)|E_S/N_0 = \chi]$ vs. $\chi$, for several D-MPSK or M-PSK modulations, according to one or more embodiments. Curves showing simulated, exact, and approximate values are shown.

Note that the assumption $\Delta\omega \to 0$ is satisfied by the condition $|\Delta\omega| \ll 2\pi/(M \cdot T)$ that was assumed previously, and which can be attained via a variety of methods such as open-loop frequency tuning A graph of the expected value of the base function $\bar{h}_M^D(\chi) = E[h_M^D(\phi_n^D) \mid E_S/N_0 = \chi]$ is shown in FIG. 11 for D-MPSK or M-PSK for M=2, M=4, M=8, and M=16, for the exemplary embodiment. The "Exact" (predicted) value is the one in (25), while the "Approximate" (predicted) value is that of (27). Values obtained via simulation are also shown.

Figure 10:
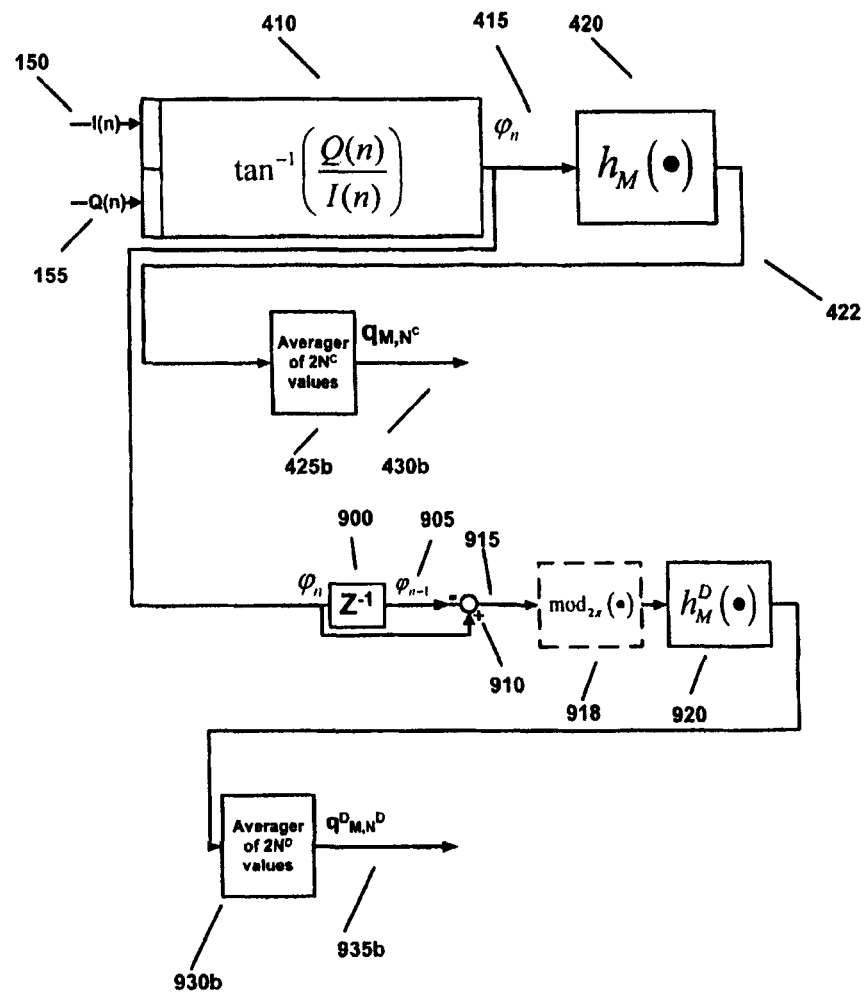
FIG. 10 is a block diagram illustrating how the same phase determiner can be used to generate phases for use in any one or more of lock detection, SNR estimation, and modulation classification, according to one embodiment.

Some structure re-use is possible in order to generate and use $q_{M,N}^D$ 935 and $q_{M,N}$ 430 (as well as, for example, the SNR estimates 450, 945 derived from $q_{M,N}$ 430 and $q_{M,N}^D$ 935). This is shown in FIG. 10. The notations $N^C$ and $N^D$ are used, in order to highlight the fact that the number of samples averaged for each metric could be different for each of $q_{M,N^D}^D$

935b and $q_{M,N}^c$ 430b. FIG. 10 shows how the received phase $\phi_n$ 415 is used to generate both $q_{M,N}^D$ 935b and $q_{M,N}^c$ 430b regardless of the value of M or N. Therefore, if such structures are implemented for various Ms in the same receiver, such as in a receiver that has support for several modulations, then only one implementation of the phase determiner 410 can be utilized, regardless of the number of modulations supported and regardless of the number of structures that compute $q_{M,N}^D$ 935b and $q_{M,N}^c$ 430b. This reduces the resources needed and is an advantage of the exemplary embodiment.

Extension to Non-MPSK Constellations

As noted above alternative embodiments can be made to handle a wide variety of modulations which are not limited to M-PSK modulations. In such cases, M is defined as the total number of distinct phases in the constellation. The guiding principle in such an adaptation is that $h_M^D(\theta)$ has a curve that is triangular in nature, with maxima of the triangles corresponding to the ideal phase differences of the symbols, which are in turn defined as the set of possible differences between ideal symbol phases. In embodiments without a DC offset, the function $h_M^D(\theta)$ will have minima of equal amplitude but opposite polarity located midway between its maxima. Retained for convenience is the convention that angles upon which $h_M^D(\theta)$ operates are defined such that they span the interval $[-\pi,\pi)$. In alternative embodiments the angles can be defined as residing in any appropriate interval of length of at least $2\pi$, in which case this entails a corresponding adaptation of the definition of $h_M^D(\theta)$. In the present embodiment, $h_M^D(\theta)$ has a maximum of 1 and a minimum of −1. In other embodiments, $h_M^D(\theta)$ may have a maximum and minimum with different values, such as A for the maximum and −A for the minimum, where "A" is some non-zero value. Additionally, in some embodiments $h_M^D(\theta)$ may have a DC offset, either inevitable (e.g. due to quantization) or intentional, that is for example the maximum will be A+DC and the minimum will be −A+DC, where "DC" represents the DC offset. However, excessive DC offsets may cause performance degradations. Alternatively, the output of $h_M(\theta)$ may span any suitable interval, such as any suitable subset of $(-\infty,\infty)$, when implemented for example using software.

To exemplify this process, in FIG. 25 the Rectangular QAM-16 constellation is shown. Angles of the ideal symbol phases are denoted by the corresponding arcs. This constellation has 12 phases (in radians): $\phi_0=-0.8976\pi$ (Symbol A at arc 2500), $\phi_1=-0.75\pi$ (Symbols B, C at arc 2505), $\phi_2=-0.6024\pi$ (Symbol D at arc 2510), $\phi_3=-0.3976\pi$ (Symbol E at arc 2515), $\phi_4=-0.25\pi$ (Symbols F, G at arc 2520), $\phi_5=-0.1024\pi$ (Symbol H at arc 2525), $\phi_6=0.1024\pi$ (Symbol I at arc 2530), $\phi_7=0.25\pi$ (Symbols J, K at arc 2535), $\phi_8=0.3976\pi$ (Symbol L at arc 2540), $\phi_9=0.6024\pi$ (Symbol M at arc 2545), $\phi_{10}=0.75\pi$ (Symbols N, O at arc 2550), $\phi_1=0.8976\pi$ (Symbol P at arc 2555).

Figure 27:
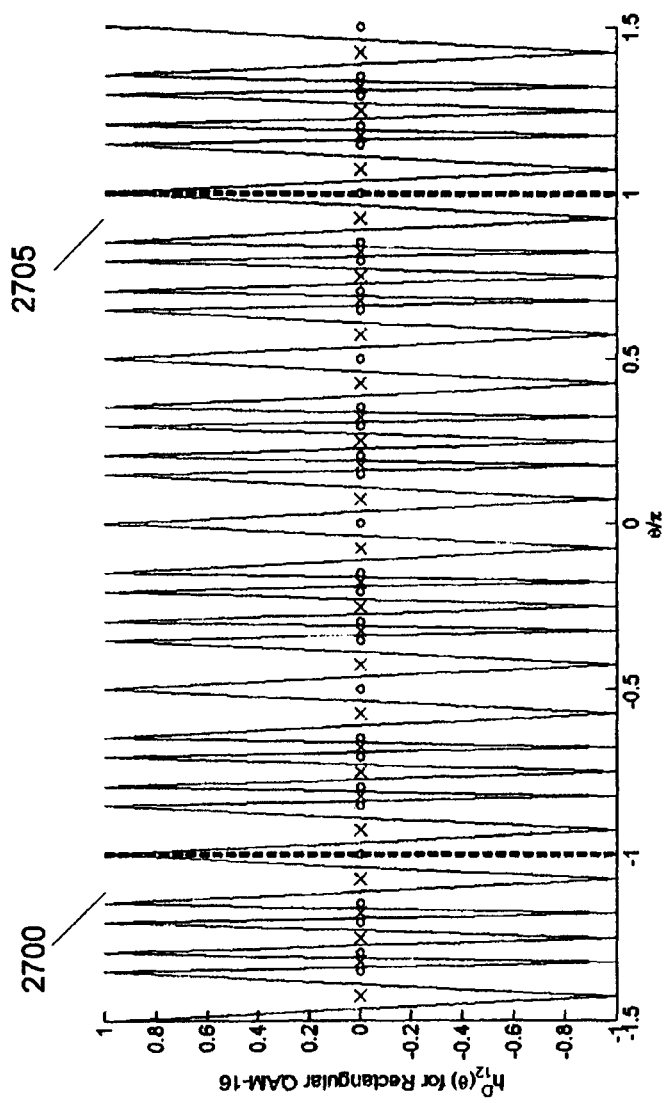
FIG. 27 is a graph showing one embodiment of the base function, $h_{12}(\theta)$, for rectangular QAM-16.

Thus, since there are 12 distinct phases, the M for this case is 12. The graph of the function $h_{12}^D(\theta)$ for Rectangular QAM-16 is shown in FIG. 27. As can be seen in that graph, the domain of the implementation of $h_{12}^D(\theta)$ for the exemplary embodiment is $[-\pi,\pi)$, between the two dashed lines 2700, 2705. On the x=0 axis, the "o" markers represent the ideal phase differences, which are the phase differences between ideal symbol phases and the "x" markers are the points midway between the ideal phase differences.

The structures described for SNR estimation and modulation classification that rely upon $h_M^D(\theta)$ will also work for cases other than those discussed in the exemplary embodiments. The expectations which govern the various calculations, e.g. the definition of the expected value of the base function $\bar{h}_M^D(\chi) \equiv E[h_M^D(\phi_n^D)|E_S/N_0=\chi]$, are made by taking into account the corresponding modulation type (in order to ensure that the symbol statistics and received phase statistics are correct) and by using the correct M for the given modulation (for example, for the case of Rectangular QAM-16 in FIG. 25, this would be M=12), and the corresponding definition of $h_M^D(\theta)$ for that particular constellation, as discussed above.

The number of maxima peaks in $h_M^D(\theta)$ is not necessarily M. This depends on the modulation used. For example, in the example above of Rectangular QAM-16, as can be seen in FIG. 27, there are 20 maxima in the interval $[-\pi,\pi)$ for $h_{12}^D(\theta)$. For M-PSK with M=12 and for which the ideal symbol phases are uniformly distributed in $[-\pi,\pi)$, $h_{12}^D(\theta)$ will have 12 maxima in the interval $[-\pi,\pi)$. Hence, the specific base function $h_M^D(\theta)$ that should be used by a designer is defined not only by M, but also by the specific modulation used, and as already noted this also is taken into account when, for example, implementing the function in hardware or calculating the expected value of the base function $\bar{h}_M^D(\chi) \equiv E[h_M^D(\phi_n^D)|E_S/N_0=\chi]$.

The remainder of this disclosure again focuses on the M-PSK case, but extension to other modulations types is possible using the procedure outlined above.

In the foregoing embodiments, references to the average metric $q_{M,N}^D$ 935 "surpassing" a "threshold" refers to $q_{M,N}^D$ being greater than the threshold in embodiments in which the base function used to generate $q_{M,N}^D$ is such that the ideal phase differences correspond to the maxima of the base function (as is the case in the exemplary embodiments), and refers to $q_{M,N}^D$ being less than the threshold in embodiments in which the base function used to generate $q_{M,N}^D$ is such that the ideal phase differences correspond to the minima of the base function. As already noted, in alternative embodiments wherein the ideal symbol phases correspond to the minima of the base function, the thresholds will in general be the negative of the thresholds of the corresponding exemplary embodiments, and the expectation of the base function will be in general the negative of the expectation of the base function of the corresponding exemplary embodiments. Appropriate changes are then accordingly made to various parts of such embodiments. For example, in an embodiment in which ideal phase differences of a modulation correspond to the minima of the base function, $q_{M,N}^D$ "surpassing" the SNR sufficiency threshold 955 may refer to $q_{M,N}^D$ being −0.5 when the SNR sufficiency threshold 955 is −0.1.

Modulation Classification

Figure 12:
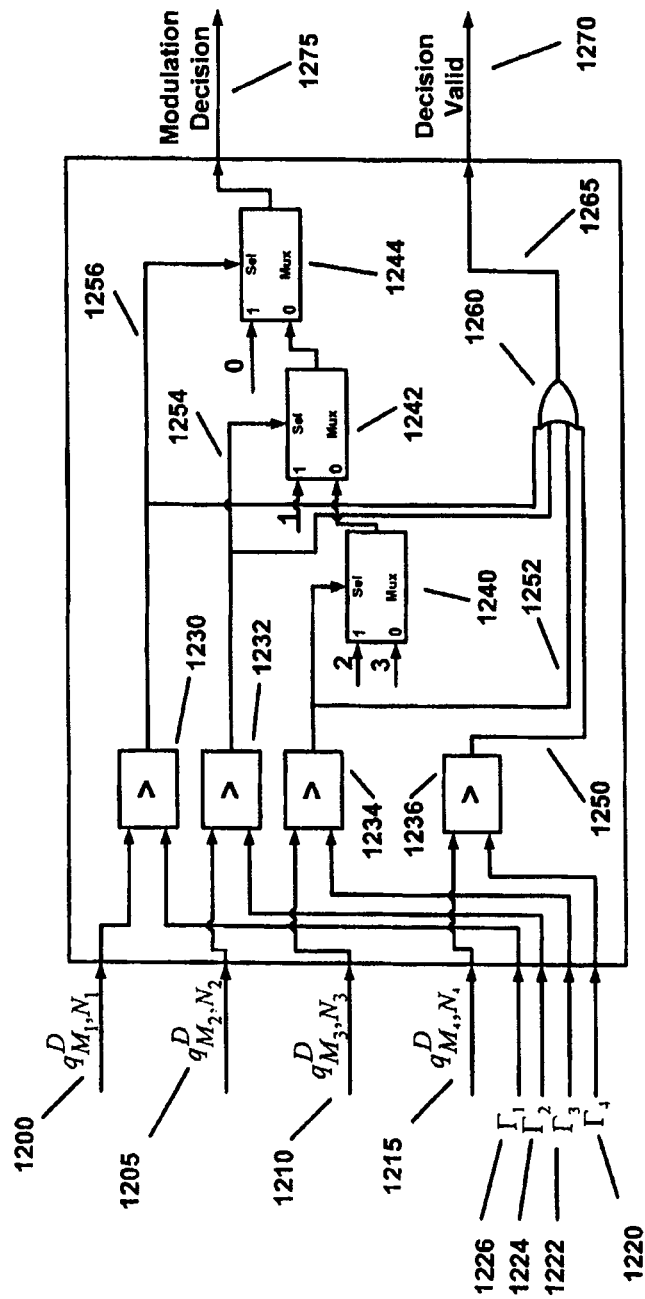
FIG. 12 is a schematic of a modulation classifier, according to one embodiment.

The values of $q_{M,N}^D$ 935 can be used for modulation classification, as shown in FIG. 12. In the present exemplary embodiment, the thresholds are between 0 and 1 and can be determined through any one or more of experimentally, simulations and calculations. For example, a threshold value of 0.07 and N=2048 for BPSK, QPSK, 8-PSK and 16-PSK has been shown to work well in practice. Other combinations of thresholds and N are possible (including different thresholds and values of N for different modulations) and will result in different detection and false alarm probabilities and different latencies; these values of thresholds and N may be determined for alternative embodiments via any one or more of trial and error, simulation, calculation, and any other suitable manner.

Theory of Modulation Classifier Operation

In the following, for the exemplary embodiment, the case of M-PSK or D-MPSK modulations where all the Ms are positive integer powers of 2 is considered. In other embodiments, other modulations or modulation orders may be present, and hence the description of the exemplary embodiment should not be construed as limiting. To gain insight into the surprising operation of the modulation classifier, the operation of the metric generator 920 is considered when the input signal has the "wrong" M; i.e., a value for M that does not correspond to the value of M for which the metric generator 920 is designed. Formally, suppose that the input signal modulation index is $M_T$ (with "T" standing for "True"). How would the metric generator 920 for computation of $q_{M_W,N}^D$ react (with "W" standing for "Wrong")? Note that while the following analysis presumes that every M is a positive integer power of 2, in alternative embodiments other values for M may be used.

This analysis is considered as two cases: Case (A): $M_W > M_T$, and Case (B): $M_W < M_T$.

Figure 14:
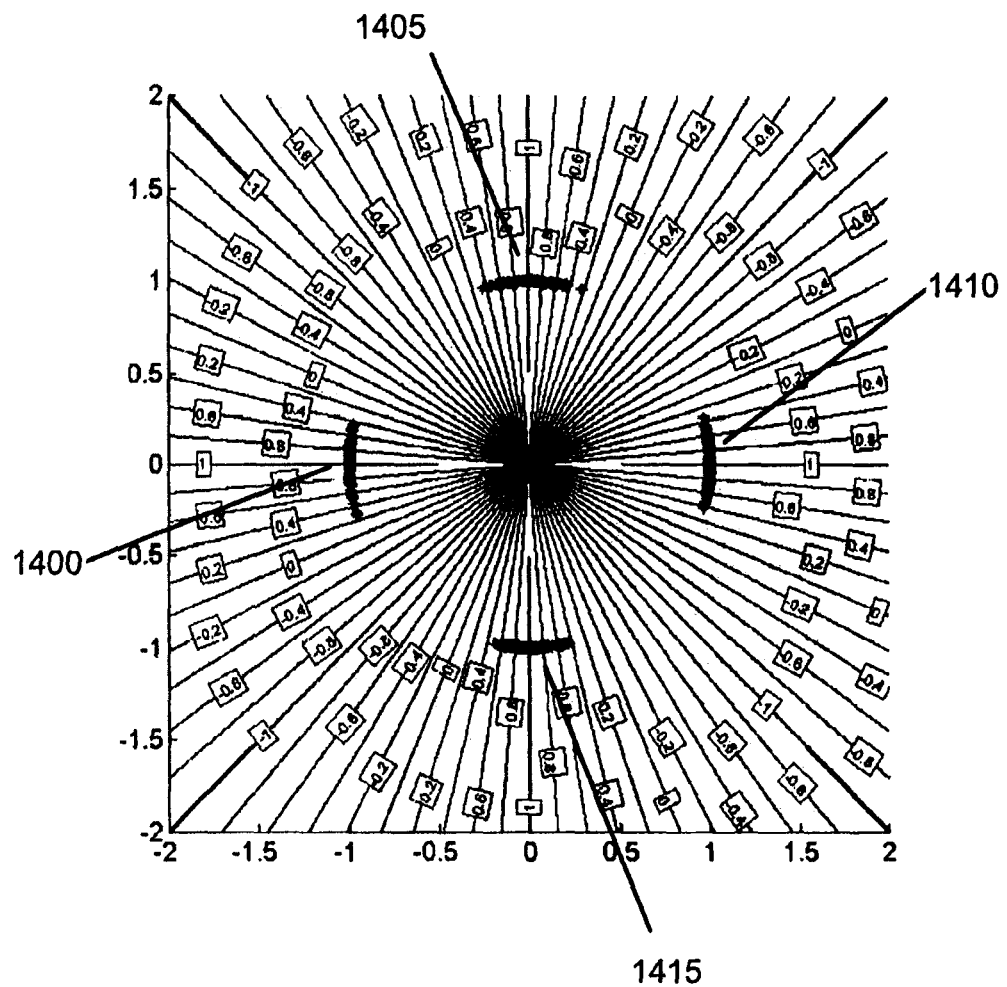
FIG. 14 is a polar graph of $\phi_n^D$ for QPSK, for $E_S/N_0 = 20$ dB, superimposed on a contour graph of $h_4^D(\cdot)$, according to one embodiment.
Figure 16:
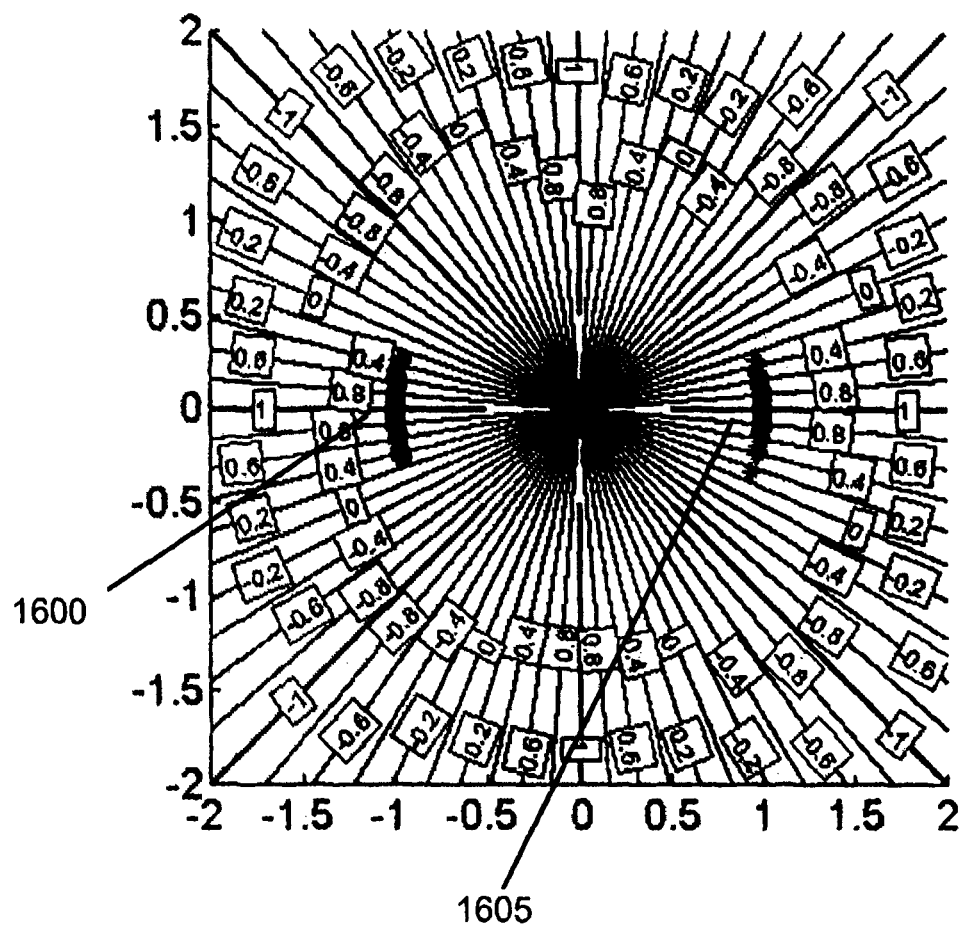
FIG. 16 is a polar graph of $\phi_n^D$ for BPSK, for $E_S/N_0 = 20$ dB, superimposed on a contour graph of $h_4^D(\cdot)$, according to one embodiment.

For case (A), the constellation consisting of the $M_T$ possible constellation points is a symmetric subset of the $M_W$ constellation points for which the estimator $q_{M_W,N}^D$ is designed. Accordingly, since the metric generator 920 is NDA, then the metric generator 920 will behave the same as if the correct constellation were input to it. To clarify this further, assume for example that $M_W=4$ and $M_T=2$, i.e. the goal is to calculate the value of $q_{M_W,N}^D$, $M_W=4$, when the input signal is BPSK ($M_T=2$). Recall that $v_n = \exp(j\phi_n^D)$, where $$v_n \equiv \frac{r_n r_{n-1}^*}{|r_n||r_{n-1}|},$$

is the pseudo coherently demodulated normalized constellation of the input signal. The value of $q_{4,N}^D$ is an average of the application of $h_{M_W}^D(\cdot) = h_4^D(\cdot)$ over $\phi_n^D$. Now, since $v_n$ is the pseudo coherently demodulated normalized constellation with modulation index $M_T$, then in the I-Q plane $v_n$ will appear as $M_T$ small arcs whose centers are equally spaced angularly from 0 to $2\pi$. For example, refer to FIGS. 14 and 16. FIG. 14 shows the polar graph of $v_n$, or $(\cos(\phi_n^D), \sin(\phi_n^D))$, for QPSK, as small arcs 1400, 1405, 1410, 1415 which correspond to 500 symbols at $E_S/N_0=20$ dB, superimposed on a contour graph of $h_4^D(\cdot)$. The value of $\bar{h}_4^D(\chi) = E[h_4^D(\phi_n^D)|\chi]$ is approximated by $q_{4,N}^D$, i.e.

$$q_{4,N}^D \xrightarrow{N \to \infty} \bar{h}_4^D(\chi).$$

Now, $q_{4,N}^D$ for the symbols shown in FIG. 14 is the sum of the contours upon which those symbols land for each symbol, divided by the number of symbols. Due to the symmetry of the contours and the equiprobability of the symbols, the contribution of each of the arcs 1400, 1405, 1410, 1415 is equal. Now, if a BPSK signal is processed instead of a QPSK signal, i.e. $M_W=4$ and $M_T=2$, then the arcs 1405, 1415 on the vertical axis disappear, but the value of $q_{4,N}^D$ stays the same; this is exemplified in FIG. 16, in which the value of $q_{4,N}^D$ stays the same because the average of the contours landed upon by the BPSK symbols' arcs 1600, 1605 is the same as in the case where a QPSK signal is received.

For case (B) ($M_W < M_T$) the situation is slightly more complicated. It can nonetheless be seen that for any $M_W < M_T$, $E[q_{M_W,N}^D]=0$. To illustrate this, assume that $M_T=2M_W$. The $v_n$ constellation corresponding to $M_T$, assuming equiprobable symbols, can be decomposed into two equiprobable constellations corresponding to $M_W$ which are shifted angularly $2\pi/M_T = \pi/M_W$ radians from each other. One of these constellations corresponds to the constellation for which $M_W$ was designed, and hence the expected value of the $q_{M_W,N}^D$ for these symbols will be $\bar{h}_{M_W}^D(\chi)$. The other constellation will be a constellation that is rotated (an angle of $\pi/M_W$, and it can be shown that this results in an expected value of $(-\bar{h}_{M_W}^D(\chi))$ for this constellation. Since the constellations are equiprobable, the total expectation of $q_{M_W,N}^D$ will thus be $E[q_{M_W,N}^D] = (\bar{h}_{M_W}^D(\chi)) + (-\bar{h}_{M_W}^D(\chi)) = 0$ and for large enough N $$q_{M_W,N}^D \xrightarrow{N \to \infty} (\bar{h}_{M_W}^D(\chi)) + (-\bar{h}_{M_W}^D(\chi)) = 0.$$

Figure 13:
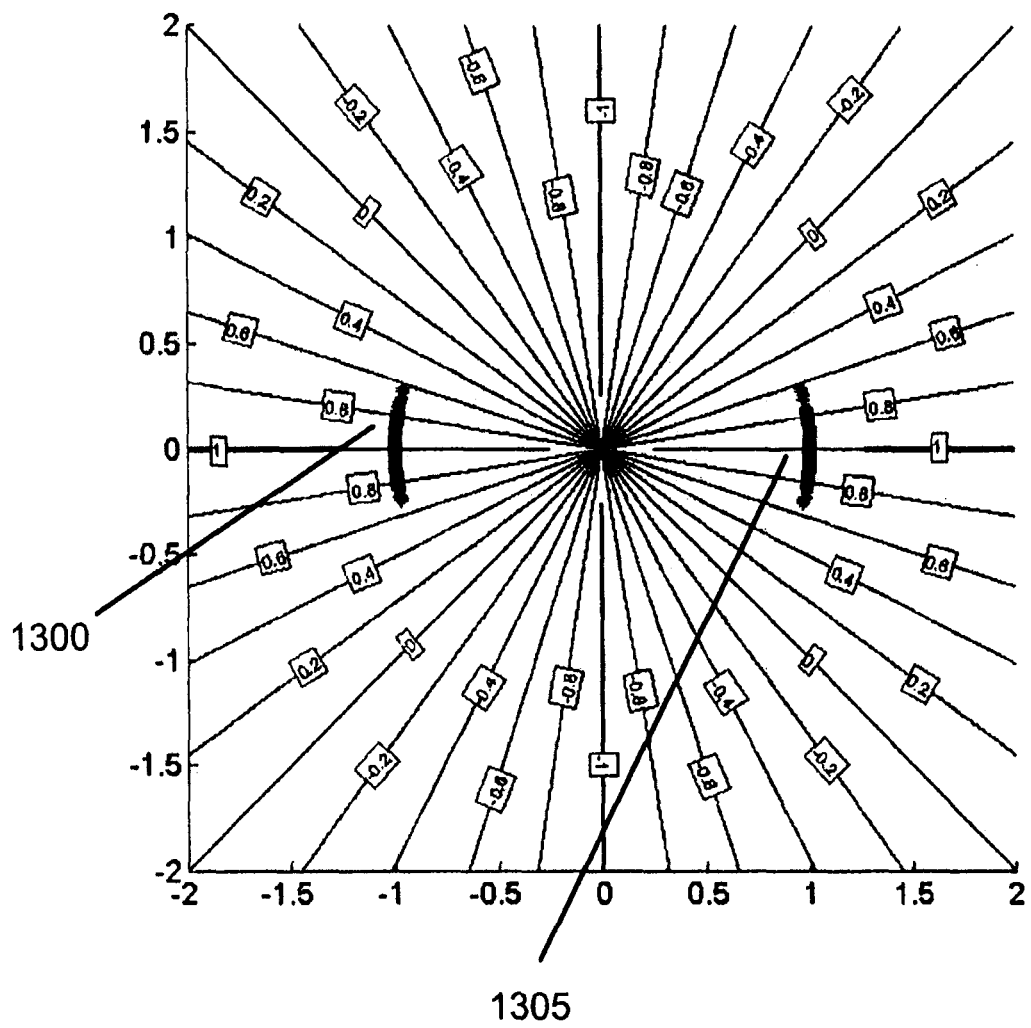
FIG. 13 is a polar graph of $\phi_n^D$ for BPSK, for $E_S/N_0 = 20$ dB, superimposed on a contour graph of $h_2^D(\cdot)$, according to one embodiment.
Figure 15:
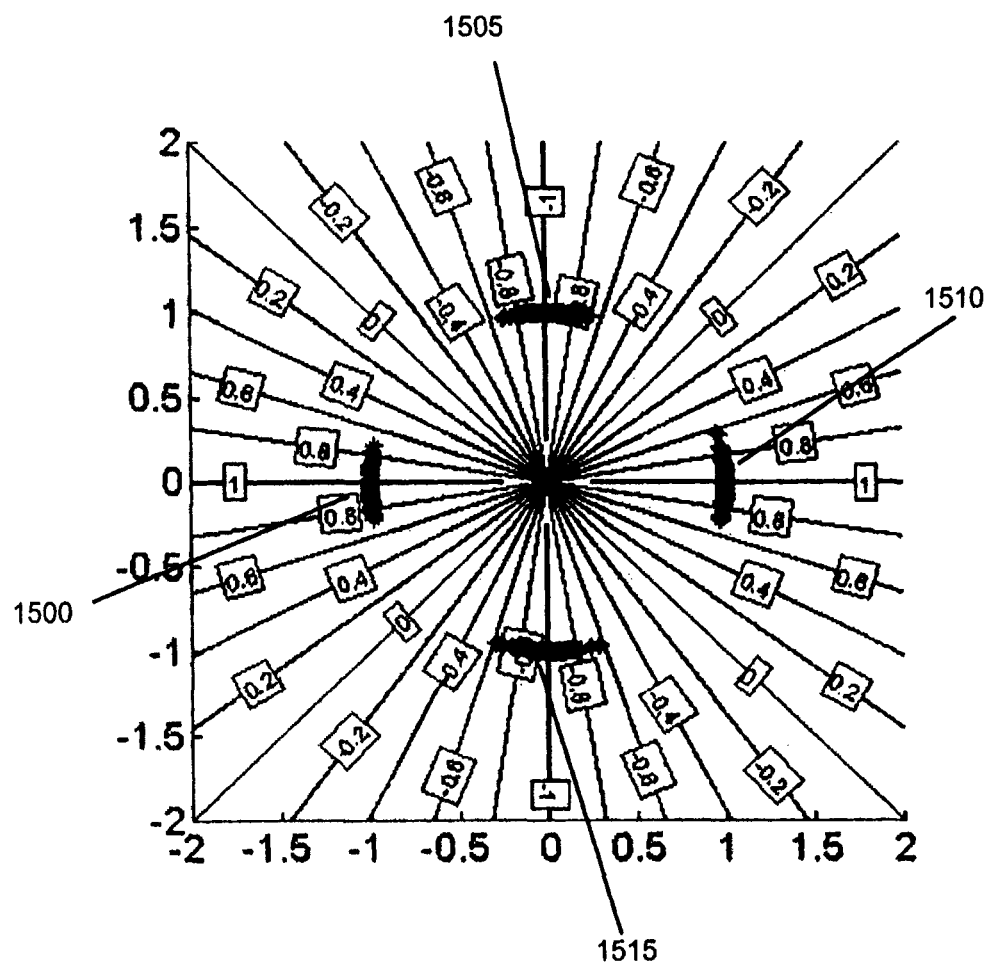
FIG. 15 is a polar graph of $\phi_n^D$ for QPSK, for $E_S/N_0 = 20$ dB, superimposed on a contour graph of $h_2^D(\cdot)$, according to one embodiment.

To exemplify this, refer to FIGS. 13 and 15. In FIG. 13 there is shown the polar graph of $v_n$, or $(\cos(\phi_n^D), \sin(\phi_n^D))$, for BPSK, as small arcs 1300, 1305, which correspond to 500 symbols at $E_S/N_0=20$ dB, superimposed on a contour graph of $h_2^D(\cdot)$. Due to the symmetry of the contours, the contribution of each of the arcs 1300, 1305 is equal. $q_{2,N}^D$ is the average of the contours landed upon by the BPSK symbols' arcs 1300, 1305, and) for large enough N will result in a good approximation of $\bar{h}_2^D(\chi) = E[h_2^D(\phi_n^D)|\chi]$. Now, if a QPSK signal is processed instead of a BPSK signal, i.e. $M_W=2$ and $M_T=4$, FIG. 15 results. In FIG. 15, the QPSK signal is composed of two BPSK constellations that are shifted angularly by $2\pi/M_T = \pi/M_W = \pi/2$ radians from each other: the constellation composed of arcs 1500 and 1510, and the constellation composed of arcs 1505 and 1515. Those arcs are shown superimposed on a contour graph of $h_2^D(\cdot)$ in FIG. 15. The contributions of each of the constellations to the value of $q_{2,N}^D$ cancels each other out, because the vertically oriented constellation arcs 1505, 1515 fall on contours whose value is opposite in polarity but equal in magnitude to the contours landed upon by the horizontally oriented constellation arcs 1500, 1510. For equiprobable symbols, the contributions of the constellations will cancel each other out for a large enough number of symbols so that $$q_{2,N}^D \xrightarrow{N \to \infty} 0.$$

In the more general case of $M_T = 2^k M_W$, where k is a positive integer, the constellation of $v_n$ can be decomposed into $2^k$ separate constellations of $M_W$ symbols whose combined contribution to the value of $q_{M_W,N}^D$ will tend to 0. Therefore, for the case of $$M_W < M_T, q_{M_W,N}^D \xrightarrow{N \to \infty} 0.$$

These statistics of $q_{M_W,N}^D$ and $q_{M_T,N}^D$ form the basis of the modulation classification scheme. Suppose there is a bank of L estimators which compute $q_{M_i,N_i}^D$ for $i=\{1,2,\ldots L\}$, where it is assumed that one of the $M_i$, with index C, i.e. $M_C$, is the correct modulation index, and for convenience the Ms are enumerated such that for any indices $x,y \in \{1,2,\ldots,L\}$ if $x>y$ then $M_x > M_y$. The value of N for each modulation $M_i$ (in order to highlight the possibility that the Ns may be different for each modulation) is denoted $N_i$. In this case, for all $i \in \{1, 2, \ldots L\}$:

$$\lim_{N \to \infty} q_{M_i,N_i}^D = \begin{cases} 0 & i < C \\ \bar{h}_{M_i}^D(\chi) & i \geq C \end{cases} \quad (28)$$

Since (see FIG. 11) it is seen that if $M_x > M_y$ then $\bar{h}_{M_y}^D(\chi) > \bar{h}_{M_x}^D(\chi)$ for all $\chi$, then, given (28), a peak detector can be used in order to decide upon the modulation, given the values of $q_{M_i,N_i}^D$ for i={1,2, ..., L}. That is, a correct decision rule for the modulation is:

$$\hat{M}_C = \max_{M_i}\{q_{M_i,N_i}^D \mid i = 1, 2, \ldots, L\} \quad (29)$$

where $\hat{M}_C$ is used to denote the decided upon modulation index, which nominally equals $M_C$.

As an alternative to the peak detector decision rule or algorithm in (29), a simple decision method is also possible which is not as susceptible to quantization effects. Note that, given (28), the correct modulation classification is the modulation that corresponds to the lowest index j for which $q_{M_j,N_j}^D$ is bigger than some corresponding validity threshold $\Gamma_j$ (heuristically, the validity threshold should be chosen so that for the lowest SNR for which reliable modulation classification is desired for the modulation with index j, there is a high probability that $q_{M_j,N_j}^D$ will be larger than that validity threshold, as shall be discussed below). From this understanding, a so-called priority decision logic can be implemented, and which is the implementation of the following algorithm written in pseudo-code (for example here, for four possible modulations):

if $q_{M_1,N_1}^D > \Gamma_1$ then out=0;

else if $q_{M_2,N_2}^D > \Gamma_2$ then out=1;

else if $q_{M_3,N_3}^D > \Gamma_3$ then out=2;

else out=3; (30)

The decision rule of (30) is given for an exemplary case where there are 4 possible modulations to detect, with indices $M_1$, $M_2$, $M_3$, and $M_4$. Other embodiments may handle more than four modulations, or less than four modulations. The modulation decision method of (30) is implemented as shown in FIG. 12. For example, suppose that $M_1$=2, $M_2$=4, $M_3$=8, $M_4$=16; i.e. the first modulation is BPSK, the second is QPSK, the third is 8-PSK, and the fourth is 16-PSK. The structure will output the detection decision 1275 as 0 for BPSK, 1 for QPSK, 2 for 8-PSK, and 3 for 16-PSK. In FIG. 12, as inputs to the modulation classification decision circuit there are four average metrics 1200, 1205, 1210, 1215, corresponding to the different modulation orders M=2 ($M_1$), 4 ($M_2$), 8 ($M_3$), and 16 ($M_4$). The comparators 1230, 1232, 1234, 1236 are used to compare each of the average metrics 1200, 1205, 1210, 1215 to their respective validity thresholds 1226, 1224, 1222, 1220. Each of the comparators 1230, 1232, 1234, 1236 is communicatively coupled to its own averager 930 (not shown in FIG. 12) that outputs one of the average metrics 1200, 1205, 1210, 1215. The outputs of each of the comparators 1230, 1232, 1234, 1236 except the comparator 1236 that receives as input the average metric 1215 associated with the highest value of M are coupled to data selectors such as multiplexers 1240, 1242, 1244. Each of the comparators 1230, 1232, 1234 is coupled to the selection input of one of the multiplexers 1240, 1242, 1244 and the multiplexers 1240, 1242, 1244 are communicatively coupled together in series ("daisy chained") such that the data output (the "modulation decision" 1275) of the last of the multiplexers in the series is a particular one of the data inputs of the multiplexers 1240, 1242, 1244. In this case, assuming the correct modulation is one of $M_1$=2, $M_2$=4, $M_3$=8, $M_4$=16, then the modulation decision 1275 is 0 if the correct modulation is $M_1$; 1 if the correct modulation is $M_2$; 2 if the correct modulation is $M_3$; and 3 if the correct modulation is $M_4$.

In this example, the four possible modulation orders include adjacent powers of two; by "adjacent powers of two", it is meant any two powers of 2 equaling $2^k$, where for one of the powers of two k=n and for the other k=n+1, and where n is a positive integer. In this example, $M_1$ and $M_2$ are adjacent powers of two; $M_2$ and $M_3$ are adjacent powers of two; and $M_3$ and $M_4$ are adjacent powers of two. In this example, each of the possible modulation orders is also evenly divisible by the lowest value of M; i.e., the lowest value of M is M=2, and M=2, 4, 8 and 16 are each divisible by M=2 without leaving a remainder. Such a set of values of M is beneficial because the fact that such a relationship between the values of M is present is part of the reason that the metric generators behave as they do when applied to "wrong" modulations.

There is the distinct possibility that none of the values of $q_{M_j,N_j}^D$ will surpass the validity threshold. This case corresponds either to a case of (a) no input signal is present (only noise, interference, or both); (b) the modulation is not one of the M-PSK modulations tested; (c) due to the variance of $q_{M_j,N_j}^D$, none have surpassed the validity threshold; or (d) the noise or interference is too large or, equivalently, the $E_s/N_0$ ratio is so low that detection is inhibited. Whatever the cause, if none of the values of $q_{M_j,N_j}^D$ surpasses the validity threshold then the modulation decision is not valid since insufficient information is available. Such a "decision valid" indication 1270 is generated from the values of the average metrics $q_{M_i,N_i}^D$ 1200, 1205, 1210, 1215 and the validity thresholds 1220, 1222, 1224, 1226, via passing the outputs 1250, 1252, 1254, 1256 of the comparators 1230, 1232, 1234, 1236 through ORing logic such as in the form of a simple "OR" function 1260 as seen in FIG. 12.

It should be noted that although the structures in FIG. 12 are a schematic representation which nominally represents a hardware implementation for the exemplary embodiment, though in other embodiments the structure may be implemented for example in software or in a combination of software or hardware or via other means, and so the implementation presented here is not limiting.

Another possible embodiment of the modulation decision logic is given in FIG. 21 as SystemVerilog code. This is a highly parameterized implementation. In that code, the input clk is the clock by which the average metrics $q_{M_i,N_i}^D$ 1200, 1205, 1210, 1215 are received. The input estimator_input contains a concatenated two's-complement version of all the average metrics $q_{M_i,n_i}^D$ 1200, 1205, 1210, 1215, each of which has a bus width in bits as specified in the parameter width, for the various modulations for which detection is desired. The input yes_signal_threshold contains the validity thresholds for the various modulations for which detection is desired, expressed as a concatenated two's-complement encoding of the validity thresholds 1220, 1222, 1224, 1226, each of which has a bus width in bits as specified in the parameter width. With the default parameters in the code four modulations can be supported, for example $M_i$=2, 4, 8, 16, and a different number of modulations can be handled by changing the parameter numestimators. If for example the modulation indices are $M_i$=2, 4, 8, 16, then the output modulation_decision will output "0" for BPSK, "1" for QPSK, "2" for 8-PSK, and "3" for 16-PSK, as was the case in the circuit of FIG. 12. The output classification_valid is "1" if the output modulation_decision is a true best guess of the modulation (i.e. if at least one of the values of $q_{M_i,N_i}^D$ has crossed the validity threshold) or "0" if none of the average metrics $q_{M_i,n_i}^D$ has crossed the validity threshold.

Regarding the validity thresholds, since the expected value of $q_{M_i,N_i}^D$ for large enough $N_i$ is between 0 and 1, the validity thresholds $\Gamma_i$ are between 0 and 1, and may be adjusted, through any one or more of experimentally, theoretical calculations, or simulation, in order to achieve the desired performance. Another parameter that may be adjusted is $N_i$, in order to determine the balance between the estimation latency and lower variance. In general, a larger $N_i$ will facilitate better estimator accuracy (i.e. less variance of $q_{M_i,N_i}^D$) but implies a higher latency. A balance can be struck, which is dependent on each individual system and application, in order to choose sufficiently large $N_i$ so that the estimators are sufficiently accurate without introducing excessive latency.

Detection and False Alarm Probabilities

To implement a particular instantiation of the modulation classifier, the validity thresholds and the values of $N_i$ are defined and the probability that each of the average metrics $q_{M_i,N_i}^D$ will cross that validity threshold are ascertained. These can be done using any one or more of a heuristic manner, by trial and error, and via calculation. A calculation method is now presented, although it is not necessary to actually engage in such calculation as the validity thresholds can be found via trial and error quite rapidly, as discussed in further detail below.

For notational convenience, let the validity threshold for modulation index i be $\Gamma_i$, and the standard deviation of $q_{M_i,N_i}^D$ be $\sigma_i = \sqrt{1/N_i}$ (which is actually an upper bound on the standard deviation of the average metrics $q_{M_i,N_i}^D$). In general, using (28), and using the fact that due to the central limit theorem $q_{M_i,N_i}^D$ are Gaussian for large N, then if i≥C, the probability that the average metric $q_{M_i,N_i}^D$ passes the validity threshold is:

$$P_{D,i} \equiv P(q_{M_i,N_i}^D > \Gamma_i \mid i \geq C) \geq \int_{\Gamma_i}^{\infty} \frac{1}{\sigma_i\sqrt{2\pi}} \exp\left(\frac{-(y-\bar{h}_{M_i}^D(\chi))^2}{2\sigma_i^2}\right) dy \quad (31)$$

$$= Q\left(\frac{\Gamma_i - \bar{h}_{M_i}^D(\chi)}{\sigma_i}\right) = \frac{1}{2}\mathrm{erfc}\left(\frac{\Gamma_i - \bar{h}_{M_i}^D(\chi)}{\sigma_i\sqrt{2}}\right)$$

where $\mathrm{erfc}(x) = \frac{2}{\sqrt{\pi}} \int_x^{\infty} e^{-y^2} dy$ and $Q(x) = \frac{1}{\sqrt{2\pi}} \int_x^{\infty} e^{-y^2/2} dy$, and the "≥" sign is due to the fact that an upper bound is used on the standard deviation.

Conversely, using (28) for all i<C and to a good approximation:

$$P_{FA,i} \equiv P(q_{M_i,N_i}^D > \Gamma_i \mid i < C) \leq \int_{\Gamma_i}^{\infty} \frac{1}{\sigma_i\sqrt{2\pi}} \exp\left(\frac{-y^2}{2\sigma_i^2}\right) dy \quad (32)$$

$$= Q\left(\frac{\Gamma_i}{\sigma_i}\right) = \frac{1}{2}\mathrm{erfc}\left(\frac{\Gamma_i}{\sigma_i\sqrt{2}}\right)$$

In order find suitable values for $\Gamma_i$ and $N_i$, (31) and (32) are treated as equalities. This will result in conservative (i.e. somewhat larger than necessary) values of $N_i$, which is not a problem, as the system's performance in terms of $P_{D,i}$ and $P_{FA,i}$ will exceed the required performance if $N_i$ is larger than needed. Also, to find $N_i$ as a constant, the equations are solved for $\chi = \chi_{M_i,min}^D$ which is the minimum SNR of interest for the particular modulation (for example, $\chi_{M_i,min}^D$ could be the minimum SNR for which it is desired for the receiver to detect the modulation $M_i$). The values of $N_i$ needed for $\chi > \chi_{M_i,min}^D$ would in general be lower than the value computed for $\chi = \chi_{M_i,min}^D$, and hence the value of $N_i$ computed for $\chi = \chi_{M_i,min}^D$ would be a conservative (i.e. larger than needed and, hence, appropriate) value for $N_i$ for $\chi > \chi_{M_i,min}^D$. Hence, treating (31) and (32) as equalities, and substituting $\sigma_i = \sqrt{1/N_i}$, from (31) this results in:

$$\sqrt{N_i}(\Gamma_i - \bar{h}_{M_i}^D(\chi_{M_i,min}^D)) = \sqrt{2} \cdot \mathrm{erfc}^{-1}(2P_{D,i}) \quad (33)$$

and from (32):

$$\Gamma_i = \sqrt{2} \cdot \frac{\mathrm{erfc}^{-1}(2P_{FA,i})}{\sqrt{N_i}} \quad (34)$$

Substitution of (34) into (33) results in:

$$\sqrt{N_i}\left(\sqrt{2} \cdot \frac{\mathrm{erfc}^{-1}(2P_{FA,i})}{\sqrt{N_i}} - \bar{h}_{M_i}^D(\chi_{M_i,min}^D)\right) = \sqrt{2} \cdot \mathrm{erfc}^{-1}(2P_{D,i}) \quad (35)$$

from which it follows that:

$$N_i = 2\left(\frac{\mathrm{erfc}^{-1}(2P_{FA,i}) - \mathrm{erfc}^{-1}(2P_{D,i})}{\bar{h}_{M_i}^D(\chi_{M_i,min}^D)}\right)^2 \quad (36)$$

and substitution of (36) into (34) results in:

$$\Gamma_i = \frac{\mathrm{erfc}^{-1}(2P_{FA,i}) \cdot \bar{h}_{M_i}^D(\chi_{M_i,min}^D)}{\mathrm{erfc}^{-1}(2P_{FA,i}) - \mathrm{erfc}^{-1}(2P_{D,i})} \quad (37)$$

In practical systems, $P_{D,i} > 0.5$ and $P_{FA,i} < 0.5$. Hence, $\mathrm{erfc}^{-1}(2P_{D,i}) < 0$ and $\mathrm{erfc}^{-1}(2P_{FA,i}) > 0$. Combined with (37), this implies $\Gamma_i \in (0, \bar{h}_{M_i}^D(\chi_{M_i,min}^D))$.

Figure 23:
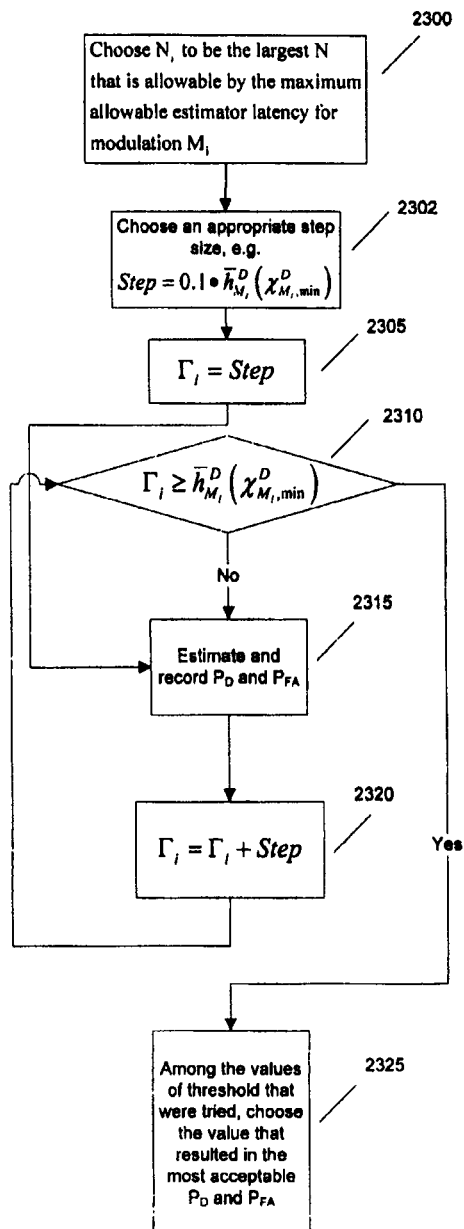
FIG. 23 is a flowchart showing a method, according to one embodiment, for determining: various thresholds used for modulation classification, and a number (N) which determines the number (2N) of symbols to analyze for the generation of each metric.

Yet another method to determine $\Gamma_i$ and $N_i$, which does not require a priori specification of $P_{D,i}$ and $P_{FA,i}$, is shown in FIG. 23. The method is as follows. First, the maximum $N_i$ as allowed by the maximum allowed estimator latency is chosen at block 2300. In the exemplary embodiment, the estimator latency is usually dominated by the sum of $2N_i$ values as seen in (21), which takes at least $2 \cdot N_i \cdot T$ seconds. However, in the case that other delays are present, these too are taken into account when calculating the total estimator latency and hence the largest value of $N_i$ that is allowable in the specific system. That is, $N_i$ is chosen so that the total estimator latency, including the minimum averager delay attributable to $N_i$ which is $2 \cdot N_i \cdot T$, is such that it does not exceed the maximum delay that is allowable in the particular system. Since the validity thresholds are typically in the range (0, $\bar{h}_{M_i}^D(\chi_{M_i,min}^D)$), and since it is desired that the algorithm complete in a finite number of stages, then a certain step size is chosen at block 2302. An appropriate step size is such that a sufficient number of values of $\Gamma_i$ are tested so that the value ultimately chosen is sufficiently (as determined by the designer) close to the optimum in the interval (0, $\bar{h}_{M_i}^D(\chi_{M_i,min}^D)$). For example, in the embodiment shown in FIG. 23 for illustration purposes, the step size is $0.1 \cdot \bar{h}_{M_i}^D(\chi_{M_i,min}^D)$. Subsequently, a trial value of $\Gamma_i$ is assigned to be $\Gamma_i$=Step at block 2305. The detection and false alarm probabilities are then estimated at block 2315, for example using one or more of a laboratory or computer simulations (e.g. by running a statistically sufficient number trials and noting when a detection and when a false alarm occurred, and thus estimating the false alarm and detection probabilities). These values of the false alarm and detection probabilities are noted. Then, $\Gamma_i$ is increased by the value of Step at block 2320, and provided that the comparison $\Gamma_i \geq \bar{h}_{M_i}^D(\chi_{M_i,min}^D)$ performed at block 2310 is false, this process continues so that all the trial values of $\Gamma_i$ in the interval $(0,\bar{h}_{M_i}^D(\chi_{M_i,min}^D))$ are tested. Then, the value of $\Gamma_i$ which give the most acceptable detection and false alarm probabilities is chosen at block 2325.

In the foregoing embodiments, references to the average metric $q_{M_i,N_i}^D$ (1200, 1205, 1210, 1215) "surpassing" a "threshold" refers to $q_{M_i,N_i}^D$ being greater than the threshold in embodiments in which the base function used to generate $q_{M_i,N_i}^D$ is such that the ideal phase differences correspond to the maxima of the base function (as is the case in the exemplary embodiments), and refers to $q_{M_i,N_i}^D$ being less than the threshold in embodiments in which the base function used to generate $q_{M_i,N_i}^D$ is such that the ideal phase differences correspond to the minima of the base function. As already noted, in alternative embodiments wherein the ideal phase differences correspond to the minima of the base function, the thresholds will in general be the negative of the thresholds of the corresponding exemplary embodiments, and the expectation of the base function will be in general the negative of the expectation of the base function of the corresponding exemplary embodiments. Appropriate changes are then accordingly made to various parts of such embodiments. For example, in an embodiment in which ideal phase differences of a modulation correspond to the minima of the base function, $q_{M_i,N_i}^D$ (1200, 1205, 1210, 1215) "surpassing" the associated validity threshold (1220, 1222, 1224, 1226) may refer to $q_{M_i,N_i}^D$ being −0.5 when the associated validity threshold is −0.1.

Reduction to Practice and Approximate Resource Usage Comparisons to Prior Art

All the structures presented in this disclosure have been implemented in practice and proven to work by the inventor using a Terasic DE2-115 board with an Altera Cyclone IV FPGA. In alternative embodiments, hardware other than an FPGA may be used for implementation. For example, the exemplary structures may be implemented using an ASIC.

The FPGA was also used to implement, as a point of comparison, the structures described in LINN, Y. & PELEG, N. 2004. A family of self-normalizing carrier lock detectors and Es/N0 estimators for M-PSK and other phase modulation schemes. *IEEE Trans. Wireless Commun.*, 3, 1659-1668 and in LINN, Y. 2009. A Carrier-Independent Non-Data-Aided Real-Time SNR Estimator for M-PSK and D-MPSK Suitable for FPGAs and ASICs. *IEEE Trans. Circuits and Systems I*, 56, 1525-1538. In order to attain the comparison, several documents that calculate the equivalent gate count for FPGA structures were used as sources. These are documents *Altera Inc. Application Note 110: Gate Counting Methodology for APEX 20K Devices, September 1999, Xilinx Inc. Application XAPP 059: Gate Count Capacity Metrics for FPGAs, February 1997* and M. H. Rais, "Efficient Hardware Realization of Truncated Multipliers using FPGA," *International Journal of Engineering and Applied Sciences*, vol. 4, no. 2, 2009. From those sources, the following approximate gate equivalences are obtained:

TABLE 4

| FPGA Structure | Approximate Average Equivalent Gates |
|---|---|
| Logic Cell (LC) (Combinational Content) | 10 |
| Register | 7.5 |
| Embedded Memory Bit | 4 |
| Multiplier (8 bit × 8 bit) | 500 |

Estimating the number of gates from FPGA structures is an imprecise science, and those gate counts will differ from ASIC gate counts. Nonetheless, the values in Table 4 are useful for the purposes of making comparisons.

First, the resource usage of the lock detectors and SNR estimators based on $hM(\cdot)$ is compared to prior art LINN, Y. & PELEG, N. 2004. A family of self-normalizing carrier lock detectors and Es/N0 estimators for M-PSK and other phase modulation schemes. *IEEE Trans. Wireless Commun.*, 3, 1659-1668. In the Altera Cyclone IV FPGA in the DE2-115 board used for tests, the following resource usage data was measured:

TABLE 5

| Implementation | Lock Detector Metric Memory Bits | SNR Scale Conversion LUT Memory Bits | LCs | Registers | Total Equivalent Gates |
|---|---|---|---|---|---|
| Prior Art for BPSK | 32768 | 4096 | 1 | 170 | 148741 |
| Prior Art to add QPSK | 32768 | 4096 | 1 | 170 | 148741 |
| Prior Art to add 8-PSK | 32768 | 4096 | 1 | 170 | 148741 |
| Prior Art to add 16-PSK | 32768 | 4096 | 1 | 170 | 148741 |
| Prior Art for BPSK, QPSK, 8-PSK, and 16-PSK | 131072 | 16384 | 4 | 680 | 594964 |
| Lock Detector/SNR estimator Based on $h_2(\bullet)$ for BPSK | 32768 | 4096 | 5 | 170 | 148781 |
| To add Lock Detector/SNR estimator Based on $h_4(\bullet)$ for QPSK | 0 | 4096 | 5 | 170 | 17709 |
| To add Lock Detector/SNR estimator Based on $h_8(\bullet)$ for 8-PSK | 0 | 4096 | 5 | 170 | 17709 |
| To add Lock Detector/SNR estimator Based on $h_{16}(\bullet)$ for 16-PSK | 0 | 4096 | 5 | 170 | 17709 |
| Total, Current Embodiment (structures based on $h_M(\bullet)$) | 32768 | 16384 | 20 | 680 | 201908 |

Comparing the results, the total number of required gates has decreased substantially, by about 66.06%, i.e. only about a third of the logic resources are required as compared to the prior art (201908 equivalent gates as opposed to 594964 for the prior art). This also allows for a similar and corresponding reduction in power consumption and circuit area for the embodiment as compared to the prior art.

Now, the resource usage of the SNR estimators based on $h_M^D(\cdot)$ is compared to the prior art, Linn, 2009, *A Carrier-Independent Non-Data-Aided Real-Time SNR Estimator for M-PSK and D-MPSK Suitable for FPGAs and ASICs*. In the Altera Cyclone IV FPGA in the DE2-115 board used for tests, the following resource usage data was measured:

TABLE 6

| Implementation | Metric Generation Memory Bits | SNR Scale Conversion LUT Memory Bits | Multipliers | LCs | Registers | Total Equivalent Gates |
| --- | --- | --- | --- | --- | --- | --- |
| Prior Art for BPSK | 294912 | 4096 | 4 | 81 | 240 | 1200642 |
| Prior Art to add QPSK | 294912 | 4096 | 4 | 81 | 240 | 1200642 |
| Prior Art to add 8-PSK | 294912 | 4096 | 4 | 81 | 240 | 1200642 |
| Prior Art to add 16-PSK | 294912 | 4096 | 4 | 81 | 240 | 1200642 |
| Prior Art for BPSK, QPSK, 8-PSK, and 16-PSK | 1179648 | 16384 | 16 | 324 | 960 | 4802568 |
| SNR estimator Based on $h_2^D(\bullet)$ for BPSK | 32768 | 4096 | 0 | 20 | 170 | 148931 |
| To add SNR estimator Based on $h_4^D(\bullet)$ for QPSK | 0 | 4096 | 0 | 5 | 170 | 17709 |
| To add SNR estimator Based on $h_8^D(\bullet)$ for 8-PSK | 0 | 4096 | 0 | 5 | 170 | 17709 |
| To add SNR estimator Based on $h_{16}^D(\bullet)$ for 16-PSK | 0 | 4096 | 0 | 5 | 170 | 17709 |
| Total, Current Embodiment (structures based on $h_M^D(\bullet)$) | 32768 | 16384 | 0 | 35 | 680 | 202058 |

Comparing the results, the total number of required gates has decreased substantially, by about 95.79% (202058 equivalent gates vs. 4802568 equivalent gates for prior art), i.e. only about 4% of the logic resources are required as compared to prior art. This represents about a 25-fold reduction in logic, or an increased efficiency of 2500%. This also allows for a similar and corresponding reduction in power consumption and circuit area for the embodiment as compared to the prior art.

As can be seen, the advantage of the present structures increases as the number of supported modulations increases, i.e. the advantage would be even greater if 5 or 6 modulations (e.g. also 32-PSK and 64-PSK) were implemented as well.

The above comparison were done fairly; that is, the chosen quantization for the present structures and those of the prior art were chosen so that both would have roughly the same performance.

The above comparisons do not include the modulation classification embodiments discussed above. The implementation of the structure in FIG. 12 occupied 28 logic cells and 6 registers in the Altera FPGA used for implementation, i.e. about 325 additional equivalent gates. This is a relatively small amount of logic, i.e. the modulation classifiers utilize relatively little additional logic. This is orders of magnitude more efficient than the prior art.

As discussed above, the foregoing embodiments enjoy several benefits. First, those embodiments that utilize the principal angle to evaluate the base function may be implemented using a relatively simple arrangement of logic gates, multiplexers, and adders, and that can make them quite useful in one or both of CR and SDR. Many modulation classification algorithms, while mathematically viable, are too cumbersome and resource hungry for practical use. In contrast, the modulation classifiers discussed above do not require divisions, multiplications, Fourier transforms, or other complicated transforms.

Second, for several of the presented exemplary embodiments no carrier synchronization of the input signal is needed to perform SNR estimation or modulation classification. This can be beneficial, since avoiding the need to recover the carrier phase avoids the inherent delay, risk of failure, and complexity of this synchronization operation (which is usually implemented as a phase locked loop (PLL) or other synchronization circuitry).

Third, the foregoing embodiments are Non-Data Aided (NDA), which is to say they are independent of the data being transmitted. As such, they are beneficial over Data Aided (DA) methods. DA methods require prior knowledge of some or all of the transmitted data sequence upon which the modulation classification estimation is done. This is problematic on several levels: for example, often some of the data throughput is sacrificed in DA methods in order to send known symbols, such as pilot symbols, and the receiver must known when those known data symbols are present, implying some sort of required prior frame synchronization. NDA methods, such as those presented above, avoid these pitfalls.

Fourth, the foregoing embodiments operate using only 1 sample/symbol. Thus, the computational complexity and power usage of the foregoing embodiments are accordingly reduced as compared to structures that require a higher sampling rate.

Fifth, the performance of the foregoing embodiments are largely independent of the AGC (Automatic Gain Control). In particular, the various thresholds and functions used in the embodiments of the modulation classifier or lock detector are largely independent of the AGC's performance or operating point, and their overall performance is also resilient to AGC imperfections. This is in sharp contrast to many typical modulation classifiers, SNR estimators, and lock detectors, which depend in some way on the AGC's operating point and performance, particularly with respect to calibration of the classification and lock thresholds. For example, the AGC loops generally converge very slowly compared to the symbol rate, and this implies that a modulation classification scheme that requires a priori knowledge of the AGC operating point must wait for the AGC loop to converge, hence prolonging the time until an accurate classification can be made. This problem is not present in the foregoing embodiments that are largely independent of the AGC.

Sixth, some parts of the modulation classifiers' hardware structure can be used concurrently, as parts of the carrier lock detector and SNR estimator, hence simplifying the overall structure of the receiver.

In addition to the hardware implementations discussed above, the foregoing embodiments may be encoded on to a computer readable medium that is readable by a processor so as to configure the receiver to have the functionality described above. The computer readable medium may be flash memory, RAM, any other suitable disc or semiconductor based memory, or any other suitable computer readable medium. Using software to implement the foregoing embodiments may be suitable when an embodiment of the base function is used that does not lend itself to a relatively efficient hardware implementation, or when the power consumption advantages of hardware are immaterial, for example.

For the sake of convenience, the example embodiments above are described as various interconnected functional blocks, which may be implemented using one or both of distinct hardware and software modules. This is not necessary, however, and there may be cases where these functional blocks or modules are equivalently aggregated into a single logic device, program or operation with unclear boundaries. In any event, the functional blocks, software, and hardware modules can be implemented by themselves, or in combination with other operations in one or both of hardware and software, or via any other suitable implementation method.

While particular example embodiments have been described in the foregoing, it is to be understood that other embodiments are possible and are intended to be included herein. It will be clear to any person skilled in the art that modifications of and adjustments to the foregoing example embodiments, not shown, are possible.

What is claimed is:

1. A method for generating a metric for one or both of lock detection and signal-to-noise ratio (SNR) estimation, the method comprising:
    obtaining a baseband symbol from a received carrier that is modulated using the symbol according to a modulation order (M) equaling the number of distinct ideal symbol phases used to modulate the received carrier;
    determining a received phase of the symbol; and
    generating the metric from the received phase, wherein possible metrics depend on possible received phases according to a base function that comprises a triangle wave having its maxima or minima located at ideal symbol phases and the other of its maxima or minima located at phases midway between adjacent ideal symbol phases.

2. The method as claimed in claim 1, wherein the maxima and minima have identical absolute values.

3. The method as claimed in claim 2 wherein the received carrier is modulated according to M-ary phase shift keying.

4. The method as claimed in claim 2 wherein determining the received phase comprises expressing the received phase as being between $[-\pi,\pi)$ radians prior to generating the metric, and wherein the base function is implemented such that it spans only $[-\pi,\pi)$ radians.

5. The method as claimed in claim 2 wherein the received phase is encoded using an encoding scheme that linearly encompasses substantially all of the possible received phases.

6. The method as claimed in claim 2 wherein the ideal symbol phases are uniformly distributed within any continuous angular interval spanning $2\pi$ radians.

7. The method as claimed in claim 2 further comprising determining whether a local carrier used to demodulate the received carrier is locked to the received carrier by:
    averaging a plurality of the metrics to determine an average metric;
    comparing the average metric to a lock indicator detection threshold; and
    when the average metric surpasses the lock indicator detection threshold, determining that the local carrier is locked to the received carrier.

8. The method as claimed in claim 2 further comprising estimating the SNR of the received carrier by:
    averaging a plurality of the metrics to determine an average metric;
    comparing the average metric to an SNR sufficiency threshold; and
    when the average metric surpasses the SNR sufficiency threshold, utilizing the average metric as a proxy for the SNR.

9. The method as claimed in claim 2 further comprising estimating the SNR of the received carrier by:
    averaging a plurality of the metrics to determine an average metric;
    comparing the average metric to an SNR sufficiency threshold; and
    when the average metric surpasses the SNR sufficiency threshold, estimating the SNR to be the SNR at which the expected value of the base function equals the average metric.

10. The method as claimed in claim 1, wherein the received carrier is modulated according to M-ary phase shift keying.

11. The method as claimed in claim 10, wherein M is a positive integer power of 2.

12. The method as claimed in claim 11 wherein determining the received phase comprises expressing the received phase as being between $[-\pi,\pi)$ radians prior to generating the metric, and wherein the base function is implemented such that it spans only $[-\pi,\pi)$ radians.

13. The method as claimed in claim 11 wherein the received phase is encoded using an encoding scheme that linearly encompasses substantially all of the possible received phases.

14. The method as claimed in claim 11 wherein the ideal symbol phases are uniformly distributed within any continuous angular interval spanning $2\pi$ radians.

15. The method as claimed in claim 11 further comprising determining whether a local carrier used to demodulate the received carrier is locked to the received carrier by:
    averaging a plurality of the metrics to determine an average metric;
    comparing the average metric to a lock indicator detection threshold; and
    when the average metric surpasses the lock indicator detection threshold, determining that the local carrier is locked to the received carrier.

16. The method as claimed in claim 11 further comprising estimating the SNR of the received carrier by:
    averaging a plurality of the metrics to determine an average metric;
    comparing the average metric to an SNR sufficiency threshold; and
    when the average metric surpasses the SNR sufficiency threshold, utilizing the average metric as a proxy for the SNR.

17. The method as claimed in claim 11 further comprising estimating the SNR of the received carrier by:
    averaging a plurality of the metrics to determine an average metric;
    comparing the average metric to an SNR sufficiency threshold; and
    when the average metric surpasses the SNR sufficiency threshold, estimating the SNR to be the SNR at which the expected value of the base function equals the average metric.

18. The method as claimed in claim 10 wherein determining the received phase comprises expressing the received phase as being between $[-\pi,\pi)$ radians prior to generating the metric, and wherein the base function is implemented such that it spans only [−π,π) radians.

19. The method as claimed in claim 10 wherein the received phase is encoded using an encoding scheme that linearly encompasses substantially all of the possible received phases.

20. The method as claimed in claim 10 wherein the ideal symbol phases are uniformly distributed within any continuous angular interval spanning 2π radians.

21. The method as claimed in claim 10 further comprising determining whether a local carrier used to demodulate the received carrier is locked to the received carrier by:
    averaging a plurality of the metrics to determine an average metric;
    comparing the average metric to a lock indicator detection threshold; and
    when the average metric surpasses the lock indicator detection threshold, determining that the local carrier is locked to the received carrier.

22. The method as claimed in claim 10 further comprising estimating the SNR of the received carrier by:
    averaging a plurality of the metrics to determine an average metric;
    comparing the average metric to an SNR sufficiency threshold; and
    when the average metric surpasses the SNR sufficiency threshold, utilizing the average metric as a proxy for the SNR.

23. The method as claimed in claim 10 further comprising estimating the SNR of the received carrier by:
    averaging a plurality of the metrics to determine an average metric;
    comparing the average metric to an SNR sufficiency threshold; and
    when the average metric surpasses the SNR sufficiency threshold, estimating the SNR to be the SNR at which the expected value of the base function equals the average metric.

24. The method as claimed in claim 1, wherein determining the received phase comprises expressing the received phase as being between [−π,π) radians prior to generating the metric, and wherein the base function is implemented such that it spans only [−π,π) radians.

25. The method as claimed in claim 1, wherein the received phase is encoded using an encoding scheme that linearly encompasses substantially all of the possible received phases.

26. The method as claimed in claim 1, wherein the ideal symbol phases are uniformly distributed within any continuous angular interval spanning 2π radians.

27. The method as claimed in claim 26, wherein the metric is generated as a function of a principal angle that is directly proportional to the received phase modulo (π/2M).

28. The method as claimed in claim 27, wherein the principal angle is normalized such that its supremum equals the absolute value of the maxima of the triangle wave.

29. The method as claimed in claim 27, wherein the principal angle comprises one or more of the least significant bits of the received phase.

30. The method as claimed in claim 27, wherein generating the metric comprises:
    inverting the principal angle as a function of one or more bits of the received phase; and
    adding one of A, −A or 0 to the principal angle or its inverse as a function of two or more bits of the received phase, wherein A is the absolute value of the maxima of the triangle wave.

31. The method as claimed in claim 27, wherein the received phase is encoded using one's complement, two's complement, or sign-magnitude encoding, wherein the received phase has b bits, and wherein M is a positive integer power of 2.

32. The method as claimed in claim 31, wherein the principal angle comprises a plurality of the most significant bits of bits [b-3-log$_2$ M:0] of the received phase.

33. The method as claimed in claim 32, wherein generating the metric comprises:
    inverting the principal angle as a function of bit [b-1-log$_2$M] of the received phase; and
    (b) adding either A, −A or 0 to the principal angle or its inverse as a function of bits [b-log$_2$ M-1:b-log$_2$ M-2] of the received phase, wherein A is the absolute value of the maxima of the triangle wave.

34. The method as claimed in claim 31, wherein the principal angle is proportional to a binary number that comprises a plurality of the most significant bits of the bits [b-3-log$_2$ M:0] of the received phase.

35. The method as claimed in claim 1, further comprising determining whether a local carrier used to demodulate the received carrier is locked to the received carrier by:
    averaging a plurality of the metrics to determine an average metric;
    comparing the average metric to a lock indicator detection threshold; and
    when the average metric surpasses the lock indicator detection threshold, determining that the local carrier is locked to the received carrier.

36. The method as claimed in claim 1, further comprising estimating the SNR of the received carrier by:
    averaging a plurality of the metrics to determine an average metric;
    comparing the average metric to an SNR sufficiency threshold; and
    when the average metric surpasses the SNR sufficiency threshold, utilizing the average metric as a proxy for the SNR.

37. The method as claimed in claim 1, further comprising estimating the SNR of the received carrier by:
    averaging a plurality of the metrics to determine an average metric;
    comparing the average metric to an SNR sufficiency threshold; and
    when the average metric surpasses the SNR sufficiency threshold, estimating the SNR to be the SNR at which the expected value of the base function equals the average metric.

38. A method for generating a metric for one or both of signal-to-noise ratio (SNR) estimation and modulation classification, the method comprising:
    obtaining a pair of baseband symbols from a received carrier that is modulated using the symbols according to a modulation order (M) equaling the number of distinct ideal symbol phases used to modulate the received carrier;
    determining a received phase difference between the pair of symbols; and
    generating the metric from the received phase difference, wherein possible metrics depend on possible received phase differences according to a base function that comprises a triangle wave having its maxima or minima located at ideal phase differences and the other of its maxima or minima located at phase differences midway between adjacent ideal phase differences.

39. The method as claimed in claim 38, wherein the maxima and minima have identical absolute values.

40. The method as claimed in claim 39 wherein the received carrier is modulated according to M-ary phase shift keying.

41. The method as claimed claim 39 wherein the ideal phase differences are located at $(2\pi \cdot m_n)/M$ radians where $m_n \epsilon \{0, 1, \ldots, M-1\}$.

42. The method as claimed in claim 39 wherein determining the received phase difference comprises expressing the received phase difference as being between $[-\pi,\pi)$ radians prior to generating the metric, and wherein the base function is implemented such that it spans only $[-\pi,\pi)$ radians.

43. The method as claimed in claim 39 wherein determining the received phase difference comprises expressing the received phase difference as $\text{modulo}_{2\pi}$ of: the received phase of one of the symbols of the pair subtracted from the received phase of the other of the symbols of the pair.

44. The method as claimed in claim 39 wherein one of the symbols of the pair immediately follows the other of the symbols of the pair.

45. The method as claimed in claim 39 wherein the received phase difference is encoded using an encoding scheme that linearly encompasses substantially all of the possible received phase differences.

46. The method as claimed in claim 39 wherein the ideal phase differences are uniformly distributed within any continuous angular interval spanning $2\pi$ radians.

47. The method as claimed in claim 39 further comprising estimating the SNR of the received carrier by:
averaging a plurality of the metrics to determine an average metric;
comparing the average metric to an SNR sufficiency threshold; and
when the average metric surpasses the SNR sufficiency threshold, utilizing the average metric as a proxy for the SNR.

48. The method as claimed in claim 39 further comprising estimating the SNR of the received carrier by:
averaging a plurality of the metrics to determine an average metric;
comparing the average metric to an SNR sufficiency threshold; and
when the average metric surpasses the SNR sufficiency threshold, estimating the SNR to be the SNR at which the expected value of the base function equals the average metric.

49. The method as claimed in claim 38, wherein the received carrier is modulated according to M-ary phase shift keying.

50. The method as claimed in claim 49, wherein M is a positive integer power of 2.

51. The method as claimed claim 50 wherein the ideal phase differences are located at $(2\pi \cdot m_n)/M$ radians where $m_n \epsilon \{0, 1, \ldots, M-1\}$.

52. The method as claimed in claim 50 wherein determining the received phase difference comprises expressing the received phase difference as being between $[-\pi,\pi)$ radians prior to generating the metric, and wherein the base function is implemented such that it spans only $[-\pi,\pi)$ radians.

53. The method as claimed in claim 50 wherein determining the received phase difference comprises expressing the received phase difference as $\text{modulo}_{2\pi}$ of: the received phase of one of the symbols of the pair subtracted from the received phase of the other of the symbols of the pair.

54. The method as claimed in claim 50 wherein one of the symbols of the pair immediately follows the other of the symbols of the pair.

55. The method as claimed in claim 50 wherein the received phase difference is encoded using an encoding scheme that linearly encompasses substantially all of the possible received phase differences.

56. The method as claimed in claim 50 wherein the ideal phase differences are uniformly distributed within any continuous angular interval spanning $2\pi$ radians.

57. The method as claimed in claim 50 further comprising estimating the SNR of the received carrier by:
averaging a plurality of the metrics to determine an average metric;
comparing the average metric to an SNR sufficiency threshold; and
when the average metric surpasses the SNR sufficiency threshold, utilizing the average metric as a proxy for the SNR.

58. The method as claimed in claim 50 further comprising estimating the SNR of the received carrier by:
averaging a plurality of the metrics to determine an average metric;
comparing the average metric to an SNR sufficiency threshold; and
when the average metric surpasses the SNR sufficiency threshold, estimating the SNR to be the SNR at which the expected value of the base function equals the average metric.

59. The method as claimed claim 49 wherein the ideal phase differences are located at $(2\pi \cdot m_n)/M$ radians where $m_n \epsilon \{0, 1, \ldots, M-1\}$.

60. The method as claimed in claim 21 wherein determining the received phase difference comprises expressing the received phase difference as being between $[-\pi,\pi)$ radians prior to generating the metric, and wherein the base function is implemented such that it spans only $[-\pi,\pi)$ radians.

61. The method as claimed in claim 49 wherein determining the received phase difference comprises expressing the received phase difference as $\text{modulo}_{2\pi}$ of: the received phase of one of the symbols of the pair subtracted from the received phase of the other of the symbols of the pair.

62. The method as claimed in claim 49 wherein one of the symbols of the pair immediately follows the other of the symbols of the pair.

63. The method as claimed in claim 49 wherein the received phase difference is encoded using an encoding scheme that linearly encompasses substantially all of the possible received phase differences.

64. The method as claimed in claim 49 wherein the ideal phase differences are uniformly distributed within any continuous angular interval spanning $2\pi$ radians.

65. The method as claimed in claim 49 further comprising estimating the SNR of the received carrier by:
averaging a plurality of the metrics to determine an average metric;
comparing the average metric to an SNR sufficiency threshold; and
when the average metric surpasses the SNR sufficiency threshold, utilizing the average metric as a proxy for the SNR.

66. The method as claimed in claim 49 further comprising estimating the SNR of the received carrier by:
averaging a plurality of the metrics to determine an average metric;
comparing the average metric to an SNR sufficiency threshold; and when the average metric surpasses the SNR sufficiency threshold, estimating the SNR to be the SNR at which the expected value of the base function equals the average metric.

67. The method as claimed in claim 38, wherein the ideal phase differences are located at $(2\pi \cdot m_n)/M$ radians where $m_n \in \{0, 1, \ldots, M-1\}$.

68. The method as claimed in claim 38, wherein
determining the received phase difference comprises expressing the received phase difference as being between $[-\pi,\pi)$ radians prior to generating the metric, and wherein the base function is implemented such that it spans only $[-\pi,\pi)$ radians.

69. The method as claimed in claim 38, wherein determining the received phase difference comprises expressing the received phase difference as modulo$_{2\pi}$ of: the received phase of one of the symbols of the pair subtracted from the received phase of the other of the symbols of the pair.

70. The method as claimed in claim 38, wherein one of the symbols of the pair immediately follows the other of the symbols of the pair.

71. The method as claimed in claim 38, wherein the received phase difference is encoded using an encoding scheme that linearly encompasses substantially all of the possible received phase differences.

72. The method as claimed in claim 38, wherein the ideal phase differences are uniformly distributed within any continuous angular interval spanning $2\pi$ radians.

73. The method as claimed in claim 72, wherein the metric is generated as a function of a principal angle that is directly proportional to the received phase difference modulo $(\pi/2M)$.

74. The method as claimed in claim 73, wherein the principal angle is normalized such that its supremum equals the absolute value of the maxima of the triangle wave.

75. The method as claimed in claim 73, wherein the principal angle comprises one or more of the least significant bits of the received phase difference.

76. The method as claimed in claim 73, wherein generating the metric comprises:
inverting the principal angle as a function of one or more bits of the received phase difference; and
adding either A, −A or 0 to the principal angle or its inverse as a function of two or more bits of the received phase difference, wherein A is the absolute value of the maxima of the triangle wave.

77. The method as claimed in claim 73, wherein the received phase difference is encoded using one's complement, two's complement, or sign-magnitude encoding, the received phase difference has b bits, and M is a positive integer power of 2.

78. The method as claimed in claim 77, wherein the principal angle comprises a plurality of the most significant bits of bits [b-3-log$_2$ M:0] of the received phase difference.

79. The method as claimed in claim 77, wherein the principal angle is directly proportional to a binary number that comprises a plurality of the most significant bits of bits [b-3-log$_2$ M:0] of the received phase difference.

80. The method as claimed in claim 77, wherein generating the metric comprises:
inverting the principal angle as a function of bit [b-1-log$_2$ M] of the received phase difference; and
adding either A, −A or 0 to the principal angle or its inverse as a function of bits [b-log$_2$ M-1:b-log$_2$ M-2] of the received phase difference, wherein A is the absolute value of the maxima of the triangle wave.

81. The method as claimed in claim 72, further comprising generating the metric multiple times in accordance with a different base function each time, wherein the ideal phase differences for each of the base functions are uniformly distributed within any continuous angular interval spanning $2\pi$ radians and wherein each of the different base functions has a different value of M each evenly divisible by the lowest value of M for the different base functions, and further comprising:
averaging the metrics to determine an average metric for each of the different base functions;
comparing the average metric for each of the potential base functions to an associated validity threshold for each of the potential base functions; and
when at least one of the average metrics surpasses its associated validity threshold, determining that M of the received carrier is less than or equal to the lowest value of M for which the average metric surpasses its validity threshold.

82. The method as claimed in claim 81, further comprising when at least one of the average metrics surpasses its associated validity threshold, determining that M of the received carrier is higher than the highest value of M for which the average metric does not surpass its validity threshold.

83. The method as claimed in claim 81, wherein the ideal phase differences for each of the different base functions corresponding to a value of M less than the highest value of M are a subset of the ideal phase differences for the base function corresponding to the highest value of M.

84. The method as claimed in claim 81, wherein the ideal phase differences for each of the different base functions corresponding to a value of M less than the highest value of M are a subset of the ideal phase differences for the base functions corresponding to each higher value of M.

85. The method as claimed in claim 81, wherein M for all of the different base functions and M of the received carrier are positive integer powers of 2.

86. The method as claimed in claim 85, wherein the lowest M for which the average metric surpasses the associated validity threshold and the highest M for which the average metric does not surpass the associated validity threshold are adjacent powers of two.

87. The method as claimed in claim 72, further comprising generating the metric multiple times in accordance with a different base function each time, wherein ideal phase differences are uniformly distributed within any continuous angular interval spanning $2\pi$ radians and wherein none of the different base functions have identical values of M, and further comprising:
averaging the metrics to determine an average metric for each of the different base functions;
determining which of the average metrics is largest if the ideal phase differences correspond to the maxima of the base functions, or which of the average metrics is the smallest if the ideal phase differences correspond to the minima of the base functions;
determining that M of the received carrier is equal to the value for M that corresponds to:
the largest average metric if the ideal phase differences correspond to the maxima of the base functions; and
the smallest average metric if ideal phase differences correspond to the minima of the base functions.

88. The method as claimed in claim 38, further comprising estimating the SNR of the received carrier by:
averaging a plurality of the metrics to determine an average metric;
comparing the average metric to an SNR sufficiency threshold; and when the average metric surpasses the SNR sufficiency threshold, utilizing the average metric as a proxy for the SNR.

89. The method as claimed in claim 38, further comprising estimating the SNR of the received carrier by:
averaging a plurality of the metrics to determine an average metric;
comparing the average metric to an SNR sufficiency threshold; and
when the average metric surpasses the SNR sufficiency threshold, estimating the SNR to be the SNR at which the expected value of the base function equals the average metric.

90. An apparatus for generating a metric for one or both of lock detection and signal-to-noise ratio (SNR) estimation, the apparatus comprising:
a front end configured to obtain a baseband symbol from a received carrier that is modulated using the symbol according to a modulation order (M) equaling the number of distinct ideal symbol phases used to modulate the received carrier;
a phase determiner communicatively coupled to the front end and configured to determine a received phase of the baseband symbol; and
a metric generator communicatively coupled to the phase determiner and configured to generate the metric from the received phase, wherein possible metrics depend on possible received phases according to a base function that comprises a triangle wave having its maxima or minima located at ideal symbol phases and the other of its maxima or minima located at phases midway between adjacent ideal symbol phases.

91. The apparatus as claimed in claim 90, wherein the maxima and minima have identical absolute values.

92. The apparatus as claimed in claim 91 wherein the received carrier is modulated according to M-ary phase shift keying.

93. The apparatus as claimed in claim 91 wherein the phase determiner is configured to express the received phase as being between [−π,π) radians, and wherein the base function is implemented such that it spans only [−π,π) radians.

94. The apparatus as claimed in claim 91 wherein the phase determiner is configured to encode the received phase using an encoding scheme that linearly encompasses substantially all of the possible received phases.

95. The apparatus as claimed in claim 91 wherein the ideal symbol phases are uniformly distributed within any continuous angular interval spanning 2π radians, and wherein the metric generator is configured to determine for the received phase a principal angle that is directly proportional to the received phase modulo (π/2M) and to generate the metric as a function of the principal angle.

96. The apparatus as claimed in claim 91 further comprising an averager communicatively coupled to the metric generator and configured to average a plurality of the metrics to determine an average metric.

97. The apparatus as claimed in claim 90, wherein the received carrier is modulated according to M-ary phase shift keying.

98. The apparatus as claimed in claim 97, wherein M is a positive integer power of 2.

99. The apparatus as claimed in claim 98 wherein the phase determiner is configured to express the received phase as being between [−π,π) radians, and wherein the base function is implemented such that it spans only [−π,π) radians.

100. The apparatus as claimed in claim 98 wherein the phase determiner is configured to encode the received phase using an encoding scheme that linearly encompasses substantially all of the possible received phases.

101. The apparatus as claimed in claim 98 wherein the ideal symbol phases are uniformly distributed within any continuous angular interval spanning 2π radians, and wherein the metric generator is configured to determine for the received phase a principal angle that is directly proportional to the received phase modulo (π/2M) and to generate the metric as a function of the principal angle.

102. The apparatus as claimed in claim 98 further comprising an averager communicatively coupled to the metric generator and configured to average a plurality of the metrics to determine an average metric.

103. The apparatus as claimed in claim 97 wherein the phase determiner is configured to express the received phase as being between [−π,π) radians, and wherein the base function is implemented such that it spans only [−π,π) radians.

104. The apparatus as claimed in claim 97 wherein the phase determiner is configured to encode the received phase using an encoding scheme that linearly encompasses substantially all of the possible received phases.

105. The apparatus as claimed in claim 97 wherein the ideal symbol phases are uniformly distributed within any continuous angular interval spanning 2π radians, and wherein the metric generator is configured to determine for the received phase a principal angle that is directly proportional to the received phase modulo (π/2M) and to generate the metric as a function of the principal angle.

106. The apparatus as claimed in claim 97 further comprising an averager communicatively coupled to the metric generator and configured to average a plurality of the metrics to determine an average metric.

107. The apparatus as claimed in claim 90, wherein the phase determiner is configured to express the received phase as being between [−π,π) radians, and wherein the base function is implemented such that it spans only [−π,π) radians.

108. The apparatus as claimed in claim 90, wherein the phase determiner is configured to encode the received phase using an encoding scheme that linearly encompasses substantially all of the possible received phases.

109. The apparatus as claimed in claim 90, wherein the ideal symbol phases are uniformly distributed within any continuous angular interval spanning 2π radians, and wherein the metric generator is configured to determine for the received phase a principal angle that is directly proportional to the received phase modulo (π/2M) and to generate the metric as a function of the principal angle.

110. The apparatus as claimed in claim 109, wherein the metric generator is configured to normalize the principal angle such that its supremum equals the absolute value of the maxima of the triangle wave.

111. The apparatus as claimed in claim 109, wherein the phase determiner encodes the received phase such that the principal angle comprises one or more of the least significant bits of the received phase.

112. The apparatus as claimed in claim 109, wherein the phase determiner encodes the received phase such that one or more bits (inversion control bits) of the received phase indicate whether to invert the principal angle and such that two or more bits (selection bits) of the received phase indicate whether to add A, −A or 0 to the principal angle or its inverse, wherein A is the absolute value of the maxima of the triangle wave, and wherein the metric generator comprises:
inverting hardware comprising:
a data input to which the principal angle is input;
an inversion control input to which the inversion control bits are input; and a data output that outputs the inverse of the principal angle when the inversion control bits indicate the principal angle is to be inverted and otherwise outputs the principal angle;
data selection hardware comprising:
a data input to which A, −A and 0 are input;
a data selection input to which the selection bits are input; and
a data output that outputs either A, −A or 0 in accordance with which one of the data inputs of the data selection hardware is selected by the selection bits; and
adding hardware comprising:
data inputs communicatively coupled to the data outputs of the inverting hardware and the data selection hardware; and
a data output that outputs the sum of signals at the data inputs of the adding hardware.

113. The apparatus as claimed in claim 112, wherein A is 1.

114. The apparatus as claimed in claim 109, wherein the phase determiner encodes the received phase such that a principal angle precursor comprises one or more of the least significant bits of the received phase, and wherein the principal angle is directly proportional to the principal angle precursor.

115. The apparatus as claimed in claim 114, wherein the phase determiner encodes the received phase such that one or more bits (inversion control bits) of the received phase indicate whether to invert the principal angle precursor and such that two or more bits (selection bits) of the received phase indicate whether to add A, −A or 0 to the principal angle or its inverse, wherein A is the absolute value of the maxima of the triangle wave, and wherein the metric generator comprises:
inverting hardware comprising:
a data input to which the principal angle precursor is input;
an inversion control input to which the inversion control bits are input; and
a data output that outputs the inverse of the principal angle precursor when the inversion control bits indicate the principal angle precursor is to be inverted and otherwise outputs the principal angle precursor;
data selection hardware comprising:
a data input to which A, −A and 0 are input;
a data selection input to which the selection bits are input; and
a data output that outputs either A, −A or 0 in accordance with which one of the data inputs of the data selection hardware is selected by the selection bits;
amplification hardware comprising:
a data input communicatively coupled to the data output of the inverting hardware; and
a data output that outputs the amplification of the data input; and
adding hardware comprising:
data inputs communicatively coupled to the data outputs of the amplification hardware and the data selection hardware; and
a data output that outputs the sum of signals at the data inputs of the adding hardware.

116. The apparatus as claimed in claim 109, wherein the phase determiner encodes the received phase in one's complement, two's complement, or sign-magnitude encoding, the received phase has b bits, M is a positive integer power of 2, and the principal angle comprises a plurality of the most significant bits of bits [b-3-$\log_2$ M:0] of the received phase.

117. The apparatus as claimed in claim 116, wherein the phase determiner encodes the received phase such that bit [b-1-$\log_2$ M] (inversion control bit) of the received phase indicates whether to invert the principal angle and such that bits [b-$\log_2$ M-1:b-$\log_2$ M-2] (selection bits) of the received phase indicate whether to add A, −A or 0 to the principal angle or its inverse, wherein A is the absolute value of the maxima of the triangle wave, and wherein the metric generator comprises:
inverting hardware comprising:
a data input to which the principal angle is input;
an inversion control input to which the inversion control bit is input;
a data output that outputs the inverse of the principal angle when the inversion control bit indicate the principal angle is to be inverted and otherwise outputs the principal angle;
data selection hardware comprising:
a data input to which A, −A and 0 are input;
a data selection input to which the selection bits are input; and
a data output that outputs either A, −A or 0 in accordance with which one of the data inputs of the data selection hardware is selected by the selection bits; and
adding hardware comprising:
data inputs communicatively coupled to the data outputs of the inverting hardware and the data selection hardware; and
a data output that outputs the sum of signals at the data inputs of the adding hardware.

118. The apparatus as claimed in claim 117, wherein A is 1.

119. The apparatus as claimed in claim 109, wherein the phase determiner encodes the received phase in one's complement, two's complement, or sign-magnitude encoding, the received phase has b bits, M is a positive integer power of 2, and the principal angle is directly proportional to a principal angle precursor that comprises a plurality of the most significant bits of bits [b-3-$\log_2$ M:0] of the received phase.

120. The apparatus as claimed in claim 119, wherein the phase determiner encodes the received phase such that bit [b-1-$\log_2$ M] (inversion control bit) of the received phase indicates whether to invert the principal angle precursor and such that bits [b-$\log_2$ M-1:b-$\log_2$ M-2] (selection bits) of the received phase indicate whether to add A, −A or 0 to the principal angle or its inverse, wherein A is the absolute value of the maxima of the triangle wave, and wherein the metric generator comprises:
inverting hardware comprising:
a data input to which the principal angle precursor is input;
an inversion control input to which the inversion control bits are input; and
a data output that outputs the inverse of the principal angle precursor when the inversion control bits indicate the principal angle precursor is to be inverted and otherwise outputs the principal angle precursor;
data selection hardware comprising:
a data input to which A, −A and 0 are input;
a data selection input to which the selection bits are input; and
a data output that output either A, −A or 0 in accordance with which one of the data inputs of the data selection hardware is selected by the selection bits;
amplification hardware comprising:
a data input communicatively coupled to the data output of the inverting hardware; and a data output that outputs the amplification of the data input; and (d) adding hardware comprising:
    data inputs communicatively coupled to the data outputs of the amplification hardware and the data selection hardware; and
    a data output that outputs the sum of signals at the data inputs of the adding hardware.

121. The apparatus as claimed in claim 90, further comprising an averager communicatively coupled to the metric generator and configured to average a plurality of the metrics to determine an average metric.

122. The apparatus as claimed in claim 121, further comprising a comparator communicatively coupled to the averager and configured to compare the average metric to a lock indicator detection threshold and to indicate when the average metric surpasses the lock indicator detection threshold, thereby indicating when the local carrier is locked to the received carrier.

123. The apparatus as claimed in claim 121, further comprising a comparator communicatively coupled to the averager and configured to compare the average metric to an SNR sufficiency threshold and to indicate when the average metric surpasses the SNR sufficiency threshold, thereby indicating when the average metric may be used as a proxy for the SNR.

124. The apparatus as claimed in claim 121, further comprising a lookup table, relating values for the expected value of the base function to values for the SNR, communicatively coupled to the averager and configured to output an estimate for the SNR that is the SNR at which the expected value of the base function equals the average metric when the average metric surpasses the SNR sufficiency threshold.

125. An apparatus for generating a metric for one or both of signal-to-noise ratio (SNR) estimation and modulation classification, the apparatus comprising:
    a front end configured to obtain a pair of baseband symbols from a received carrier that is modulated using the symbols according to a modulation order (M) equaling the number of distinct ideal symbol phases used to modulate the received carrier;
    a phase determiner communicatively coupled to the front end and configured to determine a received phase for each of the symbols;
    a phase difference determiner communicatively coupled to the phase determiner and configured to determine a received phase difference between the pair of symbols; and
    a metric generator communicatively coupled to the phase difference determiner and configured to generate the metric from the received phase difference, wherein possible metrics depend on possible received phase differences according to a base function that comprises a triangle wave having its maxima or minima located at ideal phase differences and the other of its maxima or minima located at phase differences midway between adjacent ideal phase differences.

126. The apparatus as claimed in claim 125, wherein the maxima and minima have identical absolute values.

127. The apparatus as claimed in claim 126 wherein the received carrier is modulated according to M-ary phase shift keying.

128. The apparatus as claimed in claim 126 wherein the ideal phase differences are located at $(2\pi \cdot m_n)/M$ radians where $m_n \in \{0, 1, \ldots, M-1\}$.

129. The apparatus as claimed in claim 126 wherein the phase difference determiner expresses the received phase difference as being between $[-\pi,\pi)$ radians, and wherein the base function is implemented such that it spans only $[-\pi,\pi)$ radians.

130. The apparatus as claimed in claim 126 wherein one of symbols immediately follows the other of the symbols of the pair.

131. The apparatus as claimed in claim 126 wherein the phase difference determiner is configured to encode the received phase difference using an encoding scheme that linearly encompasses substantially all of the possible received phase differences.

132. The apparatus as claimed in claim 126 wherein the ideal phase differences are uniformly distributed within any continuous angular interval spanning $2\pi$ radians, and wherein the metric generator is configured to determine for the received phase difference a principal angle that is directly proportional to the received phase difference modulo $(\pi/2M)$ and to generate the metric as a function of the principal angle.

133. The apparatus as claimed in claim 126 further comprising an averager communicatively coupled to the metric generator and configured to average a plurality of the metrics to determine an average metric.

134. The apparatus as claimed in claim 125, wherein the received carrier is modulated according to M-ary phase shift keying.

135. The apparatus as claimed in claim 134, wherein M is a positive integer power of 2.

136. The apparatus as claimed in claim 135 wherein the ideal phase differences are located at $(2\pi \cdot m_n)/M$ radians where $m_n \in \{0, 1, \ldots, M-1\}$.

137. The apparatus as claimed in claim 135 wherein the phase difference determiner expresses the received phase difference as being between $[-\pi,\pi)$ radians, and wherein the base function is implemented such that it spans only $[-\pi,\pi)$ radians.

138. The apparatus as claimed in claim 135 wherein one of symbols immediately follows the other of the symbols of the pair.

139. The apparatus as claimed in claim 135 wherein the phase difference determiner is configured to encode the received phase difference using an encoding scheme that linearly encompasses substantially all of the possible received phase differences.

140. The apparatus as claimed in claim 135 wherein the ideal phase differences are uniformly distributed within any continuous angular interval spanning $2\pi$ radians, and wherein the metric generator is configured to determine for the received phase difference a principal angle that is directly proportional to the received phase difference modulo $(\pi/2M)$ and to generate the metric as a function of the principal angle.

141. The apparatus as claimed in claim 135 further comprising an averager communicatively coupled to the metric generator and configured to average a plurality of the metrics to determine an average metric.

142. The apparatus as claimed in claim 134 wherein the ideal phase differences are located at $(2\pi \cdot m_n)/M$ radians where $m_n \in \{0, 1, \ldots, M-1\}$.

143. The apparatus as claimed in claim 134 wherein the phase difference determiner expresses the received phase difference as being between $[-\pi,\pi)$ radians, and wherein the base function is implemented such that it spans only $[-\pi,\pi)$ radians.

144. The apparatus as claimed in claim 134 wherein one of symbols immediately follows the other of the symbols of the pair.

145. The apparatus as claimed in claim 134 wherein the phase difference determiner is configured to encode the received phase difference using an encoding scheme that linearly encompasses substantially all of the possible received phase differences.

146. The apparatus as claimed in claim 134 wherein the ideal phase differences are uniformly distributed within any continuous angular interval spanning $2\pi$ radians, and wherein the metric generator is configured to determine for the received phase difference a principal angle that is directly proportional to the received phase difference modulo ($\pi/2M$) and to generate the metric as a function of the principal angle.

147. The apparatus as claimed in claim 134 further comprising an averager communicatively coupled to the metric generator and configured to average a plurality of the metrics to determine an average metric.

148. The apparatus as claimed in claim 125, wherein the ideal phase differences are located at $(2\pi \cdot m_n)/M$ radians where $m_n \epsilon \{0, 1, \ldots, M-1\}$.

149. The apparatus as claimed in claim 125, wherein the phase difference determiner expresses the received phase difference as being between $[-\pi,\pi)$ radians, and wherein the base function is implemented such that it spans only $[-\pi,\pi)$ radians.

150. The apparatus as claimed in claim 149, wherein the phase difference determiner expresses the received phase difference as modulo$_{2\pi}$ of: the received phase of one of the symbols of the pair subtracted from the received phase of the other of the symbols of the pair.

151. The apparatus as claimed in claim 125, wherein one of symbols immediately follows the other of the symbols of the pair.

152. The apparatus as claimed in claim 125, wherein the phase difference determiner is configured to encode the received phase difference using an encoding scheme that linearly encompasses substantially all of the possible received phase differences.

153. The apparatus as claimed in claim 125, wherein the ideal phase differences are uniformly distributed within any continuous angular interval spanning $2\pi$ radians, and wherein the metric generator is configured to determine for the received phase difference a principal angle that is directly proportional to the received phase difference modulo ($\pi/2M$) and to generate the metric as a function of the principal angle.

154. The apparatus as claimed in claim 153, wherein the metric generator is configured to normalize the principal angle such that its supremum equals the absolute value of the maxima of the triangle wave.

155. The apparatus as claimed in claim 153, wherein the phase difference determiner encodes the received phase difference such that the principal angle comprises one or more of the least significant bits of the received phase difference.

156. The apparatus as claimed in claim 153, wherein the phase difference determiner encodes the received phase difference such that one or more bits (inversion control bits) of the received phase difference indicate whether to invert the principal angle and such that two or more bits (selection bits) of the received phase difference indicate whether to add A, −A or 0 to the principal angle or its inverse, wherein A is the absolute value of the maxima of the triangle wave, and wherein the metric generator comprises:
  inverting hardware comprising:
    a data input to which the principal angle is input;
    an inversion control input to which the inversion control bits are input; and
    a data output that outputs the inverse of the principal angle when the inversion control bits indicate the principal angle is to be inverted and otherwise outputs the principal angle;
  data selection hardware comprising:
    a data input to which A, −A and 0 are input;
    a data selection input to which the selection bits are input; and
    a data output that outputs either A, −A or 0 in accordance with which one of the data inputs of the data selection hardware are selected by the selection bits; and
  adding hardware comprising:
    data inputs communicatively coupled to the data outputs of the inverting hardware and the data selection hardware; and
    a data output that outputs the sum of signals at the data inputs of the adding hardware.

157. The apparatus as claimed in claim 156, wherein A is 1.

158. The apparatus as claimed in claim 153, wherein the phase difference determiner encodes the received phase difference such that a principal angle precursor comprises one or more of the least significant bits of the received phase difference, and wherein the principal angle is directly proportional to the principal angle precursor.

159. The apparatus as claimed in claim 158, wherein the phase difference determiner encodes the received phase difference such that one or more bits (inversion control bits) of the received phase difference indicate whether to invert the principal angle precursor and such that two or more bits (selection bits) of the received phase difference indicate whether to add A, −A or 0 to the principal angle or its inverse, wherein A is the absolute value of the maxima of the triangle wave, and wherein the metric generator comprises:
  inverting hardware comprising:
    a data input to which the principal angle precursor is input;
    an inversion control input to which the inversion control bits are input; and
    a data output that outputs the inverse of the principal angle precursor when the inversion control bits indicate the principal angle precursor is to be inverted and otherwise outputs the principal angle precursor;
  data selection hardware comprising:
    a data input to which A, −A and 0 are input;
    a data selection input to which the selection bits are input; and
    a data output that outputs either A, −A or 0 in accordance with which one of the data inputs of the data selection hardware is selected by the selection bits;
  amplification hardware comprising:
    a data input communicatively coupled to the data output of the inverting hardware; and
    a data output that outputs the amplification of the data input; and
  adding hardware comprising:
    data inputs communicatively coupled to the data outputs of the amplification hardware and the data selection hardware; and
    a data output that outputs the sum of signals at the data inputs of the adding hardware.

160. The apparatus as claimed in claim 153, wherein the phase difference determiner encodes the received phase difference in one's complement, two's complement, or sign-magnitude encoding, the received phase difference has b bits, M is a positive integer power of 2, and the principal angle comprises a plurality of the most significant bits of bits [b-3-$\log_2$ M:0] of the received phase difference.

161. The apparatus as claimed in claim 160, wherein the phase difference determiner encodes the received phase difference such that bit [b-1-$\log_2$ M] (inversion control bit) of the received phase difference indicates whether to invert the principal angle and such that bits [b-log$_2$ M-1:b-log$_2$ M-2] (selection bits) of the received phase difference indicate whether to add A, −A or 0 to the principal angle or its inverse, wherein A is the absolute value of the maxima of the triangle wave, and wherein the metric generator comprises:

inverting hardware comprising:
        a data input to which the principal angle is input;
        an inversion control input to which the inversion control bit is input; and
        a data output that outputs the inverse of the principal angle when the inversion control bit indicate the principal angle is to be inverted and otherwise outputs the principal angle;
    data selection hardware comprising:
        a data input to which A, −A and 0 are input;
        a data selection input to which the selection bits are input; and
        a data output that outputs either A, −A or 0 in accordance with which one of the data inputs of the data selection hardware is selected by the selection bits; and
    adding hardware comprising:
        data inputs communicatively coupled to the data outputs of the inverting hardware and the data selection hardware; and
        a data output that outputs the sum of signals at the data inputs of the adding hardware.

162. The apparatus as claimed in claim 161, wherein A is 1.

163. The apparatus as claimed in claim 153, wherein the phase difference determiner encodes the received phase difference in one's complement, two's complement, or sign-magnitude encoding, the received phase difference has b bits, M is a positive integer power of 2, and the principal angle is directly proportional to: a principal angle precursor that comprises a plurality of the most significant bits of bits [b-3-log$_2$ M:0] of the received phase difference.

164. The apparatus as claimed in claim 163, wherein the phase difference determiner encodes the received phase difference such that bit [b-1-log$_2$ M] (inversion control bit) of the received phase difference indicates whether to invert the principal angle precursor and such that bits [b-log$_2$ M-1:b-log$_2$ M-2] (selection bits) of the received phase difference indicate whether to add A, −A or 0 to the principal angle or its inverse, wherein A is the absolute value of the maxima of the triangle wave, and wherein the metric generator comprises:

inverting hardware comprising:
        a data input to which the principal angle precursor is input;
        an inversion control input to which the inversion control bit is input; and
        a data output that outputs the inverse of the principal angle precursor when the inversion control bit indicates the principal angle precursor is to be inverted and otherwise outputs the principal angle precursor;
    data selection hardware comprising:
        a data input to which A, −A and 0 are input;
        a data selection input to which the selection bits are input; and
        a data output that outputs either A, −A or 0 in accordance with which one of the data inputs of the data selection hardware is selected by the selection bits;
    amplification hardware comprising:
        a data input communicatively coupled to the data output of the inverting hardware; and
        a data output that outputs the amplification of the data input; and
    adding hardware comprising:
        data inputs communicatively coupled to the data outputs of the amplification hardware and the data selection hardware; and
        a data output that outputs the sum of signals at the data inputs of the adding hardware.

165. The apparatus as claimed in claim 153, further comprising:

a plurality of the metric generators each configured to generate the metric in accordance with a different base function, wherein ideal phase differences for each of the base functions are uniformly distributed within any continuous angular interval spanning 2π radians and wherein none of the different base functions have identical values of M;
    a plurality of averagers, each communicatively coupled to a different one of the metric generators and configured to determine an average metric for each of the metric generators;
    a plurality of comparators, each of which is communicatively coupled to a different one of the averagers and is configured to compare the average metric to a validity threshold for that base function, and to output a signal indicating that the average metric surpasses the validity threshold only when the average metric surpasses the validity threshold; and
    a plurality of data selectors each comprising data inputs, a selection input, and a data output, wherein the output of each of the comparators except the comparator communicatively coupled to the metric generator for the base function having the highest M is coupled to the selection input on a different one of the data selectors, and wherein the data inputs and outputs of the data selectors are communicatively coupled together in a series such that the data output of the last of the data selectors in the series outputs a particular one of the data inputs of one of the data selectors selected by the metric generators.

166. The apparatus as claimed in claim 165, further comprising ORing logic having inputs communicatively coupled to the outputs of the comparators.

167. The apparatus as claimed in claim 165, wherein M for each of the base functions is a positive integer power of 2.

168. The apparatus as claimed in claim 153, further comprising:

a plurality of the metric generators each configured to generate the metric in accordance with a different base function, wherein ideal phase differences for each of the base functions are uniformly distributed within any continuous angular interval spanning 2π radians and wherein none of the different base functions have identical values of M;
    a plurality of averagers, each of which is communicatively coupled to a different one of the metric generators and configured to determine an average metric; and
    a peak detector communicatively coupled to each of the averagers, and configured to indicate:
        if the ideal phase differences correspond to the maxima of the base functions, which of the average metrics is largest; and
        if the ideal phase differences correspond to the minima of the base functions, which of the average metrics is the smallest.

169. The apparatus as claimed in claim 168, further comprising a plurality of comparators, each of which is communicatively coupled to a different one of the averagers and configured to compare the average metric to a validity threshold for that value of M, and to output a signal indicating that the average metric surpasses the validity threshold only when the average metric surpasses the validity threshold.

170. The apparatus as claimed in claim 125, further comprising an averager communicatively coupled to the metric generator and configured to average a plurality of the metrics to determine an average metric.

171. The apparatus as claimed in claim 170, further comprising a comparator communicatively coupled to the averager and configured to compare the average metric to an SNR sufficiency threshold and to indicate when the average metric surpasses the SNR sufficiency threshold, thereby indicating when the average metric may be used as a proxy for the SNR.

172. The apparatus as claimed in claim 170, further comprising a lookup table, relating values for the expected value of the base function to values for the SNR, communicatively coupled to the averager and configured to output an estimate for the SNR that is the SNR at which the expected value of the base function equals the average metric when the average metric surpasses the SNR sufficiency threshold.

173. A lock detector, comprising:
a front end configured to sample a received carrier that is modulated using a symbol according to a modulation order (M) equaling the number of distinct ideal symbol phases used to modulate the received carrier, wherein the front end comprises a symbol synchronizer configured to attempt to synchronize sampling instances to the symbols used to modulate the received carrier;
a phase determiner communicatively coupled to the front end and configured to determine a received phase of the baseband symbol from one or more samples taken at the sampling instances;
a metric generator communicatively coupled to the phase determiner and configured to generate a metric from the received phase, wherein possible metrics depend on possible received phases according to a base function that comprises a triangle wave having its maxima or minima located at ideal symbol phases and the other of its maxima or minima located at phases midway between adjacent ideal symbol phases;
an averager communicatively coupled to the metric generator and configured to average a plurality of the metrics to determine an average metric; and
a comparator communicatively coupled to the averager and configured to compare the average metric to a lock indicator detection threshold and to indicate when the average metric surpasses the lock indicator detection threshold, thereby indicating when the local carrier is locked to the received carrier.

174. The apparatus as claimed in claim 173, wherein the symbol synchronizer does not synchronize the sampling instances to the symbols.

175. A modulation classifier, comprising:
a front end configured to obtain a pair of baseband symbols from a received carrier that is modulated using the symbols according to a modulation order (M) equaling the number of distinct ideal symbol phases used to modulate the received carrier;
a phase determiner communicatively coupled to the front end and configured to determine a received phase of each of the symbols;
a phase difference determiner communicatively coupled to the phase determiner and configured to determine a received phase difference between the pair of symbols;
a plurality of metric generators, each communicatively coupled to the phase difference determiner and configured to generate a metric from the received phase difference, wherein possible metrics depend on possible received phase differences according to a base function that comprises a triangle wave having its maxima located at ideal phase differences and its minima located at phase differences midway between adjacent ideal phase differences, and wherein each of the metric generators is configured to determine the metric in accordance with a different base function corresponding to a different digital modulation scheme;
a plurality of averagers, each of which is communicatively coupled to a different one of the metric generators and configured to determine an average metric; and
a peak detector communicatively coupled to each of the averagers, and configured to indicate which of the average metrics is largest.

176. The apparatus as claimed in claim 175, further comprising a plurality of comparators, each of which is communicatively coupled to a different one of the averagers and configured to compare the average metric to a validity threshold for that metric, and to output a signal indicating that the average metric surpasses the validity threshold only when the average metric surpasses the validity threshold.

177. An apparatus for generating a metric for one or both of lock detection and signal-to-noise ratio (SNR) estimation, the apparatus comprising:
a data input configured to receive a phase of a baseband symbol obtained from a received carrier that is modulated using the symbol according to a modulation order (M) equaling the number of distinct ideal symbol phases used to modulate the received carrier;
a data output configured to output a metric; and
circuitry communicatively coupled between the data input and output and configured to generate the metric from the phase, wherein possible metrics depend on possible phases according to a base function that comprises a triangle wave having its maxima or minima located at the ideal symbol phases and the other of its maxima or minima located at phases midway between adjacent ideal symbol phases.

178. An apparatus for generating a metric for one or both of signal-to-noise ratio (SNR) estimation and modulation classification, the apparatus comprising:
a data input configured to receive a phase difference between a pair of baseband symbols from a received carrier that is modulated using the symbols according to a modulation order (M) equaling the number of distinct ideal symbol phases used to modulate the received carrier;
a data output configured to output a metric; and
circuitry communicatively coupled between the data input and output and configured to generate the metric from the phase difference, wherein possible metrics depend on possible phase differences according to a base function that comprises a triangle wave having its maxima or minima located at the ideal phase differences and the other of its maxima or minima located at phase differences midway between adjacent ideal phase differences.

179. An apparatus for generating a metric for one or both of lock detection, signal-to-noise ratio (SNR) estimation, and modulation classification, the apparatus comprising:
selecting means for selecting one of A, −A or 0 in response to selection bits;
inverting means for inverting a principal angle in response to inversion control bits; and
adding means, communicatively coupled to outputs of the selecting means and the inverting means, for adding one of A, −A or 0 to the principal angle or its inverse to generate the metric, wherein the received carrier is modulated using a symbol according to a modulation order (M) equaling the number of distinct ideal symbol phases used to modulate the received carrier, wherein the distinct ideal symbol phases are uniformly distributed within any continuous angular interval spanning $2\pi$ radians and wherein the principal angle is modulo $(\pi/2M)$ of the phase of the symbol, normalized to have a supremum of A.

* * * * *